(12) United States Patent
Akiyama et al.

(10) Patent No.: US 11,543,752 B2
(45) Date of Patent: Jan. 3, 2023

(54) SUBSTRATE PROCESSING METHOD, SUBSTRATE PROCESSING APPARATUS, AND RECIPE SELECTION METHOD

(71) Applicant: SCREEN Holdings Co., Ltd., Kyoto (JP)

(72) Inventors: Katsuya Akiyama, Kyoto (JP); Yukifumi Yoshida, Kyoto (JP); Song Zhang, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 17/103,954

(22) Filed: Nov. 25, 2020

(65) Prior Publication Data

US 2021/0165328 A1 Jun. 3, 2021

(30) Foreign Application Priority Data

Nov. 29, 2019 (JP) .............................. JP2019-217610
Nov. 29, 2019 (JP) .............................. JP2019-217611

(51) Int. Cl.
*G03F 7/16* (2006.01)
*G03F 7/00* (2006.01)
*G03F 7/42* (2006.01)

(52) U.S. Cl.
CPC ............ *G03F 7/162* (2013.01); *G03F 7/0035* (2013.01); *G03F 7/422* (2013.01)

(58) Field of Classification Search
CPC ........ G03F 7/162; G03F 7/0035; G03F 7/422; G03F 7/42; H01L 21/304;

(Continued)

(56) References Cited

U.S. PATENT DOCUMENTS 10,272,478 B2    4/2019   Aibara et al.
10,792,711 B2   10/2020   Aibara et al.
(Continued)

FOREIGN PATENT DOCUMENTS

JP            6140576        5/2017
JP         2019062171        4/2019
(Continued)

*Primary Examiner* — Caleen O Sullivan
(74) *Attorney, Agent, or Firm* — JCIPRNET

(57) ABSTRACT

A substrate processing method includes a preprocessing forming step of forming a preprocessing film on a surface of a substrate having the surface on which a first region and a second region in which different substances are exposed are present, a preprocessing film separating step of separating the preprocessing film from the surface of the substrate with a stripping liquid, a processing film forming step of forming a processing film on the surface of the substrate after the preprocessing film separating step, and a processing film separating step of separating the processing film from the surface of the substrate with the stripping liquid. A removal capacity for the processing film to remove the first removal target present in the second region is higher than a removal capacity for the preprocessing film to remove the first removal target present in the second region, and a removal capacity for the preprocessing film to remove the first removal target present in the first region is higher than a removal capacity for the processing film to remove the first removal target present in the first region.

24 Claims, 35 Drawing Sheets

(58) Field of Classification Search
CPC ......... H01L 21/67011; H01L 21/67092; H01L 21/02063; H01L 21/31116; H01L 21/31144; H01L 21/67051; H01L 21/6715
USPC .......................................................... 430/256
See application file for complete search history.

(56) References Cited

U.S. PATENT DOCUMENTS

| | | |
|---|---|---|
| 11,020,776 B2 | 6/2021 | Yoshida |
| 11,101,147 B2 | 8/2021 | Yoshida et al. |
| 2016/0254164 A1 | 9/2016 | Sugishima et al. |
| 2019/0172733 A1 | 6/2019 | Yoshida et al. |
| 2021/0237128 A1 | 8/2021 | Yoshida |
| 2021/0331192 A1 | 10/2021 | Yoshida et al. |

FOREIGN PATENT DOCUMENTS

| | | |
|---|---|---|
| KR | 20160016667 | 2/2016 |
| KR | 20170075770 | 7/2017 |
| KR | 20190034081 | 4/2019 |
| TW | 201527907 | 7/2015 |
| TW | 201916099 | 4/2019 |
| TW | 201929076 | 7/2019 |
| TW | 201929077 | 7/2019 |
| TW | 201937540 | 9/2019 |

|  | Addition amount of first component | | | | | |
|---|---|---|---|---|---|---|
|  | 0.0 | 0.1 | 0.3 | 0.5 | 1.0 | 3.0 |
| Addition amount of second component — 0.0 | — | C | — | C | — | — |
| 0.5 | B | A | A | B | B | — |
| 1.0 | B | A | AA | AA | B | — |
| 3.0 | B | A | AA | AA | AA | A |

AA : It can be sufficiently removed
A : It can be removed
B : It can be generally removed
C : It can be partially removed
D : It cannot be removed

FIG. 16

SUBSTRATE PROCESSING METHOD, SUBSTRATE PROCESSING APPARATUS, AND RECIPE SELECTION METHOD

CROSS-REFERENCE TO RELATED APPLICATIONS

This application claims the priority benefits of Japanese Patent Application No. 2019-217610, filed on Nov. 29, 2019 and Japanese Patent Application No. 2019-217611, filed on Nov. 29, 2019. The entirety of the above-mentioned patent application is hereby incorporated by reference herein and made a part of this specification.

BACKGROUND OF THE INVENTION

Field of the Invention

The disclosure relates to a substrate processing method and a substrate processing apparatus which process a substrate, and a recipe selection method which selects a recipe for carrying out the substrate processing method. For example, the substrates to be processed may include semiconductor wafers, liquid crystal display device substrates, flat panel display (FPD) substrates for organic electroluminescence (EL) display devices or the like, optical disc substrates, magnetic disc substrates, magneto-optical disc substrates, photomask substrates, ceramic substrates, solar cell substrates, and the like.

Description of Related Art

In a manufacturing process of a semiconductor device, a step of removing various contaminants adhering to a substrate, residues such as a processing liquid and a resist used in a previous step, and various particles (hereinafter, may be collectively referred to as "removal targets") is performed.

Specifically, it is common to remove the removal targets using the physical action of deionized water (DIW) by supplying the DIW or the like to the substrate, or to chemically remove the removal targets by supplying a chemical solution which chemically reacts with the removal targets to the substrate.

However, uneven patterns formed on a substrate are becoming finer and more complicated. Therefore, it is becoming difficult to remove the removal targets by DIW or a chemical solution while damage to an uneven pattern is curbed.

Thus, a method in which a processing liquid is supplied to a surface of a substrate, and the processing liquid on the substrate is solidified to form a holding layer for holding the removal targets on the substrate, and then the holding layer is separated and removed from the surface of the substrate together with the removal targets by supplying a stripping liquid to an upper surface of the substrate has been proposed (refer to Japanese Patent Laid-Open No. 2019-62171).

SUMMARY OF THE INVENTION

A removal capacity for a holding layer to remove removal targets from the surface of a substrate varies according to a type of substance exposed on the surface of the substrate. Therefore, when exposed substances are present in different regions on the surface of a substrate, there is a possibility that the removal targets will not be able to be sufficiently removed by forming a specific holding layer on the surface of the substrate and separating the holding layer from the surface of the substrate. According to the substances exposed on the surface of the substrate, it may be necessary to perform appropriate processing to remove the removal targets.

Therefore, the disclosure provides a substrate processing method and a substrate processing apparatus capable of efficiently removing removal targets from a surface of a substrate in a substrate having a surface on which regions on which different substances are exposed are present.

The disclosure also provides a recipe selection method capable of selecting a recipe for carrying out an appropriate substrate processing method according to the surface conditions of the substrate.

The disclosure also provides a substrate processing method and a substrate processing apparatus capable of efficiently removing a removal target from a substrate while deterioration of a specific substance exposed on the surface of the substrate is curbed.

One embodiment of the disclosure is a substrate processing method which processes a substrate having a surface on which a first region and a second region in which different substances are exposed are present.

The substrate processing method includes a preprocessing liquid supply step of supplying a preprocessing liquid to the surface of the substrate, a preprocessing film forming step of solidifying or curing the preprocessing liquid supplied to the surface of the substrate and forming a preprocessing film, which holds a first removal target present on the surface of the substrate, on the surface of the substrate, a preprocessing film separating step of supplying a stripping liquid to the surface of the substrate and separating the preprocessing film from the surface of the substrate in a state in which the preprocessing film holds the first removal target, a processing liquid supply step of supplying a processing liquid to the surface of the substrate after the preprocessing film separating step, a processing film forming step of solidifying or curing the processing liquid supplied to the surface of the substrate and forming a processing film, which holds the first removal target present on the surface of the substrate, on the surface of the substrate, and a processing film separating step of supplying the stripping liquid to the surface of the substrate and separating the processing film from the surface of the substrate in a state in which processing film holds the first removal target.

Additionally, a removal capacity for the processing film to remove the first removal target present in the second region is higher than a removal capacity for the preprocessing film to remove the first removal target present in the second region, and a removal capacity for the preprocessing film to remove the first removal target present in the first region is higher than a removal capacity for the processing film to remove the first removal target present in the first region.

According to this method, the first removal target is removed from the surface of the substrate by separating the preprocessing film having a high removal capacity for removing the first removal target present in the first region. After that, the first removal target is removed from the surface of the substrate by separating the processing film having a high removal capacity for removing the first removal target present in the second region. That is, the removal of the first removal target is performed in two stages using the preprocessing film and the processing film in which the regions having a high removal capacity for removing the first removal target are different from each other.

Therefore, even when a substrate has a surface on which regions in which different substances are exposed are present, the first removal target can be efficiently removed.

According to an embodiment, the removal capacity for removing the first removal target may be constituted of a holding capacity which holds the first removal target present in the first region or the second region on the processing film or the preprocessing film, and separability which indicates a degree of separation of the processing film or the preprocessing film in a state in which the processing film or the preprocessing film holds the first removal target, and the preprocessing film may have a higher separability than the processing film in the first region, and the processing film may have a higher holding capacity than the preprocessing film in the second region.

Therefore, in the first region, most of the first removal target can be removed by separating the preprocessing liquid film; and in the second region, most of the first removal target can be removed by separating the processing film. Therefore, even when a substrate has a surface on which regions in which different substances are exposed are present, the first removal target can be efficiently removed.

According to an embodiment, the first region may be an exposed region in which a metal is exposed, and the second region may be a non-exposed region other than the exposed region. A removal capacity for the processing film to removes the first removal target present in the non-exposed region may be higher than a removal capacity for the preprocessing film to remove the first removal target present in the non-exposed region, and a removal capacity for the preprocessing film to remove the first removal target present in the exposed region may be higher than a removal capacity for the processing film to remove the first removal target present in the exposed region.

According to this method, the first removal target is removed from the surface of the substrate by performing both the separating of the preprocessing film which has a relatively high removal capacity for removing the first removal target present in the exposed region and the separating of the processing film which has a relatively high removal capacity for removing the first removal target present in the non-exposed region. Therefore, the first removal target can be efficiently removed from a substrate having a surface having an exposed region and a non-exposed region.

According to one embodiment, the substrate processing method may further include a processing film residue removing step of supplying a removing liquid to the surface of the substrate and removing a residue of the processing film remaining on the surface of the substrate after the processing film separating step. According to this method, even when a residue of the processing film adheres to the surface of the substrate after the processing film is separated by the stripping liquid, the residue can be removed by the removing liquid.

According to one embodiment, the processing film separating step may include a step of separating a portion of the processing film which covers the non-exposed region without separating a portion of the processing film which covers the exposed region. Additionally, the processing film residue removing step may include a step of dissolving and removing the portion of the processing film which covers the exposed region in the removing liquid.

Even when a portion of the processing film which covers an exposed region remains on an exposed region without being separated by the supply of the stripping liquid to the surface of the substrate, the portion can be dissolved in the removing liquid and can be removed from the exposed region.

When the portion of the processing film which covers the exposed region is dissolved in the removing liquid, the first removal target released from being held by the portion of the processing film which covers the exposed region may adhere again to the exposed region. Therefore, when the processing film is formed after the preprocessing film having a relatively high removal capacity for removing the first removal target present in the exposed region is removed from the exposed region by the separating, most of the first removal target is removed from the exposed region before the processing film is formed.

Therefore, even when a portion of the processing film which covers an exposed region is dissolved in the removing liquid and removed from the exposed region, it is possible to sufficiently curb the remaining of the first removal target in the exposed region.

According to one embodiment, the processing film forming step may include a step of forming the processing film including a separation target film which holds the first removal target present in the non-exposed region on the surface of the substrate and covers the non-exposed region and a protective film, which covers and protects the exposed region, on the surface of the substrate. Additionally, the substrate processing method may further include a cleaning step of supplying a cleaning liquid to the surface of the substrate and dissolving and removing a second removal target present on the surface of the substrate by the cleaning liquid after the processing film separating step.

According to this method, the separation target film which covers the non-exposed region on the surface of the substrate and the protective film which covers the exposed region on the surface of the substrate are formed by the processing liquid supplied to the surface of the substrate being solidified or cured.

The separation target film is separated from the surface of the substrate in a state in which the separation target film holds the first removal target by supplying the stripping liquid to the surface of the substrate on which the separation target film and the protective film are formed. Therefore, the first removal target is removed from the surface of the substrate. On the other hand, the second removal target remains on the surface of the substrate.

Then, the second removal target is removed from the surface of the substrate by the cleaning liquid, and then the protective film is removed from the surface of the substrate by the removing liquid.

When the cleaning liquid is supplied to the surface of the substrate, the exposed region in which a metal is exposed on the surface of the substrate is covered with the protective film. Thus, even when the cleaning liquid has a property of deteriorating (for example, oxidizing) the metal exposed on the surface of the substrate, the second removal target can be removed without deteriorating the metal.

Therefore, it is possible to efficiently remove a plurality of types of removal targets (the first removal target and the second removal target) from the surface of the substrate while the deterioration of the metal exposed on the surface of the substrate is curbed.

According to one embodiment, the substrate processing method may further include a processing film residue removing step of supplying a removing liquid to the surface of the substrate and removing a residue of the processing film present on the surface of the substrate after the processing film separating step. Additionally, the processing film residue removing step may include a step of removing the protective film as the residue.

According to this method, even when the residue of the processing film adheres to the surface of the substrate after the processing film is separated by the stripping liquid, the residue can be removed by the removing liquid. The protective film which remains on the substrate without being separated by the stripping liquid is also dissolved by the removing liquid and removed from the exposed region.

Further, since the processing film is formed after the preprocessing film having a relatively high removal capacity for removing the first removal target present in the exposed region is removed from the exposed region by the separating, most of the first removal target is removed from the exposed region before the processing film is formed. Therefore, even when the protective film is dissolved in the removing liquid and removed from the exposed region, it is possible to sufficiently curb the remaining of the first removal target in the exposed region.

According to one embodiment, the first removal target and the second removal target may be residues produced by a dry etching processing.

In a back end process (BEOL: back end of the line) in which a multi-layered metal layer is formed on the surface of a substrate, the metal is exposed on the surface of the substrate by performing the dry etching processing. That is, the exposed region in which the metal is exposed and the non-exposed region other than the exposed region are formed on the surface of the substrate.

Reaction products of an etching gas such as $CF_X$ (for example, carbon tetrafluoride ($CF_4$)) used in the dry etching processing and portions of the substrate which constitutes a non-exposed region may adhere to the surface of the substrate as a residue after the dry etching processing. The portion of the surface of the substrate which constitutes the non-exposed region includes surfaces such as a Low-k film (a low dielectric constant interlayer insulating film), an oxide film, and a metal hard mask.

Specifically, a film-shaped reaction product (a film-shaped residue) of an etching gas and a low dielectric constant interlayer insulating film and a granular reaction product (a granular residue) of the etching gas and a low dielectric constant interlayer insulating film, an oxide film, or a metal hard mask adhere to the non-exposed region of the surface of the substrate. The granular shape includes a spherical shape, an ellipsoidal shape, a polyhedral shape, and the like. The granular residue also adheres to the exposed region on the surface of the substrate.

The granular residue can be detached by a physical force, but the film-shaped residue covers at least a part of the non-exposed region and is more difficult to be detached from the surface of the substrate by a physical force as compared with the granular residue.

Therefore, when the granular residue as the first removal target is removed by separating the separation target film, and the film-shape residue as the second removal target is dissolved and removed with the cleaning liquid, it is possible to efficiently remove the removal target from the substrate while the deterioration of the metal exposed on the surface of the substrate is curbed.

Specifically, the separation target film is separated from the surface of the substrate in a state in which it holds the granular residue by forming the separation target film and the protective film on the surface of the substrate after the dry etching processing and supplying the stripping liquid to the surface of the substrate in which the separation target film and the protective film are formed. Therefore, the granular residue is removed from the surface of the substrate. On the other hand, the film-shaped residue remains in the non-exposed region on the surface of the substrate. Then, the film-shaped residue is dissolved and removed from the surface of the substrate by the cleaning liquid, and then the protective film is removed from the surface of the substrate by the removing liquid.

When the cleaning liquid is supplied to the surface of the substrate, the exposed region in which the metal is exposed on the surface of the substrate is covered with the protective film. Thus, even when the cleaning liquid has the property of deteriorating (for example, oxidizing) the metal exposed on the surface of the substrate, the film-shaped residue can be removed without deteriorating the metal.

According to one embodiment, the processing liquid may include a first solute and a first solvent which dissolves the first solute. The first solute may include a first high-solubility component and a first low-solubility component which is less soluble in the stripping liquid than the first high-solubility component. Additionally, the processing film separating step may include a step of selectively dissolving the first high-solubility component in a solid state in the stripping liquid.

According to this method, the first high-solubility component in the solid state in the processing film is selectively dissolved in the stripping liquid. "The first high-solubility component in the solid state is selectively dissolved" does not mean that only the first high-solubility component in the solid state is dissolved. "The first high-solubility component in the solid state is selectively dissolved" means that the first low-solubility component in the solid state is also slightly dissolved, but most of the first high-solubility component in the solid state is dissolved.

The stripping liquid passes through the processing film via a trace in which the first high-solubility component in the solid state was present (a path formed by dissolving the first high-solubility component) by dissolving the first high-solubility component in the solid state in the stripping liquid. Thus, the stripping liquid can act on a contact interface between the processing film and the substrate. On the other hand, the first low-solubility component in the processing film is maintained in the solid state without dissolving. Therefore, the stripping liquid can act on a contact interface between the first low-solubility component in the solid state and the substrate while the first removal target is held by the first low-solubility component in the solid state. As a result, the processing film can be quickly removed from the surface of the substrate, and the first removal target together with the processing film can be efficiently removed from the surface of the substrate.

According to one embodiment, the processing film separating step may include a first through hole forming step of partially dissolving the processing film in the stripping liquid and forming a first through hole in the processing film.

Therefore, the stripping liquid can pass through the processing film via the first through hole and quickly reach the vicinity of an interface between the processing film and the surface of the substrate. Thus, the stripping liquid can be allowed to act on the interface between the processing film and the substrate to efficiently separate the processing film from the substrate. As a result, the first removal target can be efficiently removed from the surface of the substrate.

According to one embodiment, the preprocessing liquid may include a second solute and a second solvent which dissolves the second solute. The second solute may include a second high-solubility component and a second low-solubility component which is less soluble in the stripping liquid than the second high-solubility component. Additionally, the preprocessing film separating step may include a step of selectively dissolving the second high-solubility component in a solid state in the stripping liquid.

According to this method, the second high-solubility component in the solid state in the preprocessing film is selectively dissolved in the stripping liquid. "The second high-solubility component in the solid state is selectively dissolved" does not mean that only the second high-solubility component in the solid state is dissolved. "The second high-solubility component in the solid state is selectively dissolved" means that the second low-solubility component in the solid state is also slightly dissolved, but most of the second high-solubility component in the solid state is dissolved.

The stripping liquid passes through the preprocessing film via a trace in which the second high-solubility component in the solid state was present (a path formed by dissolving the second high-solubility component) by dissolving the second high-solubility component in the solid state in the stripping liquid. Thus, the stripping liquid can act on a contact interface between the preprocessing film and the substrate. On the other hand, the second low-solubility component in the preprocessing film is maintained in the solid state without being dissolved. Therefore, the stripping liquid can act on a contact interface between the second low-solubility component in the solid state and the substrate while the first removal target is held by the second low-solubility component in the solid state. As a result, the preprocessing film can be quickly removed from the surface of the substrate, and the first removal target together with the preprocessing film can be efficiently removed from the surface of the substrate.

According to one embodiment, the preprocessing film separating step may include a second through hole forming step of partially dissolving the preprocessing film in the stripping liquid and forming a second through hole in the preprocessing film.

Therefore, the stripping liquid can pass through the preprocessing film via the second through hole and quickly reach the vicinity of an interface between the preprocessing film and the surface of the substrate. Thus, the stripping liquid can be allowed to act on the interface between the preprocessing film and the substrate to efficiently separate the preprocessing film from the substrate. As a result, the first removal target can be efficiently removed from the surface of the substrate.

One embodiment of the disclosure provides a substrate processing apparatus for processing a substrate having a surface on which a first region and a second region in which different substances are exposed are present.

The substrate processing apparatus includes a processing liquid supply unit which supplies a processing liquid to the surface of the substrate, a processing film forming unit which solidifies or cures the processing liquid and forms a processing film on the surface of the substrate, a preprocessing liquid supply unit which supplies a preprocessing liquid to the surface of the substrate, a preprocessing film forming unit which solidifies or cures the preprocessing liquid and forms a preprocessing film on the surface of the substrate, a stripping liquid supply unit which supplies a stripping liquid to the surface of the substrate, and a controller which controls the preprocessing liquid supply unit, the preprocessing film forming unit, the processing liquid supply unit, the processing film forming unit, and the stripping liquid supply unit.

The controller is programmed to supply the preprocessing liquid from the preprocessing liquid supply unit to the surface of the substrate, to solidify or cure the preprocessing liquid on the surface of the substrate by the preprocessing film forming unit to form the preprocessing film, which holds a removal target present on the surface of the substrate, on the surface of the substrate, to supply the stripping liquid from the stripping liquid supply unit to the surface of the substrate to separate the preprocessing film from the surface of the substrate in a state in which the preprocessing film holds the removal target, to supply the processing liquid from the processing liquid supply unit to the surface of the substrate after the preprocessing film is separated, to solidify or cure the processing liquid on the surface of the substrate by the processing film forming unit to form the processing film, which holds the removal target present on the surface of the substrate, on the surface of the substrate, and to supply the stripping liquid from the stripping liquid supply unit to the surface of the substrate to separate the processing film from the surface of the substrate in a state in which the processing film holds the removal target.

Additionally, a removal capacity for the processing film to remove the removal target present in the second region is higher than a removal capacity for the preprocessing film to remove the removal target present in the second region. Also, a removal capacity for the preprocessing film to remove the removal target present in the first region is higher than a removal capacity for the processing film to remove the removal target present in the first region.

With such a configuration, the same effects as those of the above-described substrate processing method can be obtained.

According to one embodiment, the removal capacity for removing the removal target may be constituted of a holding capacity which holds the removal target present in the first region or the second region on the processing film or the preprocessing film, and separability which indicates a degree of separation of the processing film or the preprocessing film in a state in which the processing film or the preprocessing film holds the removal target. Additionally, the preprocessing film may have higher separability than the processing film in the first region, and the processing film may have a higher holding capacity than the preprocessing film in the second region.

Therefore, in the first region, most of the removal target can be removed by separating of the preprocessing liquid film, and in the second region, most of the removal target can be removed by separating of the processing film. Therefore, even when the substrate has a surface on which regions in which different substances are exposed are present, the removal target can be efficiently removed.

One embodiment of the disclosure provides a recipe selection method for selecting a recipe which performs a substrate processing method for processing a processing target substrate. The recipe selection method includes an information acquisition step of acquiring information about a surface of the processing target substrate, a surface determination step of determining whether the processing target substrate is a substrate which has a surface having both an exposed region in which a specific substance is exposed and a non-exposed region in which the specific substance is not exposed, or a substrate which has a surface having only the non-exposed region based on the information acquired by the information acquisition step, and a recipe selection step of selecting a first recipe which performs a first substrate processing method for removing a removal target from the processing target substrate using a processing liquid when the surface determination step determines that only the non-exposed region is present on the surface of the processing target substrate, and selecting a second recipe which performs a second substrate processing method for removing the removal target from the processing target substrate using the processing liquid after the removal target is removed from the processing target substrate using a preprocessing liquid having a higher removal capacity for removing the removal target from the exposed region than the processing liquid when the surface determination step determines that both the exposed region and the non-exposed region are present on the surface of the processing target substrate.

Preferably, a substrate in which the exposed region in which the specific substance is exposed is not present on the surface and a substrate in which both the exposed region and the non-exposed region are present on the surface may be processed by different substrate processing methods. Specifically, in a case in which only the non-exposed region is present on the surface of the processing target substrate, when the first substrate processing method in which the removal target is removed from the processing target substrate using the processing liquid is performed, the removal target can be sufficiently removed from the surface of the substrate.

On the other hand, in a case in which both the exposed region and the non-exposed region are present on the surface of the processing target substrate, even when the removal target can be sufficiently removed from the non-exposed region simply by removing the removal target from the processing target substrate using the processing liquid, the removal target may not be sufficiently removed from the exposed region.

Therefore, when both the exposed region and the non-exposed region are present on the surface of the processing target substrate, it is necessary to perform the second substrate processing method for removing the removal target from the substrate using the processing liquid after the removal target is removed from the substrate using the preprocessing liquid having a higher removal capacity for removing the removal target from the specific substance than the processing liquid.

Therefore, the appropriate substrate processing method can be performed according to the state of the surface of the substrate by selecting the first recipe for performing the first substrate processing method when only the non-exposed region is present on the surface of the processing target substrate and selecting the second recipe for performing the second substrate processing method when both the exposed region and the non-exposed region are present on the surface of the processing target substrate.

In the second substrate processing method performed when the second recipe is selected, the preprocessing liquid may have a first component and a second component. The second component may have a higher removal capacity for removing the removal target from the specific substance than the first component. The recipe selection method may further include a type determination step of determining a type of the specific substance exposed on the surface of the processing target substrate based on the information acquired by the information acquisition step when the surface determination step determines that both the exposed region and the non-exposed region are present on the surface of the processing target substrate. Additionally, the recipe selection step may include a step of selecting the second recipe in which a concentration of the second component in the preprocessing liquid used in the second substrate processing method is set according to the specific substance of the type determined by the type determination step According to this method, when both the exposed region and the non-exposed region are present on the surface of the processing target substrate, the second recipe suitable for removing the removal target from the exposed region can be selected according to the type of the specific substance.

Another embodiment of the disclosure provides a substrate processing method for processing a substrate having a surface having an exposed region in which a specific substance is exposed and a non-exposed region other than the exposed region. The substrate processing method includes a processing liquid supply step of supplying a processing liquid to the surface of the substrate, a film forming step of solidifying or curing the processing liquid supplied to the surface of the substrate and forming a separation target film which holds a first removal target present in the non-exposed region on the surface of the substrate and covers the non-exposed region and a protective film, which covers and protects the exposed region, on the surface of the substrate, a separation target film separating step of supplying a stripping liquid to the surface of the substrate and separating the separation target film from the surface of the substrate in a state in which the separation target film holds the first removal target, a cleaning step of supplying a cleaning liquid to the surface of the substrate and removing a second removal target present on the surface of the substrate by the cleaning liquid after the separation target film separating step, and a protective film removing step of supplying a removing liquid to the surface of the substrate and removing the protective film from the surface of the substrate after the cleaning step.

According to this method, the separation target film which covers the non-exposed region on the surface of the substrate and the protective film which covers the exposed region on the surface of the substrate are formed by the processing liquid supplied to the surface of the substrate being solidified or cured. The separation target film holds the first removal target present in the non-exposed region.

The separation target film is separated from the surface of the substrate in a state in which the separation target film holds the first removal target by supplying the stripping liquid to the surface of the substrate on which the separation target film and the protective film are formed. Therefore, the first removal target is removed from the non-exposed region. Even after the separation target film is separated by the stripping liquid, the second removal target remains on the surface of the substrate.

Then, the second removal target is removed from the surface of the substrate by the cleaning liquid, and then the protective film is also removed from the surface of the substrate by the removing liquid. When the cleaning liquid is supplied to the surface of the substrate, the exposed region in which a specific substance is exposed on the surface of the substrate is covered with the protective film. Thus, even when the cleaning liquid has a property of deteriorating (for example, oxidizing) the specific substance exposed on the surface of the substrate, the second removal target can be removed without deteriorating the specific substance.

In this way, it is possible to efficiently remove a plurality of types of removal targets (the first removal target and the second removal target) from the surface of the substrate while the deterioration of the specific substance exposed on the surface of the substrate is curbed.

According to another embodiment, the processing liquid may have a first solute and a first solvent which dissolves the first solute. The first solute may have a first high-solubility component and a first low-solubility component which is less soluble in the stripping liquid than the first high-solubility component. The protective film may include a low-solubility layer constituted of the first low-solubility component in a solid state disposed at a position in contact with the specific substance, and a high-solubility layer constituted of the first high-solubility component in a solid state disposed on an opposite side of the specific substance with respect to the low-solubility layer.

Thus, in the protective film, the high-solubility layer constituted of the first high-solubility component in the solid state is dissolved by the stripping liquid, but hardly any of the low-solubility layer constituted of the first low-solubility component in the solid state is dissolved by the stripping liquid. Thus, it is difficult for the stripping liquid to enter a space between the low-solubility layer and the surface of the substrate. Therefore, the protective film remains on the exposed region without being separated by the stripping liquid. Therefore, the cleaning liquid can be supplied to the surface of the substrate in a state in which the specific substance exposed from the surface of the substrate is appropriately protected.

As a result, the second removal target can be efficiently removed from the surface of the substrate while the deterioration of the specific substance exposed on the surface of the substrate is curbed.

According to another embodiment, the processing liquid may have a first solute and a first solvent which dissolves the first solute. The first solute may have a first high-solubility component and a first low-solubility component which is less soluble in the stripping liquid than the first high-solubility component. The film forming step may include a step of forming the separation target film having the first high-solubility component in a solid state and the first low-solubility component in a solid. Additionally, the separation target film separating step may include a step of selectively dissolving the first high-solubility component in the solid state in the stripping liquid According to this method, the first high-solubility component in the solid state in the separation target film is selectively dissolved in the stripping liquid.

The stripping liquid passes through the separation target film via a trace in which the first high-solubility component in the solid state was present (a path formed by dissolving the first high-solubility component) by dissolving the first high-solubility component in the solid state in the stripping liquid. Thus, the stripping liquid can act on a contact interface between the separation target film and the substrate. On the other hand, the first low-solubility component in the separation target film is maintained in the solid state without being dissolved. Therefore, the stripping liquid can act on a contact interface between the first low-solubility component in the solid state and the substrate while the first removal target is held by the first low-solubility component in the solid state. As a result, the separation target film can be quickly removed from the surface of the substrate, and the first removal target together with the separation target film can be efficiently removed from the surface of the substrate.

According to another embodiment, the separation target film separating step may include a first through hole forming step of partially dissolving the separation target film in the stripping liquid and forming a first through hole in the separation target film.

Therefore, the stripping liquid can pass through the processing film via the first through hole and quickly reach the vicinity of an interface between the separation target film and the non-exposed region on the surface of the substrate. Thus, the stripping liquid can be allowed to act on the interface between the separation target film and the substrate to efficiently separate the separation target film from the substrate. As a result, the first removal target can be efficiently removed from the surface of the substrate.

According to another embodiment, the substrate processing method may further include a preprocessing liquid supply step of supplying a preprocessing liquid to the surface of the substrate before the processing liquid supply step, a preprocessing film forming step of solidifying or curing the preprocessing liquid supplied to the surface of the substrate and forming a preprocessing film, which holds the first removal target present in the exposed region on the surface of the substrate, on the surface of the substrate before the processing liquid supply step, and a preprocessing film separating step of supplying a stripping liquid to the surface of the substrate and separating the preprocessing film together with the first removal target from the exposed region on the surface of the substrate before the processing liquid supply step.

According to this method, the first removal target present in the exposed region on the surface of the substrate can be removed before the processing liquid is supplied to the surface of the substrate. That is, after the first removal target is removed from the exposed region, the protective film can be formed in the exposed region. Therefore, a state in which the first removal target is removed from the exposed region on the surface of the substrate can be maintained until the protective film is removed in the subsequent protective film removing step. Therefore, even when the protective film is dissolved in the removing liquid, it is possible to curb remaining of the first removal target in the exposed region after the protective film is removed.

According to another embodiment, the preprocessing liquid may have a second solute and a second solvent which dissolves the second solute. The second solute may have a second high-solubility component and a second low-solubility component which is less soluble in the stripping liquid than the second high-solubility component. The preprocessing film forming step may include a step of forming the preprocessing film having the second high-solubility component in a solid state and the second low-solubility component in a solid state. Additionally, the preprocessing film separating step may include a step of selectively dissolving the second high-solubility component in the solid state in the preprocessing film in the stripping liquid.

According to this method, the second high-solubility component in the solid state in the preprocessing film is selectively dissolved in the stripping liquid.

The stripping liquid passes through the preprocessing film via a trace in which the second high-solubility component in the solid state was present (a path formed by dissolving the second high-solubility component) by dissolving the second high-solubility component in the solid state in the stripping liquid. Thus, the stripping liquid can act on a contact interface between the preprocessing film and the substrate. On the other hand, the second low-solubility component in the preprocessing film is maintained in the solid state without being dissolved. Therefore, the stripping liquid can act on a contact interface between the second low-solubility component in the solid state and the substrate while the first removal target is held by the second low-solubility component in the solid state. As a result, the preprocessing film can be quickly removed from the surface of the substrate, and the first removal target together with the preprocessing film can be efficiently removed from the surface of the substrate.

According to another embodiment, the preprocessing film separating step may include a second through hole forming step of partially dissolving the preprocessing film in the stripping liquid and forming a second through hole in the preprocessing film.

Therefore, the stripping liquid can pass through the preprocessing film via the second through hole and quickly reach the vicinity of an interface between the preprocessing film and the surface of the substrate. Thus, the stripping liquid can be allowed to act on the interface between the preprocessing film and the substrate to efficiently separate the separation target film from the substrate. As a result, the first removal target can be efficiently removed from the surface of the substrate.

According to another embodiment, the specific substance may be a metal, and the cleaning liquid may have an oxidizing power which oxidizes the metal exposed on the surface of the substrate. When the cleaning liquid is supplied to the surface of the substrate, and the exposed region in which the metal is exposed on the surface of the substrate is covered with the protective film, the second removal target can be removed while the oxidation of the metal by the cleaning liquid is avoided.

According to another embodiment, the first removal target and the second removal target may be residues produced by a dry etching processing. Thus, when the granular residue as the first removal target is removed by separating the separation target film, and the film-shaped residue as the second removal target is removed with the cleaning liquid, it is possible to efficiently remove the removal target from the substrate while the oxidation of the metal exposed on the surface of the substrate is curbed.

Specifically, the separation target film in a state in which it holds the granular residue can be separated from the surface of the substrate by supplying the stripping liquid to the surface of the substrate in a state in which the separation target film and the protective film are formed. Therefore, the first removal target is removed from the non-exposed region.

Then, the film-shaped residue is removed from the surface of the substrate by the cleaning liquid, and then the protective film is removed from the surface of the substrate the removing liquid. When the cleaning liquid is supplied to the surface of the substrate, the exposed region in which the metal is exposed on the surface of the substrate is covered with the protective film. Therefore, although the cleaning liquid has the property of oxidizing the metal exposed on the surface of the substrate, the film-shaped residue can be removed without oxidizing the metal.

According to another embodiment, the removing liquid may have a property of dissolving the protective film and the separation target film. Thus, the protective film can be dissolved in the removing liquid to smoothly remove the protective film from the upper surface of the substrate. Further, the removing liquid can dissolve the separation target film. Therefore, even when the residue of the separation target film adheres to the surface of the substrate after the separation target film is separated by the stripping liquid, the residue can be removed by the removing liquid.

Still another embodiment of the disclosure provides a substrate processing apparatus for processing a substrate having a surface having an exposed region in which a specific substance is exposed and a non-exposed region other than the exposed region. The substrate processing apparatus includes a processing liquid supply unit which supplies a processing liquid to the surface of the substrate, a film forming unit which solidifies or cures the processing liquid and forms a solid film, a stripping liquid supply unit which supplies a stripping liquid to the surface of the substrate, a cleaning liquid supply unit which supplies a cleaning liquid to the surface of the substrate, a removing liquid supply unit which supplies a removing liquid to the surface of the substrate, and a controller which controls the processing liquid supply unit, the film forming unit, the stripping liquid supply unit, the cleaning liquid supply unit, and the removing liquid supply unit.

Additionally, the controller is programmed to supply the processing liquid from the processing liquid supply unit to the surface of the substrate, to solidify or cure the processing liquid on the surface of the substrate by the film forming unit to form a separation target film which holds a first removal target present on the surface of the substrate and covers the non-exposed region and a protective film, which covers and protects the exposed region, on the surface of the substrate, to separate the separation target film together with the first removal target from the surface of the substrate by supplying the stripping liquid from the stripping liquid supply unit toward the surface of the substrate and to supply the cleaning liquid from the cleaning liquid supply unit toward the surface of the substrate and to remove a second removal target present on the surface of the substrate after the separation target film is separated, and to supply a removing liquid from the removing liquid supply unit toward the surface of the substrate to remove the protective film from the surface of the substrate after the cleaning liquid is supplied. With such a configuration, the same effects as those of the substrate processing method according to another embodiment described above are obtained.

The above-described or still other objects, features and effects in the disclosure will be clarified by the description of the embodiments described below with reference to the accompanying drawings.

BRIEF DESCRIPTION OF THE DRAWINGS

FIG. 16 a table for explaining results of an experiment for verifying change in a capacity to remove particles from a copper film according to changing a ratio between a first component and a second component of a high-solubility component in a polymer-containing liquid used as the processing liquid and the preprocessing liquid.

DETAILED DESCRIPTION OF THE PREFERRED EMBODIMENTS

First Embodiment

Figure 1:
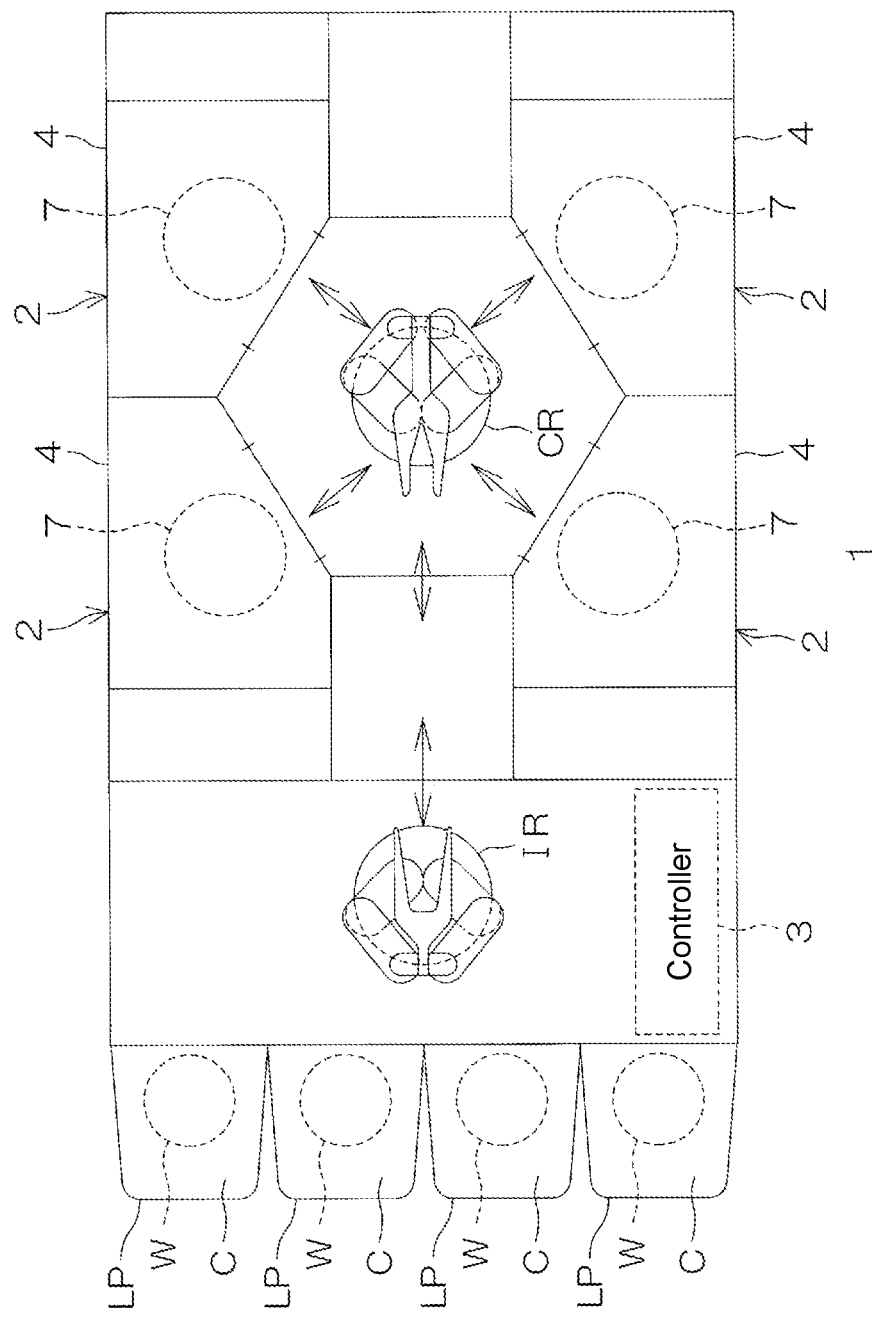
FIG. 1 is a schematic plan view showing a layout of a substrate processing apparatus according to a first embodiment of the disclosure.

FIG. 1 is a schematic plan view showing a layout of a substrate processing apparatus 1 according to an embodiment of the disclosure.

The substrate processing apparatus 1 is a single-wafer type apparatus which processes substrates W such as silicon wafers one by one. In this embodiment, the substrate W is a disc-shaped substrate.

The substrate processing apparatus 1 includes a plurality of processing units 2 which processes the substrate W with a fluid, a load port LP on which a carrier C for accommodating a plurality of the substrates W processed by the processing unit 2 is placed, transfer robots IR and CR which transfer the substrate W between the load port LP and the processing unit 2, and a controller 3 which controls the substrate processing apparatus 1.

The transfer robot IR transfers the substrate W between the carrier C and the transfer robot CR. The transfer robot CR transfers the substrate W between the transfer robot IR and the processing unit 2. The plurality of processing units 2 has, for example, the same configuration. As will be described in detail later, a processing fluid supplied to the substrate W in the processing unit 2 includes a rinse liquid, a processing liquid, a preprocessing liquid, a stripping liquid, a cleaning liquid, a removing liquid, a heat medium, an inert gas (a gas), and the like.

Each of the processing units 2 includes a chamber 4 and a processing cup 7 disposed in the chamber 4, and performs processing of the substrate W in the processing cup 7. An entrance (not shown) for loading the substrate W and unloading the substrate W by the transfer robot CR is formed in the chamber 4. A shutter unit (not shown) which opens and closes the entrance is provided at the chamber 4.

Figure 2:
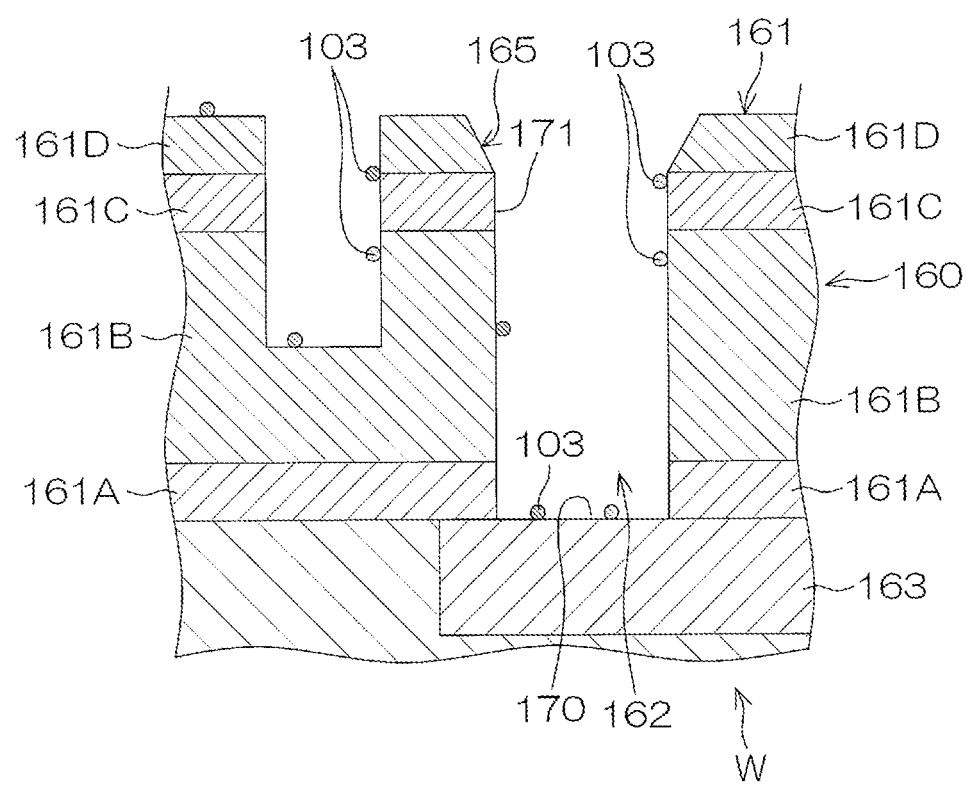
FIG. 2 is an example of a cross-sectional view of a surface layer of a substrate processed by the substrate processing apparatus.

FIG. 2 is an example of a cross-sectional view of a surface layer of the substrate W processed by the substrate processing apparatus 1. The surface layer of the substrate W is a portion near a surface of the substrate W.

A fine uneven pattern 160 is formed on the surface of the unprocessed substrate W before it is processed by the processing unit 2. The uneven pattern 160 includes a fine convex structure 161 formed on the surface of the substrate W and a concave portion (a groove) 162 formed between adjacent structures 161. The structure 161 is configured of an etching stopper film 161A, a low dielectric constant interlayer insulating film 161B, an oxide film 161C, a metal hard mask 161D, and the like.

A surface of the uneven pattern 160, that is, a surface of the structure 161 (the convex portion) and a surface of the concave portion 162 form an uneven pattern surface 165. The pattern surface 165 is included in the surface of the substrate W. A region in which various substances are exposed is present on the pattern surface 165 of the substrate W. In an example shown in FIG. 2, a metal film 163 such as a copper film is exposed from a bottom portion of the concave portion 162. The pattern surface 165 includes an exposed region 170 in which a surface of the metal film 163 is exposed and a non-exposed region 171 in which the metal film 163 is not exposed. The non-exposed region 171 is a region other than the exposed region 170 on the pattern surface 165 of the substrate W.

In this embodiment, a metal such as copper is an example of a specific substance. Additionally, the exposed region 170 corresponds to a first region, and the non-exposed region 171 corresponds to a second region.

A removal target 103 adheres to both the non-exposed region 171 and the exposed region 170. The removal target 103 has, for example, a granular shape. The granular shape means a spherical shape, an ellipsoidal shape, a polyhedral shape, and the like. The removal target 103 is an example of a first removal target.

Figure 3:
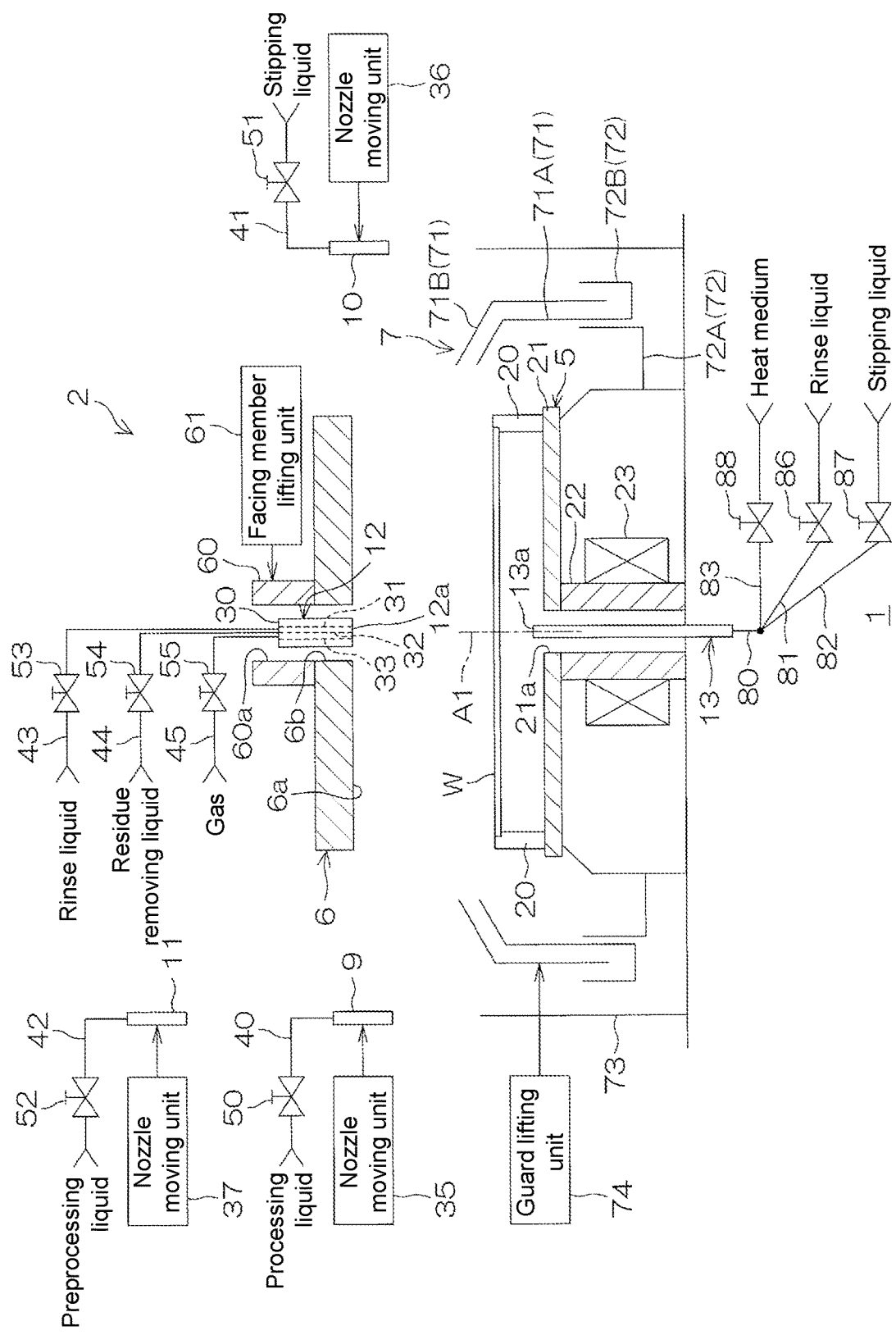
FIG. 3 is a schematic partial cross-sectional view showing a schematic configuration of a processing unit provided in the substrate processing apparatus.

FIG. 3 is a schematic view for explaining a configuration example of the processing unit 2. The processing unit 2 includes a spin chuck 5, a facing member 6, a processing cup 7, a first moving nozzle 9, a second moving nozzle 10, a third moving nozzle 11, a central nozzle 12, and a lower surface nozzle 13.

The spin chuck 5 rotates the substrate W around a vertical rotation axis μl (a vertical axis) passing through a central portion of the substrate W while the substrate W is held horizontally. The spin chuck 5 includes a plurality of chuck pins 20, a spin base 21, a rotating shaft 22, and a spin motor 23.

The spin base 21 has a disc shape following a horizontal direction. The plurality of chuck pins 20 for gripping a peripheral edge of the substrate W are disposed on an upper surface of the spin base 21 at intervals in a circumferential direction of the spin base 21. The spin base 21 and the plurality of chuck pins 20 form a substrate holding unit which holds the substrate W horizontally. The substrate holding unit is also called a substrate holder.

The rotating shaft 22 extends along the rotation axis A1 in a vertical direction. An upper end portion of the rotating shaft 22 is coupled to a center of a lower surface of the spin base 21. The spin motor 23 applies a rotational force to the rotating shaft 22. The spin base 21 is rotated by the spin motor 23 rotating the rotating shaft 22. Thus, the substrate W is rotated around the rotation axis A1. The spin motor 23 is an example of a substrate rotating unit which rotates the substrate W around the rotation axis A1.

The facing member 6 faces the substrate W held by the spin chuck 5 from above. The facing member 6 is formed in a disc shape having a diameter substantially the same as or larger than the substrate W. The facing member 6 has a facing surface 6a which faces the upper surface of the substrate W. The facing surface 6a is disposed above the spin chuck 5 substantially along a horizontal plane. The upper surface of the substrate W means a surface of the substrate W on the upper side, and the lower surface of the substrate W means a surface of the substrate W on the lower side.

A hollow shaft 60 is fixed to the facing member 6 on the side opposite to the facing surface 6a. A communication hole 6b which vertically passes through the facing member 6 is formed in a portion of the facing member 6 which overlaps the rotation axis A1 in a plan view. The communication hole 6b communicates with an internal space 60a of the hollow shaft 60.

The facing member 6 shields an atmosphere in a space between the facing surface 6a and the upper surface of the substrate W from an atmosphere outside the space. Therefore, the facing member 6 is also referred to as a blocking plate.

The processing unit 2 further includes a facing member lifting unit 61 which drives moving-up and moving-down of the facing member 6. The facing member lifting unit 61 can position the facing member 6 in the vertical direction at an arbitrary position (height) from a lower position to an upper position. The lower position is a position at which the facing surface 6a is closest to the substrate W in a movable range of the facing member 6. The upper position is a position at which the facing surface 6a is furthest away from the substrate W in the movable range of the facing member 6. When the facing member 6 is located at the upper position, the transfer robot CR can access the spin chuck 5 for loading and unloading the substrate W.

The facing member lifting unit 61 includes, for example, a ball screw mechanism (not shown) coupled to a support member (not shown) which supports the hollow shaft 60, and an electric motor (not shown) which applies a driving force to the ball screw mechanism. The facing member lifting unit 61 is also referred to as a facing member lifter (a blocking plate lifter).

The processing cup 7 includes a plurality of guards 71 which receive liquid scattered outward from the substrate W held by the spin chuck 5, a plurality of cups 72 which receive the liquid guided downward by the plurality of guards 71, and a cylindrical outer wall member 73 which surrounds the plurality of guards 71 and the plurality of cups 72.

In this embodiment, an example in which two guards 71 (a first guard 71A and a second guard 71B) and two cups 72 (a first cup 72A and a second cup 72B) are provided is shown.

Each of the first cup 72A and the second cup 72B has an annular groove shape which opens upward.

The first guard 71A is disposed to surround the spin base 21. The second guard 71B is disposed to surround the spin base 21 outward in a rotation radial direction of the substrate W as compared with the first guard 71A.

Each of the first guard 71A and the second guard 71B has a substantially cylindrical shape. An upper end portion of each of the guards 71 is inclined inward toward the spin base 21.

The first cup 72A receives the liquid guided downward by the first guard 71A. The second cup 72B is integrally formed with the first guard 71A and receives the liquid guided downward by the second guard 71B.

The processing unit 2 includes a guard lifting unit 74 which separately moves the first guard 71A and the second guard 71B up and down in the vertical direction. The guard lifting unit 74 moves the first guard 71A up and down between the lower position and the upper position. The guard lifting unit 74 moves the second guard 71B up and down between the lower position and the upper position.

When both the first guard 71A and the second guard 71B are located at the upper position, the liquid scattered from the substrate W is received by the first guard 71A. When the first guard 71A is located at the lower position and the second guard 71B is located at the upper position, the liquid scattered from the substrate W is received by the second guard 71B. When both the first guard 71A and the second guard 71B are located at the lower position, the transfer robot CR can access the spin chuck 5 for loading and unloading the substrate W.

The guard lifting unit 74 includes, for example, a first ball screw mechanism (not shown) coupled to the first guard 71A, a first motor (not shown) which applies a driving force to the first ball screw mechanism, a second ball screw mechanism (not shown) coupled to the second guard 71B, and a second motor (not shown) which applies a driving force to the second ball screw mechanism. The guard lifting unit 74 is also referred to as a guard lifter.

The first moving nozzle 9 is an example of a processing liquid nozzle (a processing liquid supply unit) which supplies (discharges) a processing liquid toward the upper surface of the substrate W held by the spin chuck 5.

The first moving nozzle 9 is moved in the horizontal direction and the vertical direction by a first nozzle moving unit 35. The first moving nozzle 9 can move between a center position and a home position (a retracted position) in the horizontal direction. When the first moving nozzle 9 is located at the center position, the first moving nozzle 9 faces a rotation center on the upper surface of the substrate W. The rotation center of the upper surface of the substrate W is a position intersecting the rotation axis A1 on the upper surface of the substrate W.

When the first moving nozzle 9 is located at the home position, the first moving nozzle 9 does not face the upper surface of the substrate W and is located outside the processing cup 7 in a plan view. The first moving nozzle 9 can approach the upper surface of the substrate W or can retract upward from the upper surface of the substrate W by moving in the vertical direction.

The first nozzle moving unit 35 includes, for example, an arm (not shown) which is coupled to the first moving nozzle 9 and extends horizontally, a rotating shaft (not shown) which is coupled to the arm and extends in the vertical direction, and a rotating shaft drive unit (not shown) which moves up and down or rotates the rotating shaft.

The rotating shaft drive unit swings the arm by rotating the rotating shaft around a vertical rotation axis. Further, the rotating shaft drive unit moves the arm up and down by moving the rotating shaft up and down in the vertical direction. The first moving nozzle 9 moves in the horizontal direction and the vertical direction according to the swinging and the moving up and down of the arm.

The first moving nozzle 9 is connected to a processing liquid pipe 40 which guides the processing liquid. When a processing liquid valve 50 interposed in the processing liquid pipe 40 is opened, the processing liquid is discharged downward from the first moving nozzle 9 in a continuous flow.

The processing liquid discharged from the first moving nozzle 9 contains a solute and a solvent. The processing liquid solidifies or cures by at least some of the solvent being volatized (evaporated). The processing liquid solidifies or cures on the substrate W and forms a solid processing film which holds the removal target 103 that is present on the substrate W.

Here, "solidification" means, for example, that the solute is solidified by a force acting between molecules or atoms as the solvent volatilizes. "Curing" means, for example, that the solute is solidified due to a chemical change such as polymerization or cross-linking. Therefore, "solidification or curing" means that the solute is "solidified" due to various factors.

The solute contained in the processing liquid discharged from the first moving nozzle 9 includes a low-solubility component and a high-solubility component.

When a metal is exposed on the surface of the substrate W, preferably, the solute contained in the processing liquid discharged from the first moving nozzle 9 contains a corrosion prevention component. As will be described in detail later, the corrosion prevention component is, for example, BTA (benzotriazole).

Substances having different solubilities in a stripping liquid can be used as the low-solubility component and the high-solubility component contained in the processing liquid discharged from the first moving nozzle 9. The low-solubility component contained in the processing liquid discharged from the first moving nozzle 9 is, for example, novolac. The high-solubility component contained in the processing liquid discharged from the first moving nozzle 9 is, for example, 2,2-bis(4-hydroxyphenyl)propane. The processing liquid is also referred to as a polymer-containing liquid, and the processing film is also referred to as a polymer film.

The solvent contained in the processing liquid discharged from the first moving nozzle 9 may be any liquid which dissolves the low-solubility component and the high-solubility component. The solvent contained in the processing liquid is preferably a liquid having compatibility (mixability) with the stripping liquid.

The solvent contained in the processing liquid is referred to as a first solvent, and the solute contained in the processing liquid is referred to as a first solute. The low-solubility component contained in the processing liquid is referred to as a first low-solubility component, and the high-solubility component contained in the processing liquid is referred to as a first high-solubility component.

Details of the solvent, the low-solubility component, the high-solubility component, and the corrosion prevention component contained in the processing liquid discharged from the first moving nozzle 9 will be described later.

The second moving nozzle 10 is an example of a stripping liquid nozzle (a stripping liquid supply unit) which supplies (discharges) the stripping liquid such as ammonia water in a continuous flow toward the upper surface of the substrate W held by the spin chuck 5. The stripping liquid is a liquid for separating the processing film which holds the removal target 103 from the upper surface of the substrate W. Specifically, only a portion of the processing film which covers the non-exposed region 171 is separated from the substrate W by the stripping liquid.

The second moving nozzle 10 is moved in the horizontal direction and the vertical direction by a second nozzle moving unit 36. The second moving nozzle 10 can move between a center position and a home position (a retracted position) in the horizontal direction.

When the second moving nozzle 10 is located at the center position, the second moving nozzle 10 faces a rotation center on the upper surface of the substrate W. When the second moving nozzle 10 is located at the home position, the second moving nozzle 10 does not face the upper surface of the substrate W and is located outside the processing cup 7 in a plan view. The second moving nozzle 10 can approach the upper surface of the substrate W or can retract upward from the upper surface of the substrate W by moving in the vertical direction.

The second nozzle moving unit 36 has the same configuration as the first nozzle moving unit 35. That is, the second nozzle moving unit 36 includes, for example, an arm (not shown) which is coupled to the second moving nozzle 10 and extends horizontally, a rotating shaft (not shown) which is coupled to the arm and extends in the vertical direction, and a rotating shaft drive unit (not shown) which moves up and down or rotates the rotating shaft.

A liquid which can more easily dissolve the high-solubility component contained in the solute of the processing liquid than the low-solubility component contained in the solute of the processing liquid is used as the stripping liquid discharged from the second moving nozzle 10. The stripping liquid discharged from the second moving nozzle 10 is not limited to ammonia water.

The stripping liquid discharged from the second moving nozzle 10 may be, for example, an alkaline aqueous solution (an alkaline liquid) other than the ammonia water. Specific examples of the alkaline aqueous solution other than the ammonia water include a tetramethylammonium hydroxide (TMAH) aqueous solution, a choline aqueous solution, and a combination thereof.

The stripping liquid discharged from the second moving nozzle 10 may be pure water (preferably DIW) or a neutral or acidic aqueous solution (a non-alkaline aqueous solution).

The second moving nozzle 10 is connected to an upper stripping liquid pipe 41 which guides the stripping liquid to the second moving nozzle 10. When an upper stripping liquid valve 51 interposed in the upper stripping liquid pipe 41 is opened, the stripping liquid is discharged downward from a discharge port of the second moving nozzle 10 in a continuous flow.

The third moving nozzle 11 is an example of a preprocessing liquid nozzle (a preprocessing liquid supply unit) which supplies (discharges) the preprocessing liquid toward the upper surface of the substrate W held by the spin chuck 5.

The third moving nozzle 11 is moved in the horizontal direction and the vertical direction by a third nozzle moving unit 37. The third moving nozzle 11 can move between a center position and a home position (a retracted position) in the horizontal direction.

When the third moving nozzle 11 is located at the center position, the third moving nozzle 11 faces the rotation center of the upper surface of the substrate W. When the third moving nozzle 11 is located at the home position, the third moving nozzle 11 does not face the upper surface of the substrate W and is located outside the processing cup 7 in a plan view. The third moving nozzle 11 can approach the upper surface of the substrate W or can retract upward from the upper surface of the substrate W by moving in the vertical direction.

The third nozzle moving unit 37 has the same configuration as the first nozzle moving unit 35. That is, the third nozzle moving unit 37 includes, for example, an arm (not shown) which is coupled to the third moving nozzle 11 and extends horizontally, a rotating shaft (not shown) which is coupled to the arm and extends in the vertical direction, and a rotating shaft drive unit (not shown) which moves up and down or rotates the rotating shaft.

The preprocessing liquid discharged from the third moving nozzle 11 contains a solute and a solvent. The preprocessing liquid solidifies or cures by volatilizing (evaporating) at least some of the solvent. The preprocessing liquid solidifies or cures on the substrate W and forms a preprocessing film which holds the removal target 103 that is present on the substrate W.

The solute contained in the preprocessing liquid discharged from the third moving nozzle 11 includes a low-solubility component and a high-solubility component.

When a metal is exposed on the surface of the substrate W, preferably, the solute contained in the preprocessing liquid discharged from the third moving nozzle 11 contains a corrosion prevention component. As will be described in detail later, the corrosion prevention component is, for example, BTA.

Substances having different solubilities in the stripping liquid can be used as the low-solubility component and the high-solubility component contained in the preprocessing liquid. The low-solubility component contained in the preprocessing liquid discharged from the third moving nozzle 11 is, for example, novolac. The high-solubility component contained in the preprocessing liquid discharged from the third moving nozzle 11 includes 2,2-bis(4-hydroxyphenyl) propane (a first component) and 3,6-dimethyl-4-octyne-3,6-diol (a second component). The preprocessing liquid is also referred to as a polymer-containing liquid, and the preprocessing film is also referred to as a polymer film.

The solvent contained in the preprocessing liquid discharged from the third moving nozzle 11 may be a liquid which dissolves the low-solubility component and the high-solubility component. The solvent contained in the preprocessing liquid is preferably a liquid having compatibility (mixability) with the stripping liquid.

The solvent contained in the preprocessing liquid is referred to as a second solvent, and the solute contained in the preprocessing liquid is referred to as a second solute. The low-solubility component contained in the processing liquid is referred to as a second low-solubility component, and the high-solubility component contained in the processing liquid is referred to as a second high-solubility component.

Details of the solvent, the low-solubility component, the high-solubility component, and the corrosion prevention component contained in the preprocessing liquid discharged from the third moving nozzle 11 will be described later.

In the preprocessing film, both a portion which covers the exposed region 170 and a portion which covers the non-exposed region 171 are separated from the substrate W by the stripping liquid.

A removal capacity for the polymer film such as the processing film or the preprocessing film to remove the removal target 103 is significantly different in a case in which the removal target 103 is removed from the exposed region 170 and a case in which the removal target 103 is removed from the non-exposed region 171.

The removal capacity for the polymer film to remove the removal target 103 is constituted of a removal target holding capacity and separability. The removal target holding capacity is an ability to hold the removal target 103, which is present in a target region (the exposed region 170 or the non-exposed region 171), at least in the polymer film or a surface of the polymer film. The separability is a property which indicates a degree of separation when the polymer film in a state in which the removal target 103 is held is separated by the stripping liquid. High separability means that it is easily separated by the stripping liquid. The removal capacity for the polymer film is an ability to remove the removal target 103 from the target region when the polymer film is separated by the stripping liquid in the state in which the removal target 103 which is present in the target region is held.

The preprocessing film exhibits a high removal target holding capacity in both the non-exposed region 171 and the exposed region 170, and the processing film exhibits a higher removal target holding capacity than the preprocessing film in both the non-exposed region 171 and the exposed region 170. On the other hand, the preprocessing film has higher separability than the processing film in the exposed region 170. Therefore, the preprocessing film exhibits a higher removal capacity than the processing film in the exposed region 170, and the processing film exhibits a higher removal capacity than the preprocessing film in the non-exposed region 171.

Specifically, the removal capacity for the processing film to remove the removal target 103 present in the non-exposed region 171 is higher than the removal capacity for the preprocessing film to remove the removal target 103 present in the non-exposed region 171. The removal capacity for the preprocessing film to remove the removal target 103 present in the exposed region 170 is higher than the removal capacity for the processing film to remove the removal target 103 present in the exposed region 170.

The third moving nozzle 11 is connected to a preprocessing liquid pipe 42 which guides the preprocessing liquid to the third moving nozzle 11. When a preprocessing liquid valve 52 interposed in the preprocessing liquid pipe 42 is opened, the preprocessing liquid is discharged downward from a discharge port of the third moving nozzle 11 in a continuous flow.

The central nozzle 12 is accommodated in the internal space 60a of the hollow shaft 60 of the facing member 6. A discharge port 12a provided at a tip end of the central nozzle 12 faces a central region of the upper surface of the substrate W from above. The central region of the upper surface of the substrate W is a region on the upper surface of the substrate W which includes the rotation center of the substrate W and surroundings thereof.

The central nozzle 12 includes a plurality of tubes (a first tube 31, a second tube 32, and a third tube 33) which discharges a fluid downward, and a tubular casing 30 which surrounds the plurality of tubes. The plurality of tubes and the casing 30 extend along the rotation axis A1 in the vertical direction. The discharge port 12a of the central nozzle 12 is also a discharge port of the first tube 31, a discharge port of the second tube 32, and a discharge port of the third tube 33.

The first tube 31 (the central nozzle 12) is an example of a rinse liquid supply unit which supplies a rinse liquid such as DIW to the upper surface of the substrate W. The second tube 32 (the central nozzle 12) is an example of a removing liquid supply unit which supplies a removing liquid such as IPA to the upper surface of the substrate W. The third tube 33 (the central nozzle 12) is an example of a gas supply unit which supplies a gas such as nitrogen gas ($N_2$) between the upper surface of the substrate W and the facing surface 6a of the facing member 6. The central nozzle 12 is also a rinse liquid nozzle, a removing liquid nozzle, and a gas nozzle.

The first tube 31 is connected to an upper rinse liquid pipe 43 which guides the rinse liquid to the first tube 31. When an upper rinse liquid valve 53 interposed in the upper rinse liquid pipe 43 is opened, the rinse liquid is discharged from the first tube 31 (the central nozzle 12) toward the central region of the upper surface of the substrate W in a continuous flow.

Examples of the rinse liquid include DIW, carbonated water, electrolytic ionized water, hydrochloric acid water having a dilution concentration (for example, about 1 ppm to 100 ppm), ammonia water having a dilution concentration (for example, about 1 ppm to 100 ppm), reduced water (hydrogen water), and the like.

The second tube 32 is connected to a removing liquid pipe 44 which guides the removing liquid to the second tube 32. When a removing liquid valve 54 interposed in the removing liquid pipe 44 is opened, the removing liquid is discharged from the second tube 32 (the central nozzle 12) toward the central region of the upper surface of the substrate W in a continuous flow.

The removing liquid discharged from the second tube 32 is a liquid which removes a portion of the processing film which was not separated from the upper surface of the substrate W by the stripping liquid and a portion of the preprocessing film which was not separated from the upper surface of the substrate W by the stripping liquid. The removing liquid is preferably a liquid having a higher volatility than the rinse liquid. The removing liquid discharged from the second tube 32 preferably has compatibility with the rinse liquid.

The removing liquid discharged from the second tube 32 is, for example, an organic solvent. Examples of the organic solvent discharged from the second tube 32 include liquids containing at least one of IPA, hydrofluoroether (HFE), methanol, ethanol, acetone, propylene glycol monoethyl ether (PGEE) and trans-1,2-dichloroethylene.

Further, the organic solvent discharged from the second tube 32 does not have to consist of only a single component and may be a liquid mixed with other components. For example, the organic solvent may be a mixed liquid of IPA and DIW or a mixed liquid of IPA and HFE.

The third tube 33 is connected to a gas pipe 45 which guides a gas to the third tube 33. When a gas valve 55 interposed in the gas pipe 45 is opened, the gas is discharged downward from the third tube 33 (the central nozzle 12) in a continuous flow.

The gas discharged from the third tube 33 is, for example, an inert gas such as nitrogen gas. The gas discharged from the third tube 33 may be air. The inert gas is not limited to the nitrogen gas and is a gas which is inert to the upper surface of the substrate W and the uneven pattern 160 (refer to FIG. 2) formed on the upper surface of the substrate W. Examples of the inert gas include rare gases such as argon in addition to nitrogen gas.

The lower surface nozzle 13 is inserted into a through hole 21a which opens at a center portion of the upper surface of the spin base 21. A discharge port 13a of the lower surface nozzle 13 is exposed from the upper surface of the spin base 21. The discharge port 13a of the lower surface nozzle 13 faces a central region of the lower surface of the substrate W (a surface on the lower side) from below. The central region of the lower surface of the substrate W is a region on the lower surface of the substrate W which includes the rotation center of the substrate W.

One end of a common pipe 80 which commonly guides the rinse liquid, the stripping liquid, and the heat medium to the lower surface nozzle 13 is connected to the lower surface nozzle 13. A lower rinse liquid pipe 81 which guides the rinse liquid to the common pipe 80, a lower stripping liquid pipe 82 which guides the stripping liquid to the common pipe 80, and a heat medium pipe 83 which guides the heat medium to the common pipe 80 are connected to the other end of the common pipe 80.

When a lower rinse liquid valve 86 interposed in the lower rinse liquid pipe 81 is opened, the rinse liquid is discharged from the lower surface nozzle 13 toward the central region of the lower surface of the substrate W in a continuous flow. When a lower stripping liquid valve 87 interposed in the lower stripping liquid pipe 82 is opened, the stripping liquid is discharged from the lower surface nozzle 13 toward the central region of the lower surface of the substrate W in a continuous flow. When a heat medium valve 88 interposed in the heat medium pipe 83 is opened, the heat medium is discharged from the lower surface nozzle 13 toward the central region of the lower surface of the substrate W in a continuous flow.

The lower surface nozzle 13 is an example of a lower rinse liquid supply unit which supplies the rinse liquid to the lower surface of the substrate W. Further, the lower surface nozzle 13 is an example of a lower stripping liquid supply unit which supplies the stripping liquid to the lower surface of the substrate W. Further, the lower surface nozzle 13 is an example of a heat medium supply unit which supplies the heat medium for heating the substrate W to the substrate W. The lower surface nozzle 13 is also a substrate heating unit which heats the substrate W.

The heat medium discharged from the lower surface nozzle 13 is, for example, high-temperature DIW having a temperature higher than room temperature and lower than a boiling point of the solvent contained in the processing liquid. When the solvent contained in the processing liquid is IPA, for example, DIW of 60° C. to 80° C. is used as the heat medium. The heat medium discharged from the lower surface nozzle 13 is not limited to the high temperature DIW and may be a high temperature gas such as a high temperature inert gas or high temperature air having a temperature higher than room temperature and lower than the boiling point of the solvent contained in the processing liquid.

Figure 4:
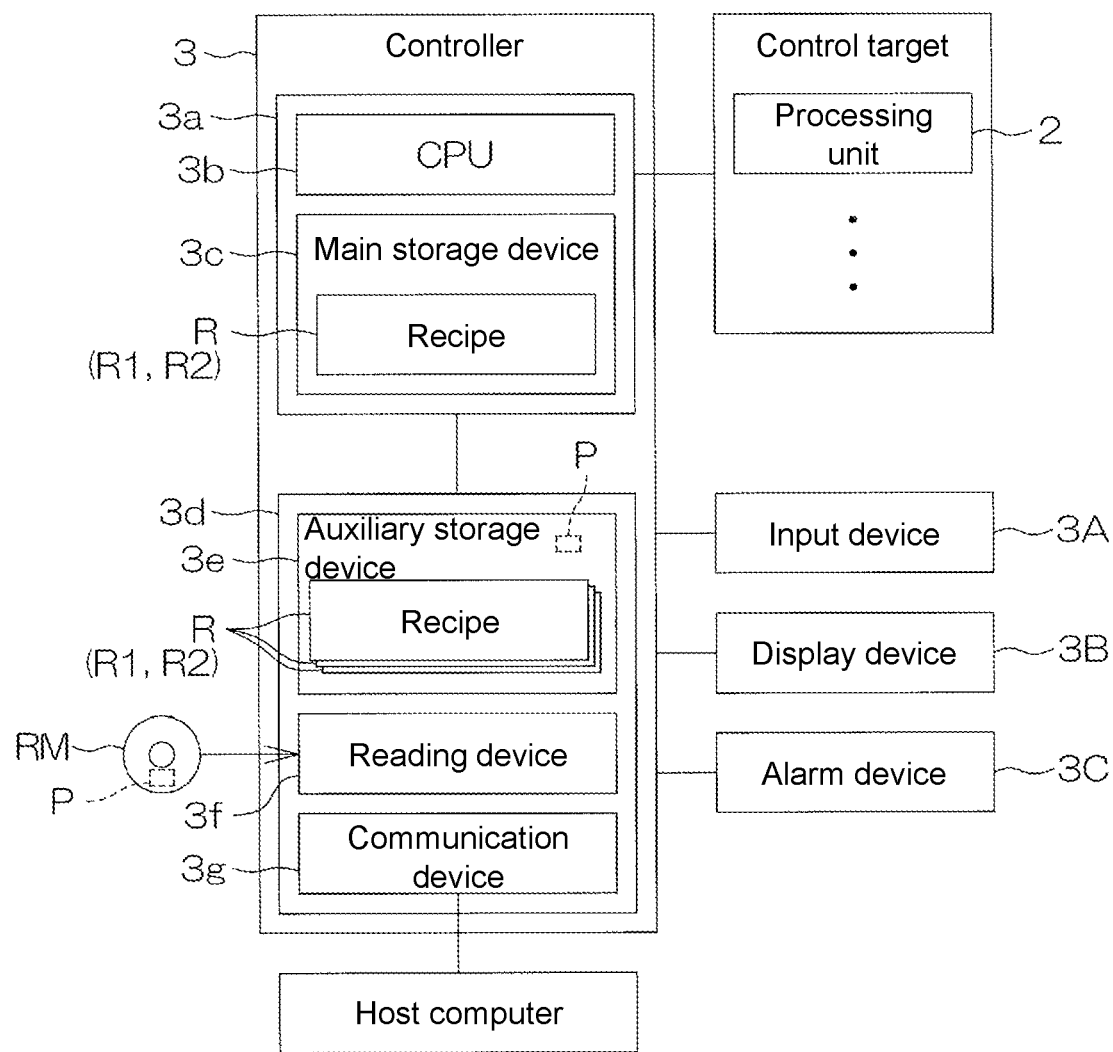
FIG. 4 is a block diagram showing hardware of a controller provided in the substrate processing apparatus.

FIG. 4 is a block diagram showing hardware of the controller 3. The controller 3 is a computer including a computer main body 3a and a peripheral device 3d connected to the computer main body 3a. The computer main body 3a includes a central processing unit (CPU) 3b which executes various instructions and a main storage device 3c which stores information. The peripheral device 3d includes an auxiliary storage device 3e which stores information such as a program P, a reading device 3f which reads information from a removable media RM, and a communication device 3g which communicates with another device such as a host computer.

The controller 3 is connected to an input device 3A, a display device 3B, and an alarm device 3C. The input device 3A is operated when an operator such as a user or a maintenance person inputs information to the substrate processing apparatus 1. The information is displayed on a screen of the display device 3B. The input device 3A may be any one of a keyboard, a pointing device, and a touch panel, or may be a device other than these devices. A touch panel display which also serves as the input device 3A and the display device 3B may be provided in the substrate processing apparatus 1. The alarm device 3C issues an alarm using one or more of light, sound, letters, and graphics. When the input device 3A is a touch panel display, the input device 3A may also serve as the alarm device 3C.

The CPU 3b executes the program P stored in the auxiliary storage device 3e. The program P in the auxiliary storage device 3e may be pre-installed in the controller 3, may be sent from the removable media RM to the auxiliary storage device 3e through the reading device 3f, and may be sent from an external device such as a host computer to the auxiliary storage device 3e through the communication device 3g.

The auxiliary storage device 3e and the removable media RM are non-volatile memories which retain storage even when electric force is not supplied. The auxiliary storage device 3e is, for example, a magnetic storage device such as a hard disc drive. The removable media RM is, for example, an optical disc such as a compact disc or a semiconductor memory such as a memory card. The removable media RM is an example of a computer-readable recording medium on which the program P is recorded. The removable media RM is a non-temporary type recording medium.

The auxiliary storage device 3e stores a plurality of recipes R. the recipe R is information which defines processing contents, processing conditions, and processing procedures of the substrate W. The plurality of recipes R is different from each other in at least one of the processing contents, the processing conditions, and the processing procedures of the substrate W.

The controller 3 controls the substrate processing apparatus 1 so that the substrate W is processed according to the recipe R set in the main storage device 3c. Each of the following steps is performed by the controller 3 controlling the substrate processing apparatus 1. In other words, the controller 3 is programmed to perform each of the following steps.

Figure 5:
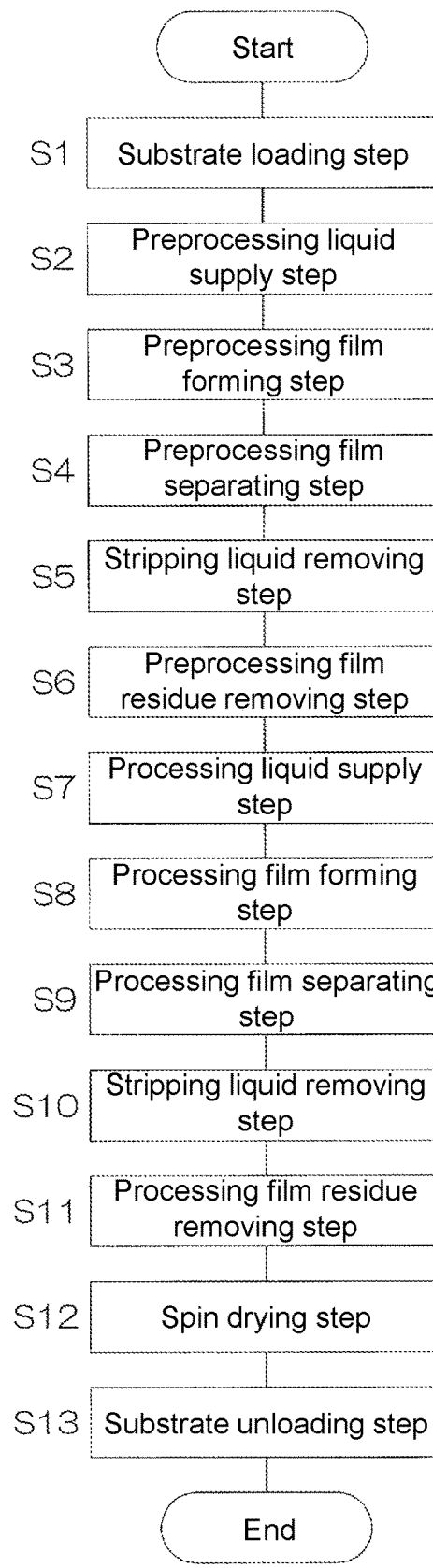
FIG. 5 is a flowchart for explaining an example of substrate processing by the substrate processing apparatus.

FIG. 5 is a flowchart for explaining an example of substrate processing by the substrate processing apparatus 1. FIG. 5 mainly shows the processing realized by the controller 3 executing the program. FIGS. 6A to 6M are schematic views for explaining a status of each of the steps of the substrate processing.

In the substrate processing by the substrate processing apparatus 1, for example, as shown in FIG. 5, a substrate loading step (Step S1), a preprocessing liquid supply step (Step S2), a preprocessing film forming step (Step S3), a preprocessing film separating step (Step S4), a stripping liquid removing step (Step S5), a preprocessing film residue removing step (Step S6), a processing liquid supply step (Step S7), a processing film forming step (step S8), a processing film separating step (Step S9), a stripping liquid removing step (Step S10), a processing film residue removing step (Step S11), a spin drying step (Step S12), and a substrate unloading step (Step S13) are performed in this order.

First, the unprocessed substrate W is loaded into the processing unit 2 from the carrier C by the transfer robots IR and CR (refer to FIG. 1) and sent to the spin chuck 5 (Step S1). Thus, the substrate W is held horizontally by the spin chuck 5 (a substrate holding step). The substrate W is held by the spin chuck 5 so that a pattern surface 165 is the upper surface. When the substrate W is loaded, the facing member 6 is retracted to the upper position.

The holding of the substrate W by the spin chuck 5 is continued until the spin drying step (Step S12) is completed. The guard lifting unit 74 adjusts the height positions of the first guard 71A and the second guard 71B so that at least one guard 71 is located at the upper position from the start of the substrate holding step to the end of the spin drying step (Step S12).

Next, after the transfer robot CR is retracted to the outside of the processing unit 2, the preprocessing liquid supply step (Step S2) starts. In the preprocessing liquid supply step, the spin motor 23 first rotates the spin base 21. Thus, the horizontally held substrate W is rotated (a substrate rotation step).

Figure 6A:
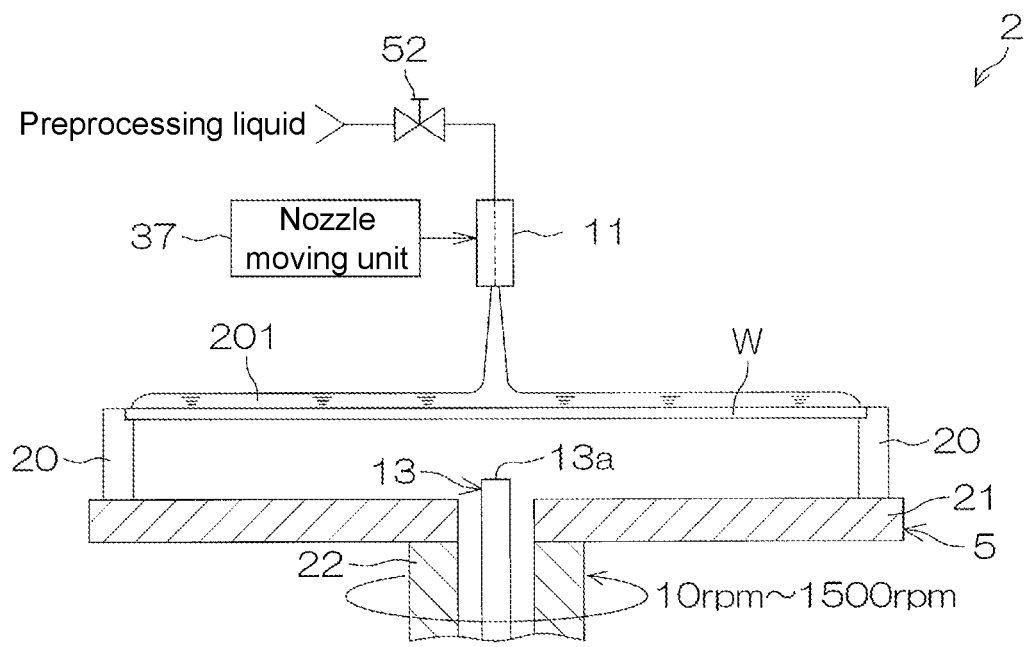
FIG. 6A is a schematic view for explaining a state of a preprocessing liquid supply step (Step S2) in the substrate processing.

The third nozzle moving unit 37 moves the third moving nozzle 11 to a processing position in a state in which the facing member 6 is located at the upper position. The processing position of the third moving nozzle 11 is, for example, a center position. Then, the preprocessing liquid valve 52 is opened. Thus, as shown in FIG. 6A, the preprocessing liquid is supplied (discharged) from the third moving nozzle 11 toward the central region of the upper surface of the rotating substrate W (a preprocessing liquid supply step, a preprocessing liquid discharge step). Accordingly, a liquid film 201 (a preprocessing liquid film) of the preprocessing liquid is formed on the substrate W (a preprocessing liquid film forming step).

The supply of the preprocessing liquid from the third moving nozzle 11 is continued for a predetermined time, for example, 2 to 4 seconds. In the preprocessing liquid supply step, the substrate W is rotated at a predetermined preprocessing liquid rotation speed, for example, 10 rpm to 1500 rpm.

Next, the preprocessing film forming step (Step S3) is performed. In the preprocessing film forming step, the preprocessing liquid on the substrate W is solidified or cured, and a preprocessing film 200 (refer to FIG. 7A described later) which holds the removal target 103 present on the substrate W is formed on the upper surface of the substrate W.

In the preprocessing film forming step, first, a preprocessing liquid thinning step (a preprocessing liquid spin-off step) in which a thickness of the liquid film 201 of the preprocessing liquid on the substrate W is reduced is performing. Specifically, the preprocessing liquid valve 52 is closed. Thus, the supply of the preprocessing liquid to the substrate W is stopped. Then, the third moving nozzle 11 is moved to the home position by the third nozzle moving unit 37.

Figure 6B:
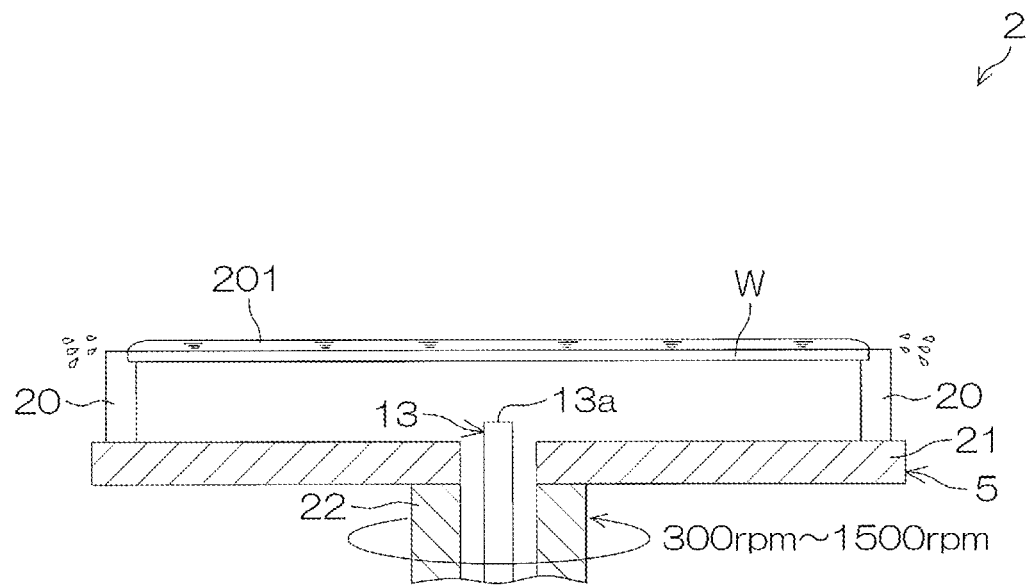
FIG. 6B is a schematic view for explaining a state of a preprocessing film forming step (Step S3) in the substrate processing.

As shown in FIG. 6B, in the preprocessing liquid thinning step, some of the preprocessing liquid is removed from the upper surface of the substrate W by a centrifugal force in a state in which the supply of the preprocessing liquid to the upper surface of the substrate W is stopped so that the thickness of the liquid film 201 on the substrate W becomes an appropriate thickness.

Even after the third moving nozzle 11 moves to the home position, the facing member 6 is maintained at the upper position.

In the preprocessing liquid thinning step, the spin motor 23 changes a rotation speed of the substrate W to a predetermined preprocessing liquid thinning speed. The preprocessing liquid thinning speed is, for example, 300 rpm to 1500 rpm. The rotation speed of the substrate W may be kept constant within a range of 300 rpm to 1500 rpm, or may be appropriately changed within the range of 300 rpm to 1500 rpm during the preprocessing liquid thinning step. The preprocessing liquid thinning step is performed for a predetermined time, for example, 30 seconds.

In the preprocessing film forming step, a preprocessing liquid solvent evaporating step in which some of the solvent is evaporated (volatilized) from the liquid film 201 of the preprocessing liquid is performed after the preprocessing liquid thinning step. In the preprocessing liquid solvent evaporating step, the liquid film 201 on the substrate W is heated to evaporate some of the solvent of the preprocessing liquid on the substrate W.

Figure 6C:
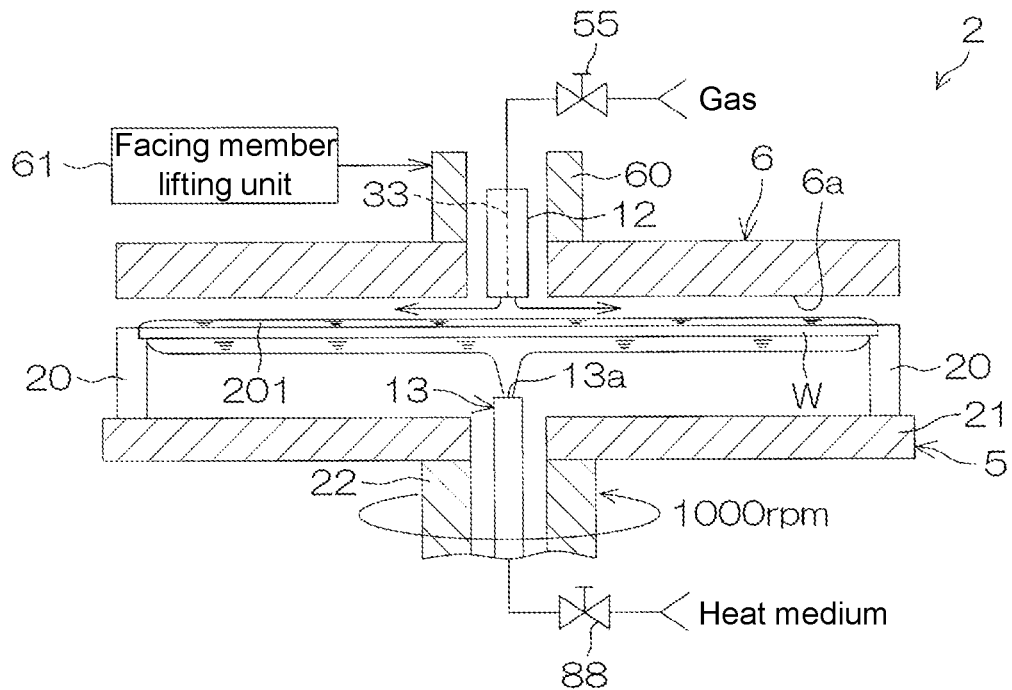
FIG. 6C is a schematic view for explaining the state of the preprocessing film forming step (Step S3).

Specifically, as shown in FIG. 6C, the facing member lifting unit 61 moves the facing member 6 to a proximity position between the upper position and the lower position. The proximity position may be the lower position. The proximity position is a position at which a distance from the upper surface of the substrate W to the facing surface 6a is, for example, 1 mm.

Then, the gas valve 55 is opened. Thus, a gas is supplied to a space between the upper surface of the substrate W (an upper surface of the liquid film 201) and the facing surface 6a of the facing member 6 (a gas supply step).

The evaporation (volatilization) of the solvent in the liquid film 201 is promoted by spraying the gas onto the liquid film 201 on the substrate W (a preprocessing liquid solvent evaporating step, a preprocessing liquid solvent evaporation promoting step). Therefore, a time required for forming the preprocessing film 200 (refer to FIG. 7A) can be shortened. The central nozzle 12 serves as an evaporation unit (an evaporation promoting unit) which evaporates the solvent in the preprocessing liquid.

Also, the heat medium valve 88 is opened. Thus, the heat medium is supplied (discharged) from the lower surface nozzle 13 toward the central region of the lower surface of the rotating substrate W (a heat medium supply step, a heat medium discharge step). The heat medium supplied from the lower surface nozzle 13 to the lower surface of the substrate W receives a centrifugal force, spreads radially, and spreads over the entire lower surface of the substrate W. The supply of the heat medium to the substrate W is continued for a predetermined time, for example, 60 seconds. In the preprocessing liquid solvent evaporating step, the substrate W is rotated at a predetermined evaporation rotation speed, for example, 1000 rpm.

The liquid film 201 on the substrate W is heated via the substrate W by supplying the heat medium to the lower surface of the substrate W. Thus, the evaporation (volatilization) of the solvent in the liquid film 201 is promoted (the preprocessing liquid solvent evaporating step, the preprocessing liquid solvent evaporation promoting step). Therefore, the time required for forming the preprocessing film 200 (refer to FIG. 7A) can be shortened. The lower surface nozzle 13 serves as the evaporation unit (the evaporation promoting unit) which evaporates (volatilizes) the solvent in the preprocessing liquid.

The preprocessing liquid is solidified or cured, and the preprocessing film 200 (refer to FIG. 7A) is formed on the substrate W by performing the preprocessing liquid film thinning step and the preprocessing liquid film solvent evaporating step. In this way, the substrate rotating unit (the spin motor 23), the central nozzle 12, and the lower surface nozzle 13 constitutes a preprocessing film forming unit (a film forming unit) which solidifies or cures the preprocessing liquid and forms the preprocessing film 200 (a solid film).

In the preprocessing liquid solvent evaporating step, the substrate W is preferably heated so that a temperature of the preprocessing liquid on the substrate W is lower than the boiling point of the solvent. The solvent can appropriately remain in the preprocessing film 200 by heating the preprocessing liquid to a temperature lower than the boiling point of the solvent. Therefore, as compared with a case in which the solvent does not remain in the preprocessing film 200, the stripping liquid is more easily compatible with the preprocessing film 200 in the subsequent preprocessing film separating step (Step S4).

Next, the preprocessing film separating step (Step S4) in which the preprocessing film 200 is separated is performed. Specifically, the heat medium valve 88 is closed. Therefore, the supply of the heat medium to the lower surface of the substrate W is stopped. Also, the gas valve 55 is closed. Thus, the supply of the gas to the space between the facing surface 6a of the facing member 6 and the upper surface of the substrate W is stopped.

Then, the facing member lifting unit 61 moves the facing member 6 to the upper position. The second nozzle moving unit 36 moves the second moving nozzle 10 to the processing position in a state in which the facing member 6 is located at the upper position. The processing position of the second moving nozzle 10 is, for example, the center position.

Figure 6D:
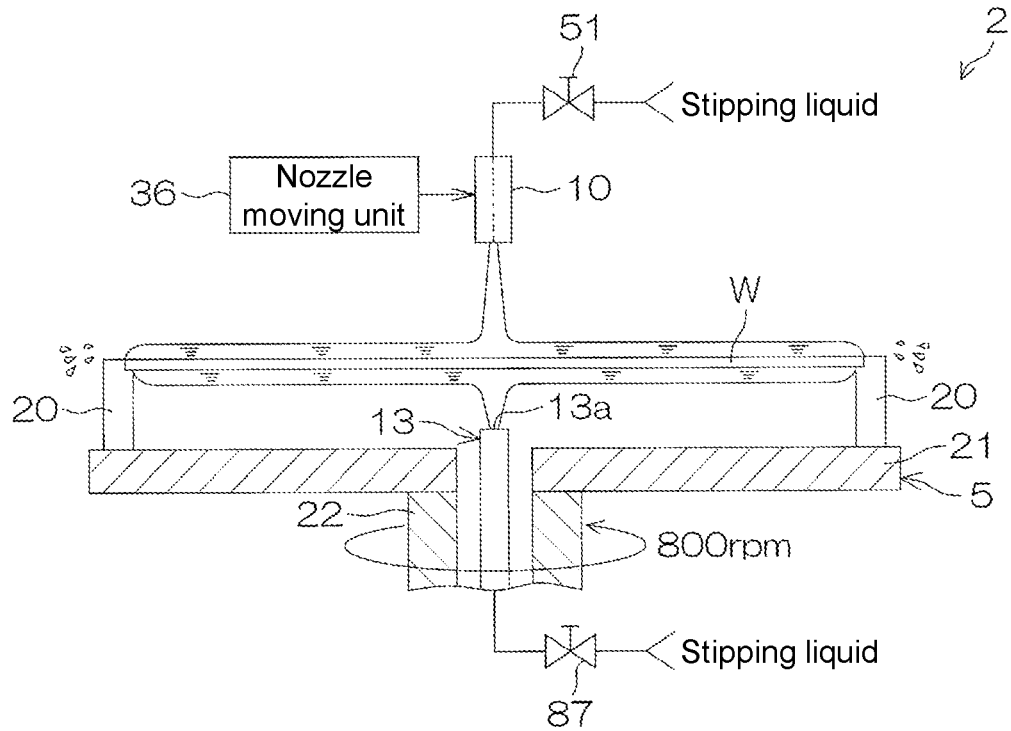
FIG. 6D is a schematic view for explaining a state of a preprocessing film separating step (Step S4) in the substrate processing.

Then, the upper stripping liquid valve 51 is opened in a state in which the second moving nozzle 10 is located at the processing position. Thus, as shown in FIG. 6D, the stripping liquid is supplied (discharged) from the second moving nozzle 10 toward the central region of the upper surface of the rotating substrate W (an upper stripping liquid supply step, an upper stripping liquid discharge step). The stripping liquid supplied to the upper surface of the substrate W spreads over the entire upper surface of the substrate W due to a centrifugal force. Thus, the preprocessing film (refer to FIG. 7A) on the upper surface of the substrate W is separated and discharged to the outside of the substrate W together with the stripping liquid. In the preprocessing film separating step, the substrate W is rotated at a predetermined preprocessing film separating rotation speed, for example, 800 rpm.

At the same time when the upper stripping liquid valve 51 is opened, the lower stripping liquid valve 87 is opened. Thus, the stripping liquid is supplied (discharged) from the lower surface nozzle 13 toward the central region of the lower surface of the rotating substrate W (a lower stripping liquid supply step, a lower stripping liquid discharge step). The stripping liquid supplied to the lower surface of the substrate W spreads over the entire lower surface of the substrate W due to a centrifugal force.

Here, the preprocessing liquid supplied to the upper surface of the substrate W in the preprocessing liquid supply step (Step S2) shown in FIG. 6A may intrude to the lower surface of the substrate W along a peripheral edge of the substrate W. Further, the preprocessing liquid scattered from the substrate W may bounce off the guard 71 and may adhere to the lower surface of the substrate W. Also in such a case, as shown in FIG. 6C, since the heat medium is supplied to the lower surface of the substrate W in the preprocessing film forming step, the preprocessing liquid can be excluded from the lower surface of the substrate W due to a flow of the heat medium.

Further, the preprocessing liquid adhering to the lower surface of the substrate W due to the preprocessing liquid supply step (Step S2) may solidify or cure to form a solid. As shown in FIG. 6D, while the stripping liquid is supplied to the upper surface of the substrate W in the preprocessing film separating step (Step S4), the stripping liquid is supplied (discharged) from the lower surface nozzle 13 to the lower surface of the substrate W. Therefore, even when a solid of the preprocessing liquid is formed on the lower surface of the substrate W, the solid can be separated and removed from the lower surface of the substrate W.

Figure 6E:
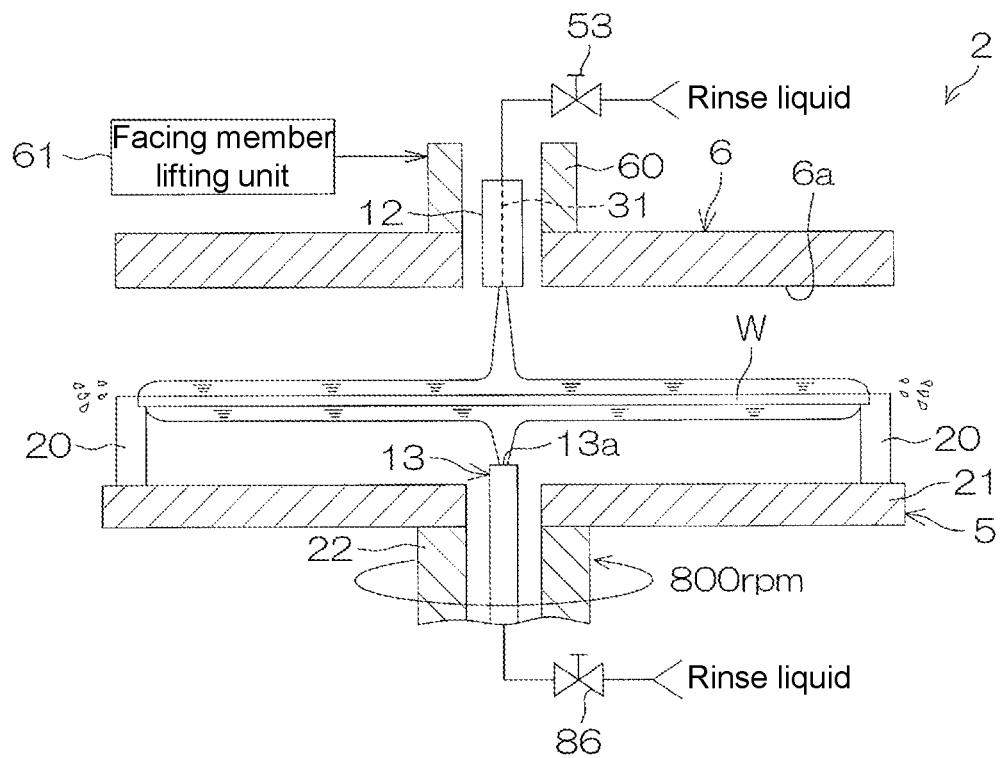
FIG. 6E is a schematic view for explaining a state of a stripping liquid removing step (Step S5) in the substrate processing.

After the preprocessing film separating step (Step S4), the stripping liquid removing step (Step S5) in which the stripping liquid is removed (rinsed) from the substrate W is performed by supplying the rinse liquid. Specifically, the upper stripping liquid valve 51 and the lower stripping liquid valve 87 are closed. Thus, the supply of the stripping liquid to the upper surface and the lower surface of the substrate W is stopped. Then, the second nozzle moving unit 36 moves the second moving nozzle 10 to the home position. Then, as shown in FIG. 6E, the facing member lifting unit 61 moves the facing member 6 to the processing position.

Then, the upper rinse liquid valve 53 is opened in a state which the facing member 6 is located at the processing position. Thus, the rinse liquid is supplied (discharged) from the central nozzle 12 toward the central region of the upper surface of the rotating substrate W (an upper rinse liquid supply step, an upper rinse liquid discharge step).

In the stripping liquid removing step, the substrate W is rotated at a predetermined stripping liquid removing rotation speed, for example, 800 rpm. The processing position is a position away upward from the upper surface of the substrate W further than the proximity position. When the facing member 6 is located at the processing position, a distance between the upper surface of the substrate W and the facing surface 6a is, for example, 30 mm.

The rinse liquid supplied to the upper surface of the substrate W spreads over the entire upper surface of the substrate W due to a centrifugal force. Thus, the stripping liquid adhering to the upper surface of the substrate W is washed away with the rinse liquid (a rinsing step).

Further, at the same time when the upper rinse liquid valve 53 is opened, the lower rinse liquid valve 86 is opened. Thus, the rinse liquid is supplied (discharged) from the lower surface nozzle 13 toward the central region of the lower surface of the rotating substrate W (a lower rinse liquid supply step, a lower rinse liquid discharge step). Thus, the stripping liquid adhering to the lower surface of the substrate W is washed away with the rinse liquid. The supply of the rinse liquid to the upper surface and the lower surface of the substrate W is continued for a predetermined time, for example, 35 seconds.

After the stripping liquid removing step (Step S5), the preprocessing film residue removing step (Step S6) in which the residue of the preprocessing film 200 present on the upper surface of the substrate W is removed with the removing liquid is performed.

Figure 6F:
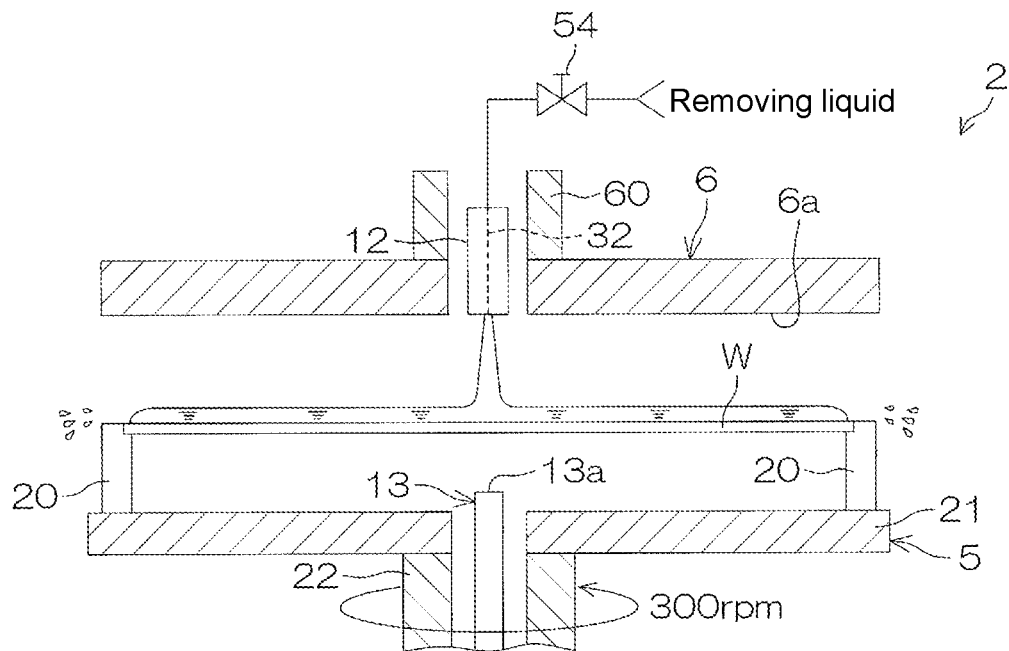
FIG. 6F is a schematic view for explaining a state of a preprocessing film residue removing step (Step S6) in the substrate processing.

Specifically, the upper rinse liquid valve 53 and the lower rinse liquid valve 86 are closed. Thus, the supply of the rinse liquid to the upper surface and the lower surface of the substrate W is stopped. Then, the removing liquid valve 54 is opened in a state in which the facing member 6 is maintained at the processing position. Thus, as shown in FIG. 6F, the removing liquid is supplied (discharged) from the central nozzle 12 toward the central region of the upper surface of the rotating substrate W (a removing liquid supply step, a removing liquid discharge step). The supply of the removing liquid to the upper surface of the substrate W is continued for a predetermined time, for example, 30 seconds. In the preprocessing film residue removing step, the substrate W is rotated at a predetermined preprocessing film residue removing rotation speed, for example, 300 rpm.

The removing liquid supplied to the upper surface of the substrate W receives a centrifugal force, spreads radially, and spreads over the entire upper surface of the substrate W. Thus, the rinse liquid on the upper surface of the substrate W is replaced with the removing liquid. The removing liquid supplied to the upper surface of the substrate W dissolves the residue of the preprocessing film (refer to FIG. 7A) remaining on the upper surface of the substrate W and is then discharged from the peripheral edge of the upper surface of the substrate W.

Figure 6G:
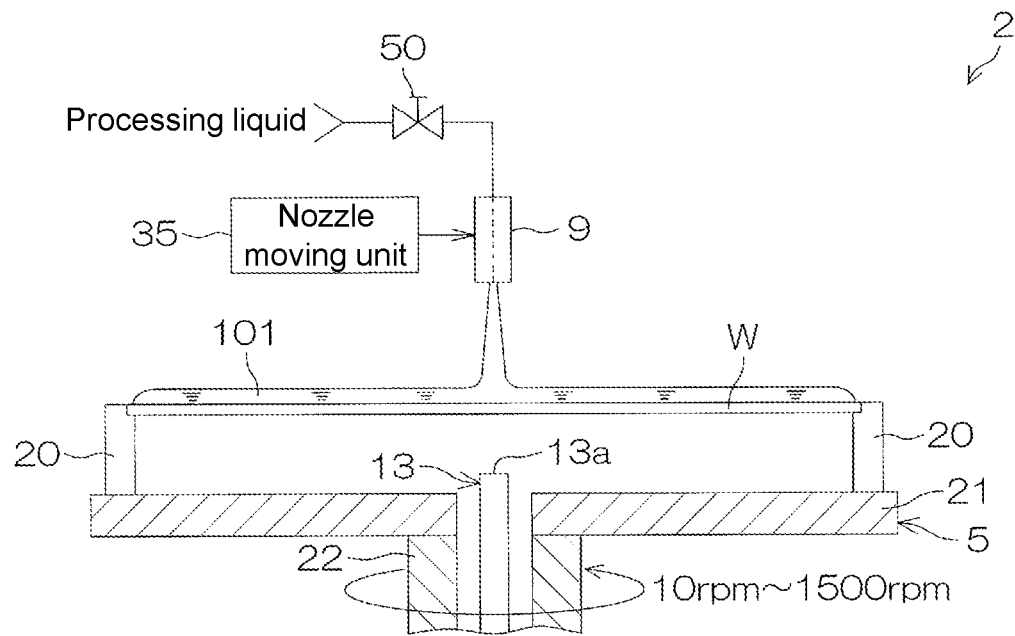
FIG. 6G is a schematic view for explaining a state of a processing liquid supply step (Step S7) in the substrate processing.

Next, the processing liquid supply step (Step S7) in which the processing liquid is supplied to the upper surface of the substrate W is performed. Specifically, the first nozzle moving unit 35 moves the first moving nozzle 9 to the processing position in a state in which the facing member 6 is located at the upper position. The processing position of the first moving nozzle 9 is, for example, the center position. Then, the processing liquid valve 50 is opened. Thus, as shown in FIG. 6G, the processing liquid is supplied (discharged) from the first moving nozzle 9 toward the central region of the upper surface of the rotating substrate W (a processing liquid supply step, a processing liquid discharge step). Thus, a liquid film 101 (a processing liquid film) of the processing liquid is formed on the substrate W (a processing liquid film forming step).

The supply of the processing liquid from the first moving nozzle 9 is continued for a predetermined time, for example, 2 to 4 seconds. In the processing liquid supply step, the substrate W is rotated at a predetermined processing liquid rotation speed, for example, 10 rpm to 1500 rpm.

Next, the processing film forming step (Step S8) is performed. In the processing film forming step, the processing liquid on the substrate W is solidified or cured, and a processing film 100 (refer to FIG. 7C described later) which holds the removal target 103 present on the substrate W is formed on the upper surface of the substrate W.

In the processing film forming step, first, a processing liquid thinning step (a processing liquid spin-off step) in which a thickness of the liquid film 101 of the processing liquid on the substrate W is thinned is performed. Specifically, the processing liquid valve 50 is closed. Thus, the supply of the processing liquid to the substrate W is stopped. Then, the first moving nozzle 9 is moved to the home position by the first nozzle moving unit 35.

Figure 6H:
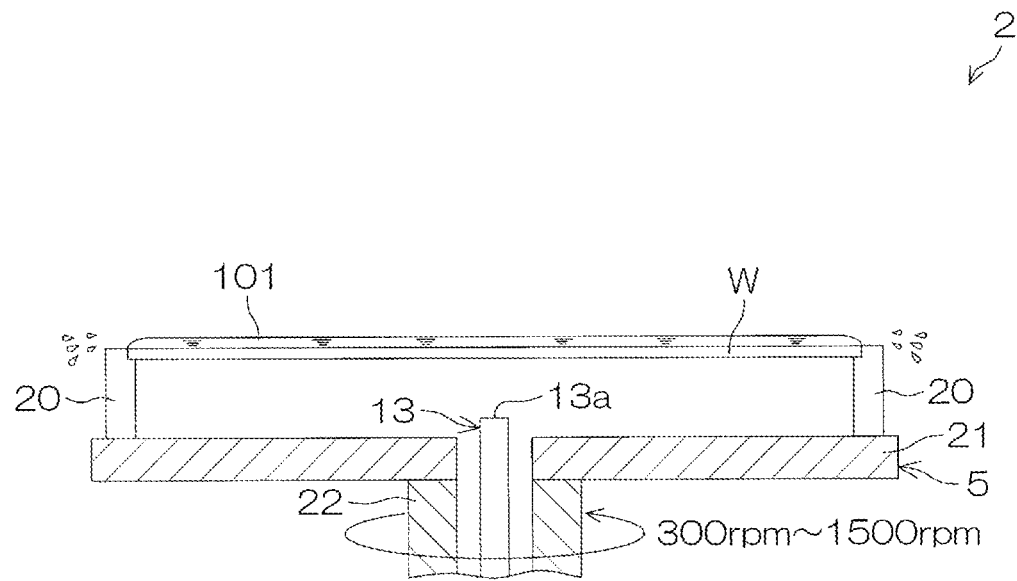
FIG. 6H is a schematic view for explaining a state of a processing film forming step (Step S8) in the substrate processing.

As shown in FIG. 6H, in the processing liquid thinning step, some of the processing liquid is excluded from the upper surface of the substrate W by a centrifugal force in a state in which the supply of the processing liquid to the upper surface of the substrate W is stopped so that the thickness of the liquid film 101 on the substrate W becomes an appropriate thickness. Even after the first moving nozzle 9 moves to the home position, the facing member 6 is maintained in the upper position.

In the processing liquid thinning step, the spin motor 23 changes the rotation speed of the substrate W to a predetermined processing liquid thinning speed. The processing liquid thinning speed is, for example, 300 rpm to 1500 rpm. The rotation speed of the substrate W may be kept constant within a range of 300 rpm to 1500 rpm, or may be appropriately changed within the range of 300 rpm to 1500 rpm during the processing liquid thinning step. The processing liquid thinning step is performed for a predetermined time, for example, 30 seconds.

In the processing film forming step, a processing liquid solvent evaporating step in which some of the solvent is evaporated (volatilized) from the liquid film 101 of the processing liquid is performed after the processing liquid thinning step. In the processing liquid solvent evaporating step, the liquid film 101 on the substrate W is heated to evaporate some of the solvent of the processing liquid on the substrate W.

Figure 6I:
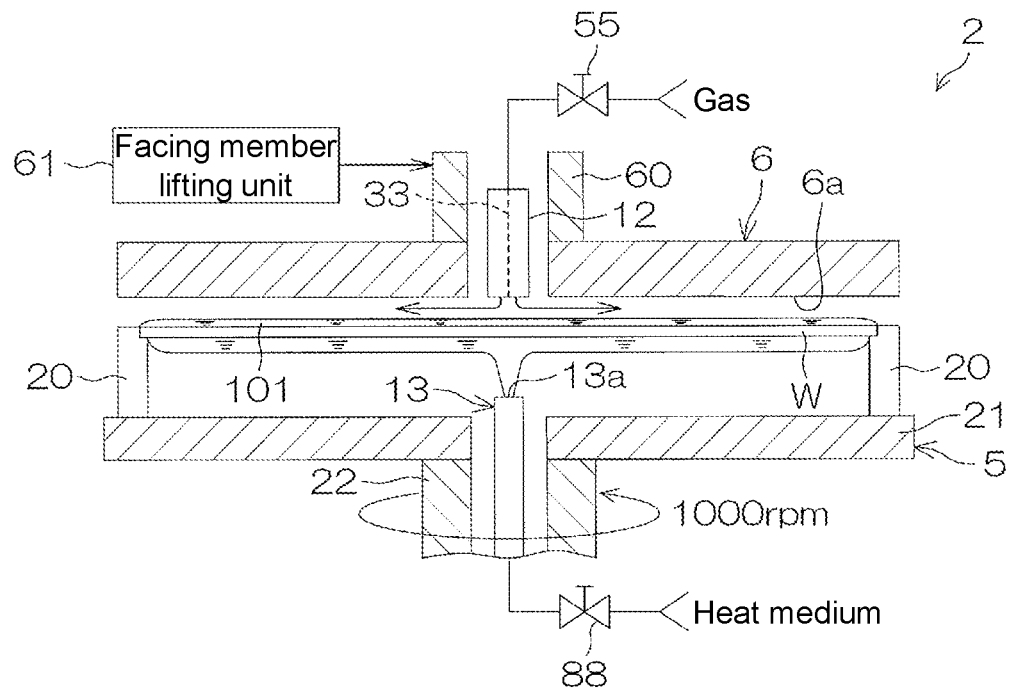
FIG. 6I is a schematic view for explaining the state of the processing film forming step (Step S8).

Specifically, as shown in FIG. 6I, the facing member lifting unit 61 moves the facing member 6 to the proximity position.

Then, the gas valve 55 is opened. Thus, gas is supplied to the space between the upper surface of the substrate W (the upper surface of the liquid film 101) and the facing surface 6a of the facing member 6 (a gas supply step).

The evaporation (volatilization) of the solvent in the liquid film 101 is promoted by spraying the gas onto the liquid film 101 on the substrate W (a processing liquid solvent evaporating step, a processing liquid solvent evaporation promoting step). Therefore, a time required for forming the processing film 100 (refer to FIG. 7C) can be shortened. Also in the processing film forming step, the central nozzle 12 serves as the evaporation unit (the evaporation promoting unit) which evaporates the solvent in the processing liquid.

Also, the heat medium valve 88 is opened. Thus, the heat medium is supplied (discharged) from the lower surface nozzle 13 toward the central region of the lower surface of the rotating substrate W (a heat medium supply step, a heat medium discharge step). The heat medium supplied from the lower surface nozzle 13 to the lower surface of the substrate W receives a centrifugal force, spreads radially, and spreads over the entire lower surface of the substrate W. The supply of the heat medium to the substrate W is continued for a predetermined time, for example, 60 seconds. In the processing liquid solvent evaporating step, the substrate W is rotated at a predetermined evaporation rotation speed, for example, 1000 rpm.

The liquid film 101 on the substrate W is heated via the substrate W by supplying the heat medium to the lower surface of the substrate W. Thus, the evaporation (volatilization) of the solvent in the liquid film 101 is promoted (a processing liquid solvent evaporating step, a processing liquid solvent evaporation promoting step). Therefore, a time required for forming the processing film 100 (refer to FIG. 7C) can be shortened. Also in the processing film forming step, the lower surface nozzle 13 serves as the evaporation unit (the evaporation promoting unit) which evaporates (volatilizes) the solvent in the processing liquid.

The processing liquid is solidified or cured by performing the processing liquid thinning step and the processing liquid solvent evaporating step. Thus, the processing film 100 which holds the removal target 103 is formed on the entire upper surface of the substrate W. In this way, the substrate rotating unit (the spin motor 23), the central nozzle 12, and the lower surface nozzle 13 constitutes a processing film forming unit (a film forming unit) which solidifies or cures the processing liquid and forms the processing film 100 (a solid film).

In the processing liquid solvent evaporating step, the substrate W is preferably heated so that a temperature of the processing liquid on the substrate W is lower than the boiling point of the solvent. The solvent can appropriately remain in the processing film 100 by heating the processing liquid to a temperature lower than the boiling point of the solvent. Thus, as compared with a case in which the solvent does not remain in the processing film 100, the stripping liquid can be easily compatible with the processing film 100 in the subsequent processing film separating step (Step S9).

Next, the processing film separating step (Step S9) in which the processing film 100 is separated with the stripping liquid is performed. Specifically, the heat medium valve 88 is closed. Thus, the supply of the heat medium to the lower surface of the substrate W is stopped. Also, the gas valve 55 is closed. Thus, the supply of the gas to the space between the facing surface 6a of the facing member 6 and the upper surface of the substrate W is stopped.

Then, the facing member lifting unit 61 moves the facing member 6 to the upper position. The second nozzle moving unit 36 moves the second moving nozzle 10 to the processing position in a state in which the facing member 6 is located at the upper position.

Figure 6J:
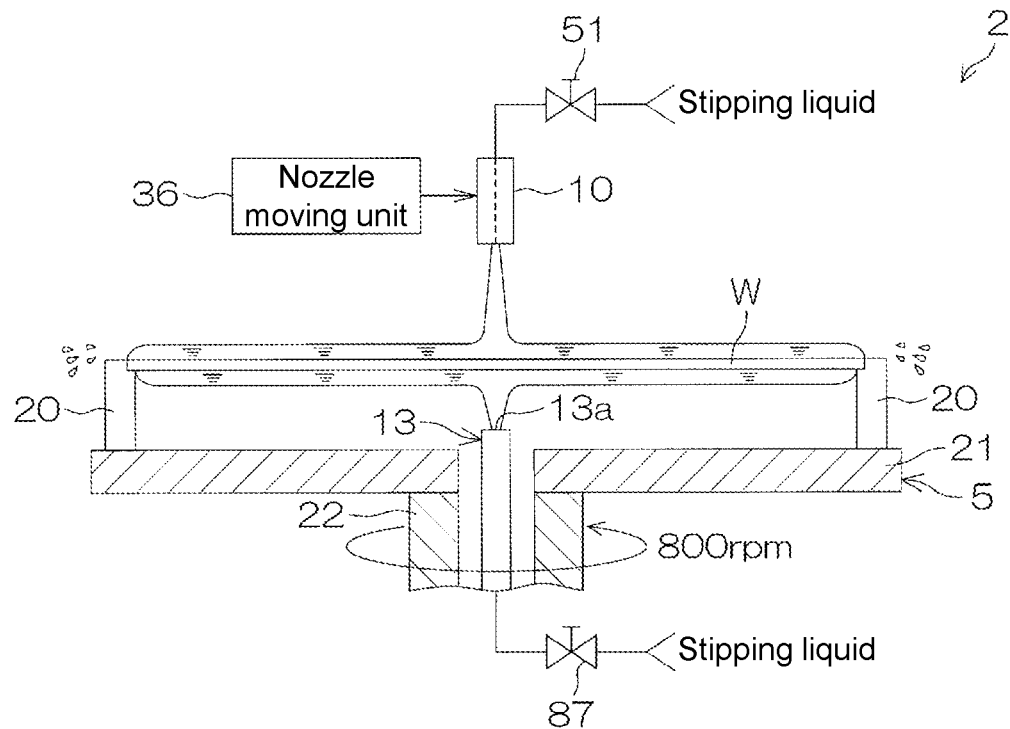
FIG. 6J is a schematic view for explaining a state of a processing film separating step (Step S9) in the substrate processing.

Then, the upper stripping liquid valve 51 is opened in a state in which the second moving nozzle 10 is located at the processing position. Thus, as shown in FIG. 6J, the stripping liquid is supplied (discharged) from the second moving nozzle 10 toward the central region of the upper surface of the rotating substrate W (an upper stripping liquid supply step, an upper stripping liquid discharge step). The stripping liquid supplied to the upper surface of the substrate W spreads over the entire upper surface of the substrate W due to a centrifugal force. Thus, the preprocessing film on the upper surface of the substrate W is separated and discharged to the outside of the substrate W together with the stripping liquid. In the processing film separating step, the substrate W is rotated at a predetermined processing film separating rotation speed, for example, 800 rpm.

At the same time when the upper stripping liquid valve 51 is opened, the lower stripping liquid valve 87 is opened. Thus, the stripping liquid is supplied (discharged) from the lower surface nozzle 13 toward the central region of the lower surface of the rotating substrate W (a lower stripping liquid supply step, a lower stripping liquid discharge step). The stripping liquid supplied to the lower surface of the substrate W spreads over the entire lower surface of the substrate W due to a centrifugal force.

Here, due to the same reason as the preprocessing liquid supply step shown in FIG. 6A, the processing liquid may adhere to the lower surface of the substrate W in the processing liquid supply step (Step S7) shown in FIG. 6G. Also in such a case, as shown in FIG. 6I, the processing liquid can be excluded from the lower surface of the substrate W by a flow of the heat medium supplied to the lower surface of the substrate W.

Further, similarly to the preprocessing liquid, the processing liquid adhering to the lower surface of the substrate W due to the processing liquid supply step (Step S7) may form a solid. Also in such a case, as shown in FIG. 6J, since the stripping liquid is supplied (discharged) to the lower surface of the substrate W, the solid can be separated and removed from the lower surface of the substrate W.

Figure 6K:
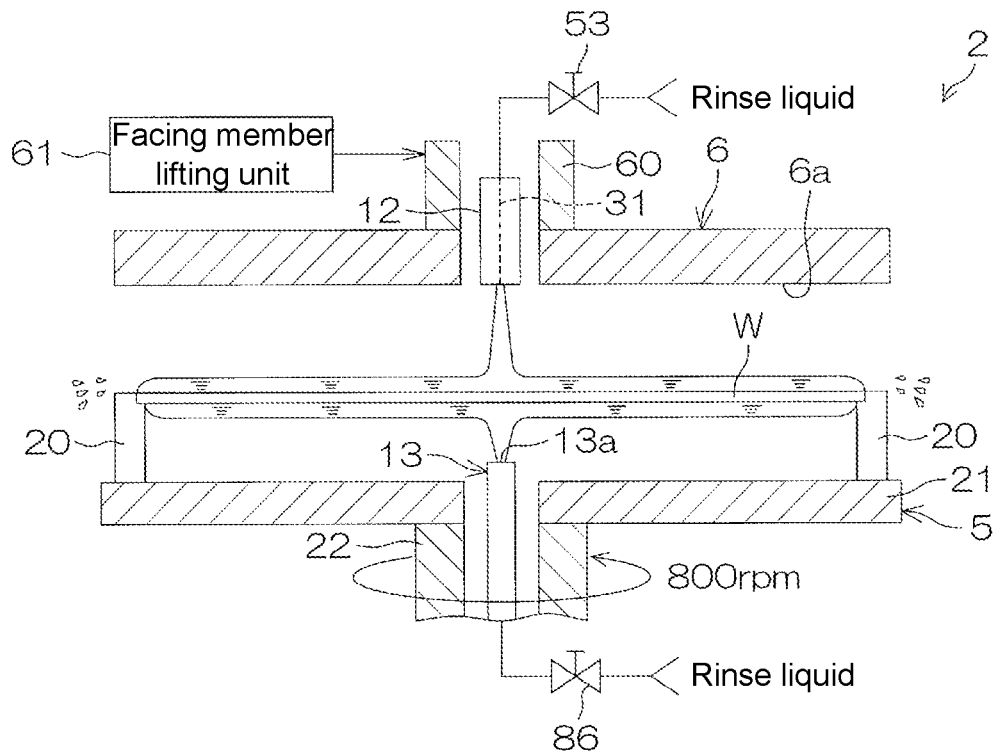
FIG. 6K is a schematic view for explaining a status of a stripping liquid removing step (Step S10) in the substrate processing.

Then, after the processing film separating step (Step S9), the stripping liquid removing step (Step S10) in which the stripping liquid is removed (rinsed) from the substrate W is performed by supplying the rinse liquid. Specifically, the upper stripping liquid valve 51 and the lower stripping liquid valve 87 are closed. Thus, the supply of the stripping liquid to the upper surface and the lower surface of the substrate W is stopped. Then, the second nozzle moving unit 36 moves the second moving nozzle 10 to the home position. Then, as shown in FIG. 6K, the facing member lifting unit 61 moves the facing member 6 to the processing position.

Then, the upper rinse liquid valve 53 is opened in a state in which the facing member 6 is located at the processing position. Thus, the rinse liquid is supplied (discharged) from the central nozzle 12 toward the central region of the upper surface of the rotating substrate W (an upper rinse liquid supply step, an upper rinse liquid discharge step).

In the stripping liquid removing step, the substrate W is rotated at a predetermined stripping liquid removing rotation speed, for example, 800 rpm. The processing position is a position away upward from the upper surface of the substrate W further than the proximity position. The rinse liquid supplied to the upper surface of the substrate W spreads over the entire upper surface of the substrate W due to a centrifugal force. Thus, the stripping liquid adhering to the upper surface of the substrate W is washed away with the rinse liquid (a rinsing step).

Further, at the same time when the upper rinse liquid valve 53 is opened, the lower rinse liquid valve 86 is opened. Thus, the rinse liquid is supplied (discharged) from the lower surface nozzle 13 toward the central region of the lower surface of the rotating substrate W (a lower rinse liquid supply step, a lower rinse liquid discharge step). Thus, the stripping liquid adhering to the lower surface of the substrate W is washed away with the rinse liquid. The supply of the rinse liquid to the upper surface and the lower surface of the substrate W is continued for a predetermined time, for example, 35 seconds.

Next, after the stripping liquid removing step (Step S10), the processing film residue removing step (Step S11) in which the residue of the processing film 100 present on the upper surface of the substrate W is removed with the removing liquid is performed. Specifically, the upper rinse liquid valve 53 and the lower rinse liquid valve 86 are closed. Thus, the supply of the rinse liquid to the upper surface and the lower surface of the substrate W is stopped.

Figure 6L:
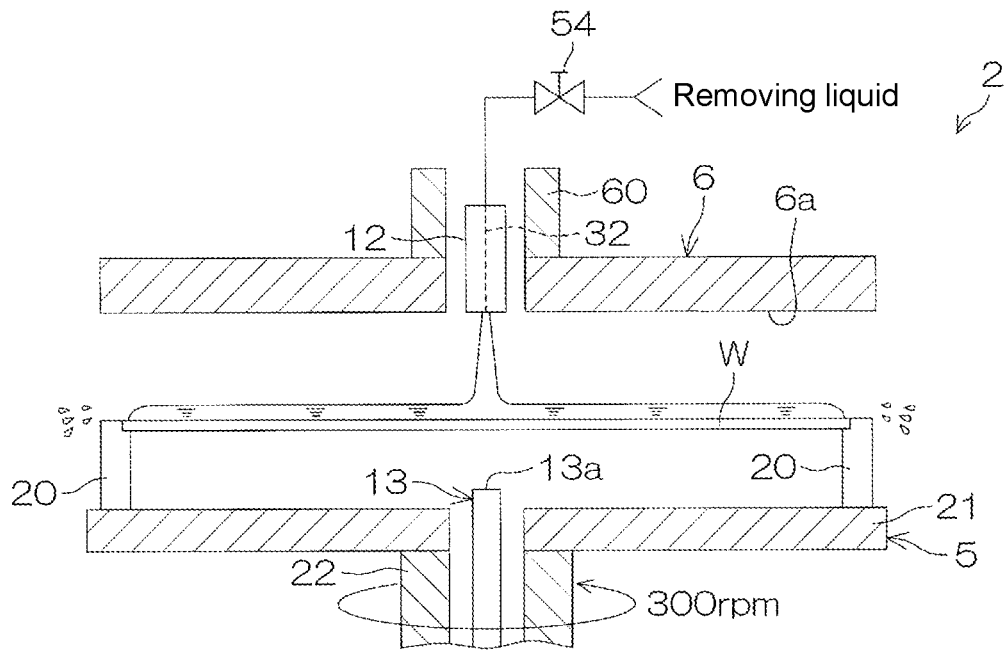
FIG. 6L is a schematic view for explaining a status of a processing film residue removing step (Step S11) in the substrate processing.

Then, the removing liquid valve 54 is opened in a state in which the facing member 6 is located at the processing position. Thus, as shown in FIG. 6L, the removing liquid is supplied (discharged) from the central nozzle 12 toward the central region of the upper surface of the rotating substrate W (a removing liquid supply step, a removing liquid discharge step). The supply of the removing liquid to the upper surface of the substrate W is continued for a predetermined time, for example, 30 seconds. In the processing film residue removing step, the substrate W is rotated at a predetermined processing film residue removing rotation speed, for example, 300 rpm.

The removing liquid supplied to the upper surface of the substrate W receives a centrifugal force, spreads radially, and spreads over the entire upper surface of the substrate W. Thus, the rinse liquid on the upper surface of the substrate W is replaced with the removing liquid. The removing liquid supplied to the upper surface of the substrate W dissolves the residue of the processing film 100 remaining on the upper surface of the substrate W and is then discharged from the peripheral edge of the upper surface of the substrate W.

Figure 6M:
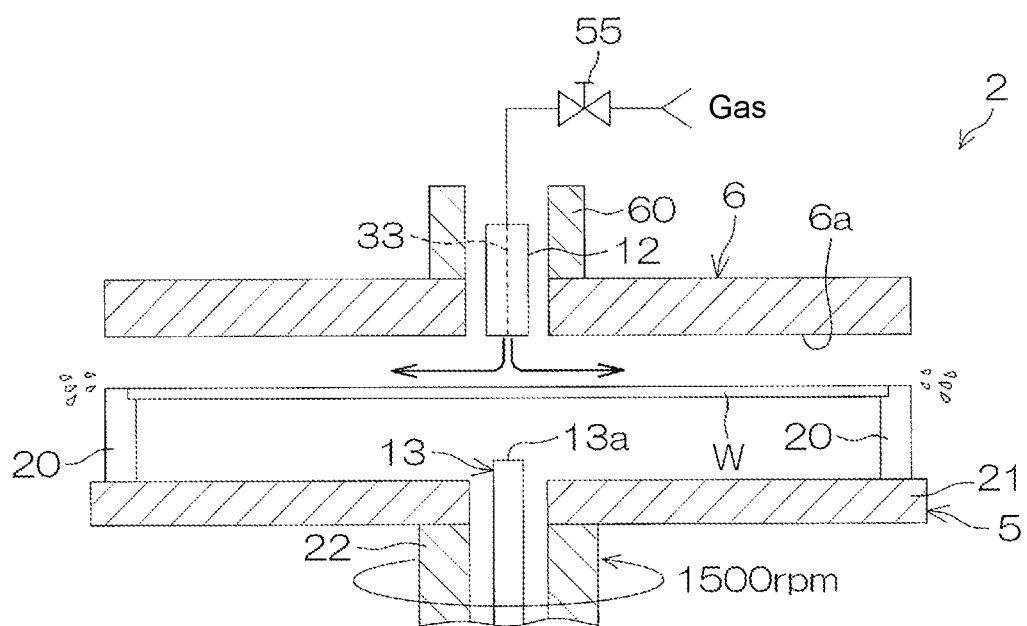
FIG. 6M is a schematic view for explaining a status of a spin drying step (Step S12) in the substrate processing.

Next, the spin drying step (Step S12) in which the substrate W is rotated at high speed to dry the upper surface of the substrate W is performed. Specifically, the removing liquid valve 54 is closed. Thus, the supply of the removing liquid to the upper surface of the substrate W is stopped. Then, as shown in FIG. 6M, the facing member lifting unit 61 moves the facing member 6 to a drying position below the processing position. When the facing member 6 is located at the dry position, the distance between the facing surface 6a of the facing member 6 and the upper surface of the substrate W is, for example, 1.5 mm. Then, the gas valve 55 is opened. Thus, a gas is supplied to the space between the upper surface of the substrate W and the facing surface 6a of the facing member 6.

Then, the spin motor 23 accelerates the rotation of the substrate W to rotate the substrate W at a high speed. The substrate W in the spin drying step is rotated at a drying speed, for example, 1500 rpm. The spin drying step is performed for a predetermined time, for example 30 seconds. Thus, a large centrifugal force acts on the removing liquid on the substrate W, and the removing liquid on the substrate W is shaken off around the substrate W. In the spin drying step, evaporation of the removing liquid is promoted by supplying a gas to the space between the upper surface of the substrate W and the facing surface 6a of the facing member 6.

Then, the spin motor 23 stops the rotation of the substrate W. The guard lifting unit 74 moves the first guard 71A and the second guard 71B to the lower position. The gas valve 55 is closed. Then, the facing member lifting unit 61 moves the facing member 6 to the upper position.

The transfer robot CR enters the processing unit 2, scoops the processed substrate W from the chuck pin 20 of the spin chuck 5, and unloads it out of the processing unit 2 (Step S13). The substrate W is passed from the transfer robot CR to the transfer robot IR and is accommodated in the carrier C by the transfer robot IR.

In this spin drying step of the substrate processing, the upper surface of the substrate W is not dried by shaking off the rinse liquid such as DIW on the substrate W, and the upper surface of the substrate W is dried by shaking off the removing liquid on the substrate W after the rinse liquid on the substrate W is replaced with a removing liquid such as IPA. That is, since the spin drying step is performed after the rinse liquid is replaced by IPA having a lower surface tension than DIW, the surface tension acting on the uneven pattern 160 (refer to FIG. 2) on the upper surface of the substrate W can be reduced when the upper surface of the substrate W is dried.

Next, a status near the upper surface of the substrate W during the substrate processing will be described. FIGS. 7A to 7E are schematic views for explaining the status near the upper surface of the substrate W during the substrate processing.

Figure 7A:
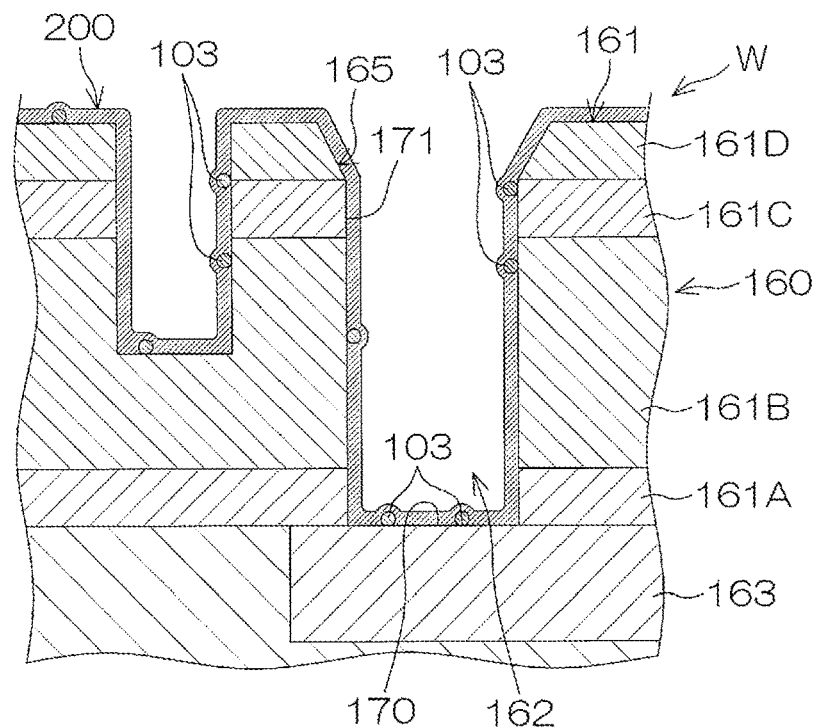
FIG. 7A is a schematic view for explaining a status near a surface of the substrate in a state in which the preprocessing film is formed by performing the preprocessing film forming step (Step S3).

FIG. 7A is a schematic view for explaining a status near the upper surface of the substrate W in a state in which the preprocessing film 200 is formed by performing the preprocessing film forming step (Step S3). As shown in FIG. 7A, the preprocessing film 200 holds the removal target 103.

Figure 7B:
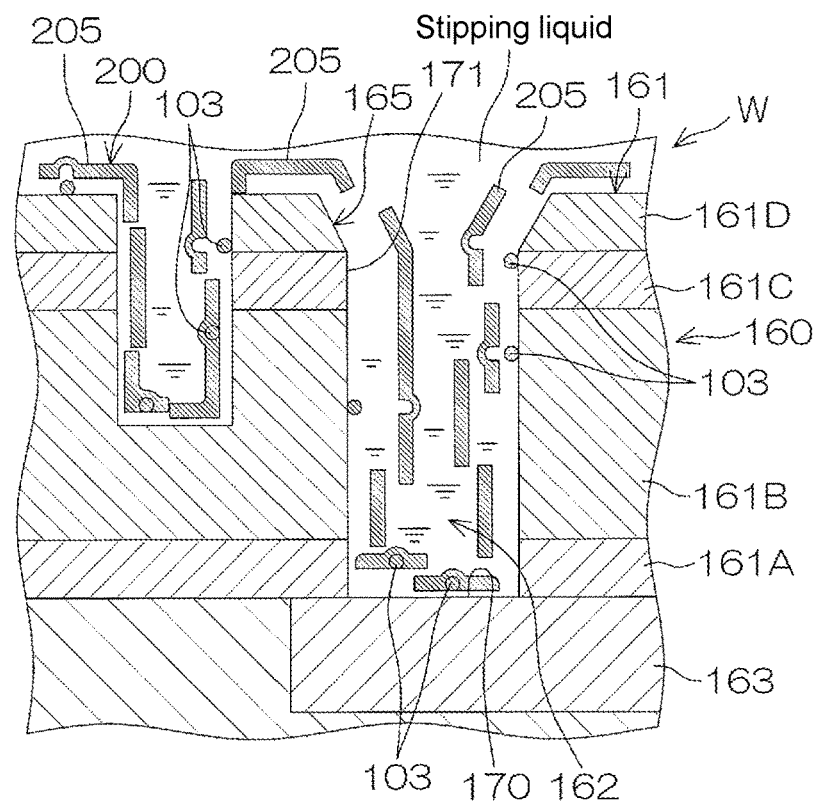
FIG. 7B is a schematic view for explaining a status near the surface of the substrate during the performance of the preprocessing film separating step (Step S4).

When the stripping liquid is supplied to the upper surface of the substrate W on which the preprocessing film 200 is formed, as shown in FIG. 7B, the preprocessing film 200 is separated from the upper surface of the substrate W together with the removal target 103 by a separating action of the stripping liquid. When the preprocessing film 200 is separated from the upper surface of the substrate W, the preprocessing film 200 splits into film pieces 205.

Then, after the separating of the preprocessing film 200, the supply of the stripping liquid to the upper surface of the substrate W is continued, and thus the split film pieces 205 of the preprocessing film 200 are excluded to the outside of the substrate W together with the stripping liquid. Thus, the film pieces 205 of the preprocessing film 200 in a state in which they hold the removal target 103 are removed from the upper surface of the substrate W.

As described above, the preprocessing film 200 has a relatively high removal capacity for removing the removal target 103 present in the exposed region 170 (compared to that of the processing film 100). Therefore, as shown in FIG. 7B, most of the removal target 103 can be removed from the exposed region 170 by the preprocessing film separating step (Step S4). On the other hand, the preprocessing film 200 has a relatively low removal capacity for removing the removal target 103 present in the non-exposed region 171 (compared to that of the processing film 100). Therefore, the removal target 103 which could not be removed by the preprocessing film 200 may remain in the non-exposed region 171.

Figure 7C:
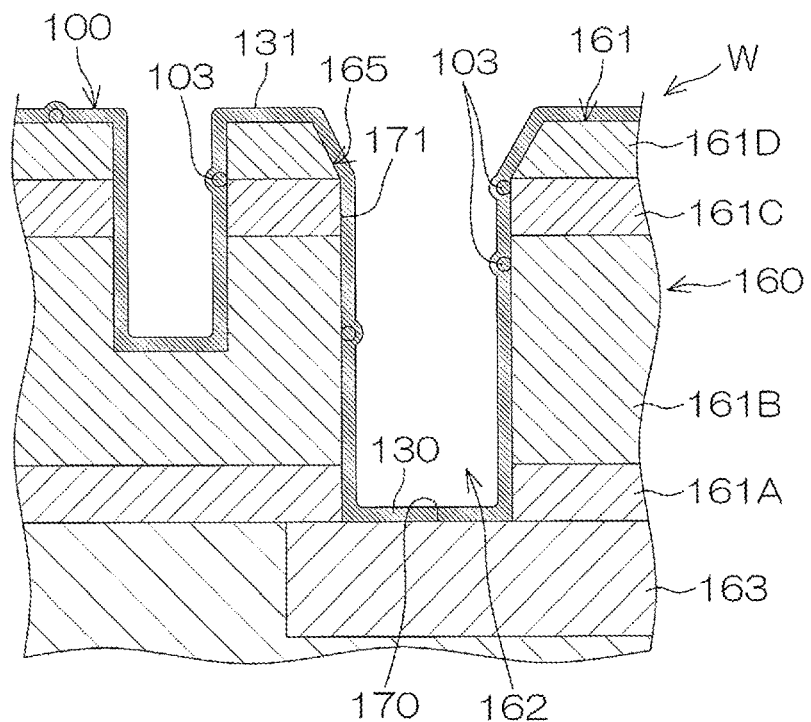
FIG. 7C is a schematic view for explaining a status near the surface of the substrate in a state in which a processing film is formed by performing the processing film forming step (Step S8).
Figure 7D:
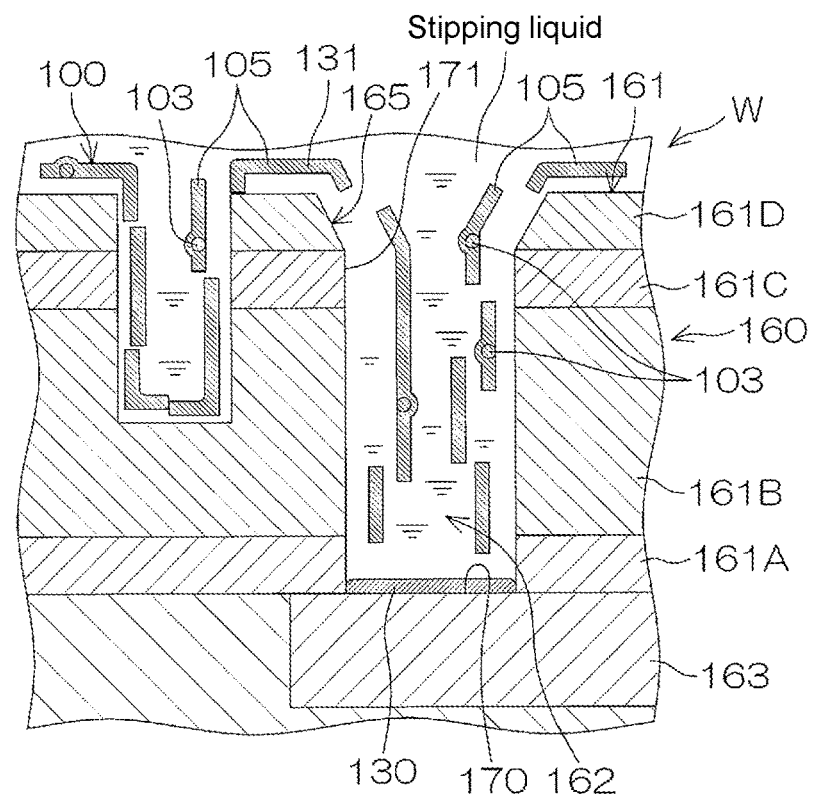
FIG. 7D is a schematic view for explaining a status near the surface of the substrate during the performance of the processing film separating step (Step S9).

After that, as shown in FIG. 7C, the processing film 100 which holds the removal target 103 is formed. Since the processing film 100 has a higher removal target holding capacity which holds the removal target 103 present in the non-exposed region 171 than the preprocessing film 200, the removal target 103 can be held. When the stripping liquid is supplied to the upper surface of the substrate W on which the processing film 100 is formed, as shown in FIG. 7D, the processing film 100 is separated from the upper surface of the substrate W together with the removal target 103 by the separating action of the stripping liquid. When the processing film 100 is separated from the upper surface of the substrate W, the pressing film 100 splits into film pieces 105.

The processing film 100 has a high removal capacity for removing the removal target 103 present in the non-exposed region 171. Therefore, in the preprocessing film separating step (Step S4), even when the removal target 103 which could not be removed by the preprocessing film 200 is presents in the non-exposed region 171 (refer to FIG. 7B), the removal target 103 can be removed from the substrate W by performing the processing film separating step (Step S9).

Figure 7E:
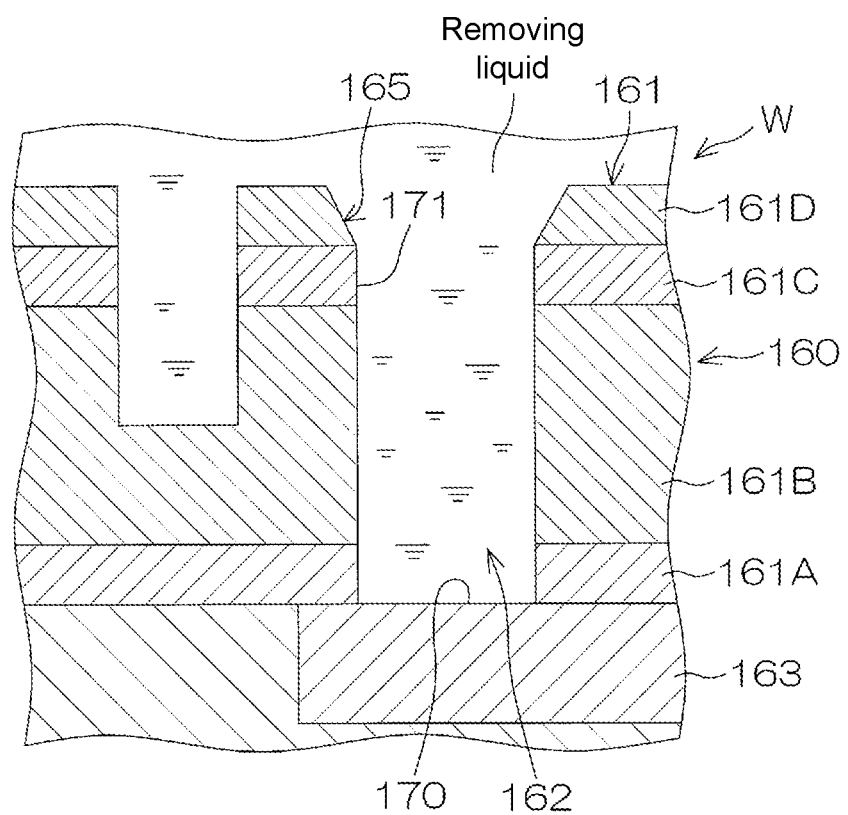
FIG. 7E is a schematic view for explaining a status near the surface of the substrate in a state in which the residue of the processing film is removed by performing the processing film residue removing step (Step S11).

Even after the processing film 100 is separated by the stripping liquid in the processing film separating step (Step S9), a portion of the processing film 100 which covers the exposed region 170 (an exposed region covering portion 130) remains on the exposed region 170 as a residue, as shown in FIG. 7D. The exposed region covering portion 130 is dissolved by the removing liquid supplied to the upper surface of the substrate W in the subsequent processing film residue removing step (Step S11), and is removed from the upper surface of the substrate W as shown in FIG. 7E.

Next, a status in which the preprocessing film 200 is separated will be described with reference to FIGS. 8A to 8C.

Figure 8A:
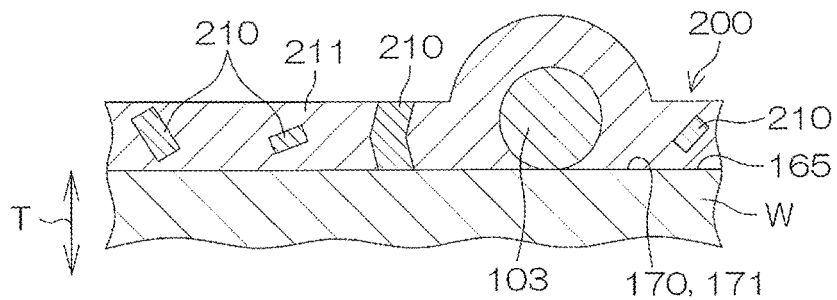
FIGS. 8A to 8C are schematic views for explaining a status in which the preprocessing film is separated from the substrate.

As shown in FIG. 8A, the preprocessing film 200 holds the removal target 103. Specifically, the preprocessing film 200 has a high-solubility solid 210 (a second high-solubility component in a solid state) and a low-solubility solid 211 (a second low-solubility component in a solid state). The high-solubility solid 210 and the low-solubility solid 211 are formed by evaporation of at least some of the solvent contained in the preprocessing liquid.

In the preprocessing film 200, the high-solubility solid 210 and the low-solubility solid 211 are mixed in a single layer. Strictly speaking, in the preprocessing film 200, a high-solubility solid 210 and a low-solubility solid 211 are not evenly distributed in the entire the preprocessing film 200, and there are a portion in which the high-solubility solid 210 is unevenly distributed and a portion in which the low-solubility solid 211 is unevenly distributed.

The preprocessing film 200 has a structure in which the preprocessing film 200 is mixed in a single layer regardless of a region (a location), in which the preprocessing film 200 is formed, on the upper surface of the substrate W. In other words, the preprocessing film 200 has a structure in which the preprocessing film 200 is mixed in a single layer in any one of the exposed region 170 and the non-exposed region 171.

Figure 8B:
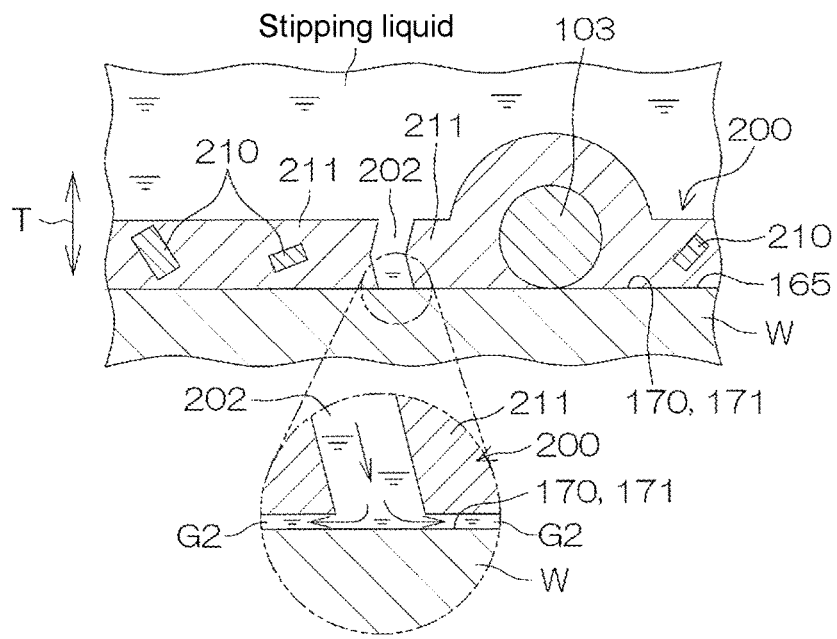

Referring to FIG. 8B, the high-solubility solid 210 is dissolved due to the supply of stripping liquid. That is, the preprocessing film 200 is partially dissolved. A through hole 202 is formed in a portion of the preprocessing film 200, in which the high-solubility solid 210 is unevenly distributed, by dissolving the high-solubility solid 210.

The through hole 202 is likely to be formed particularly in a portion of the pattern surface 165 in which the high-solubility solid 210 extends in a normal direction T (which is also the thickness direction of the preprocessing film 200). The through hole 202 has a size of, for example, several nm in diameter in a plan view.

Solubility of the low-solubility component in the stripping liquid is low, and the low-solubility solid 211 is hardly dissolved by the stripping liquid. Therefore, only a vicinity of a surface of the low-solubility solid 211 is slightly dissolved by the stripping liquid. Therefore, the stripping liquid which reaches the vicinity of the upper surface (the pattern surface 165) of the substrate W through the through hole 202 slightly dissolves a portion of the low-solubility solid 211 near the upper surface of the substrate W. Thus, as shown in the enlarged view of FIG. 8B, the stripping liquid gradually dissolves the low-solubility solid 211 near the upper surface of the substrate W and enters a gap G2 between the preprocessing film 200 and the upper surface of the substrate W (a stripping liquid entering step).

Figure 8C:
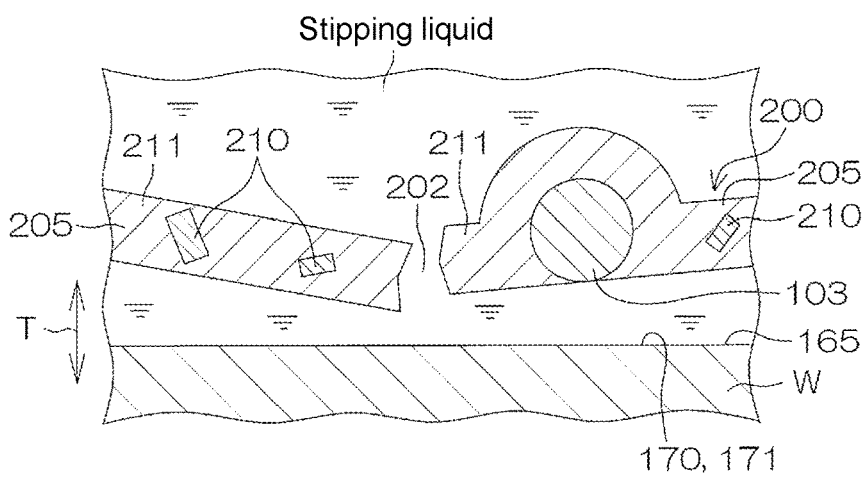

Then, for example, as shown in FIG. 8C, the preprocessing film 200 splits into film pieces 205 starting from a peripheral edge of the through hole 202 and is separated from the substrate W in a state in which the film pieces 205 of the preprocessing film 200 holds the removal target 103 (a preprocessing film splitting step, a separating step). Then, the preprocessing film 200 which has become the film pieces 205 is washed away (pushed out of the substrate W) in a state in which the removal target 103 is held, and is removed from the upper surface of the substrate W by continuing to supply the stripping liquid (a removal target removing step).

Figure 9A:
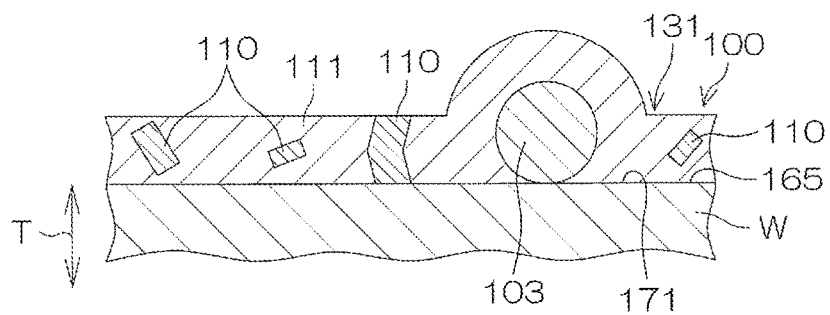
FIGS. 9A to 9C are schematic views for explaining a status in which the processing film is separated from the substrate.
Figure 9B:
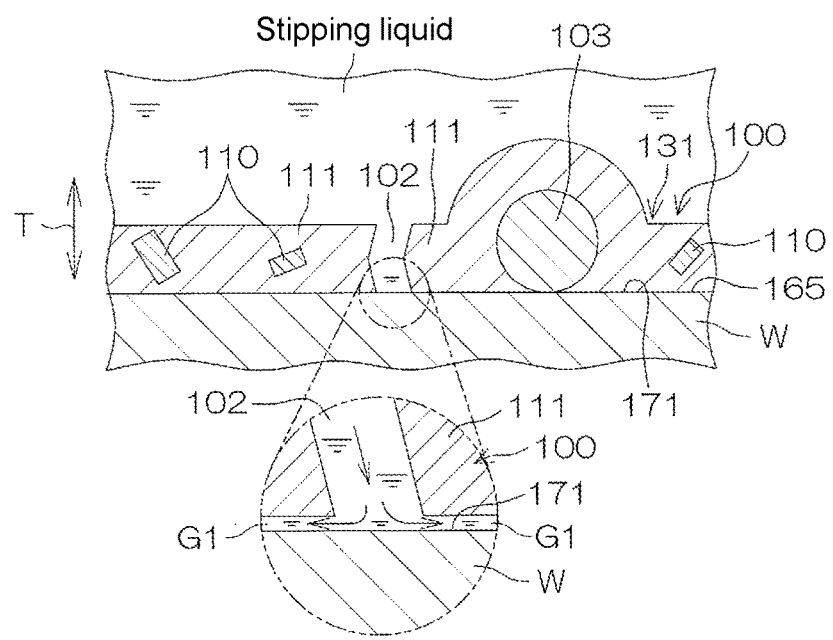
Figure 9C:
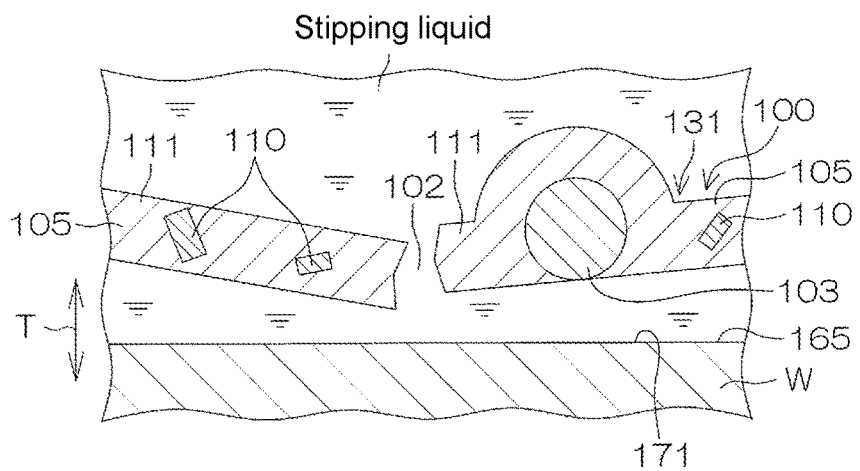

A status in which the processing film 100 is separated will be described in detail with reference to FIGS. 9A to 9C. FIGS. 9A to 9C are schematic views for explaining a status in which a portion of the processing film 100 which covers the non-exposed region 171 (a non-exposed region covering portion 131) is separated from the non-exposed region 171.

As shown in FIG. 9A, the processing film 100 holds the removal target 103. Specifically, a portion of the processing film 100 which covers the non-exposed region 171 includes the high-solubility solid 110 (a first high-solubility component in a solid state) and the low-solubility solid 111 (a first low-solubility component in a solid state). The high-solubility solid 110 and the low-solubility solid 111 are formed by evaporating at least some of the solvent contained in the processing liquid.

In the non-exposed region covering portion 131, the high-solubility solid 110 and the low-solubility solid 111 are mixed in a single layer. Strictly speaking, in the non-exposed region covering portion 131, the high-solubility solid 110 and the low-solubility solid 111 are not evenly distributed in the entire processing film 100, and there are a portion in which the high-solubility solid 110 is unevenly distributed and a portion in which the low-solubility solid 111 is unevenly distributed.

Referring to FIG. 9B, the high-solubility solid 110 is dissolved due to the supply of stripping liquid. That is, the non-exposed region covering portion 131 is partially dissolved. A through hole 102 is formed in a portion of the non-exposed region covering portion 131, in which the high-solubility solid 110 is unevenly distributed, by dissolving the high-solubility solid 110 (a through hole forming step).

The through hole 102 is likely to be formed particularly in a portion of the pattern surface 165 in which the high-solubility solid 110 extends in the normal direction T (which is also the thickness direction of the processing film 100). The through hole 102 has a size of, for example, several nm in diameter in a plan view.

The solubility of the low-solubility component in the stripping liquid is low, and the low-solubility solid 111 is hardly dissolved by the stripping liquid. Therefore, only a vicinity of a surface of the low-solubility solid 111 is slightly dissolved by the stripping liquid. Therefore, the stripping liquid which reaches the vicinity of the upper surface of the substrate W through the through hole 102 slightly dissolves a portion of the low-solubility solid 111 near the upper surface of the substrate W. Thus, as shown in the enlarged view of FIG. 9B, the stripping liquid enters a gap G1 between the non-exposed region covering portion 131 and the upper surface of the substrate W while gradually dissolving the low-solubility solid 111 near the upper surface of the substrate W (a stripping liquid entering step).

Then, for example, as shown in FIG. 9C, the non-exposed region covering portion 131 splits into film pieces 105 starting from a peripheral edge of the through hole 102 and is separated from the substrate W in a state in which the film pieces 105 of the non-exposed region covering portion 131 hold the removal target 103 (a processing film splitting step, a separating step). Then, the non-exposed region covering portion 131 which has become the film pieces 105 is washed away (pushed out of the substrate W) in a state in which the removal target 103 is held, and is removed from the upper surface of the substrate W by continuing to supply the stripping liquid (a removal target removing step).

Referring to FIGS. 9A to 9C, a step in which the non-exposed region covering portion 131 of the processing film 100 is partially dissolved to form the through hole 102 is an example of a first through hole forming step, and the through hole 102 formed accordingly is an example of a first through hole. Further, referring to FIGS. 8A to 8C, a step in which the preprocessing film 200 is partially dissolved to form the through hole 202 is an example of a second through hole forming step, and the through hole 202 formed accordingly is an example of a second through hole.

Figure 10A:
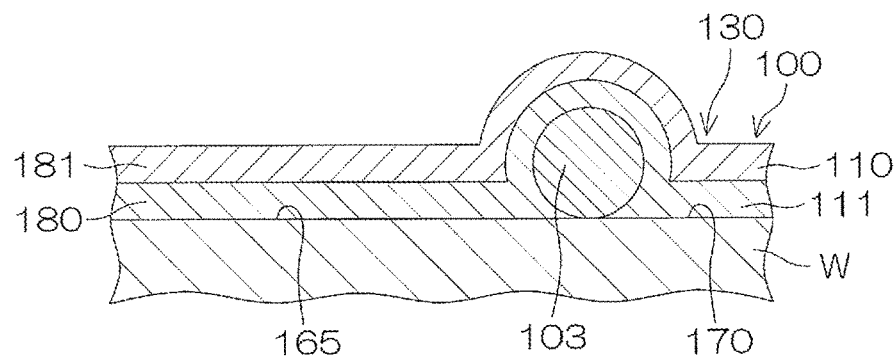
FIGS. 10A to 10C are schematic views for explaining a status in which an exposed region covering portion for covering an exposed region in which a metal film is exposed on the surface of the substrate is removed from the substrate.
Figure 10B:
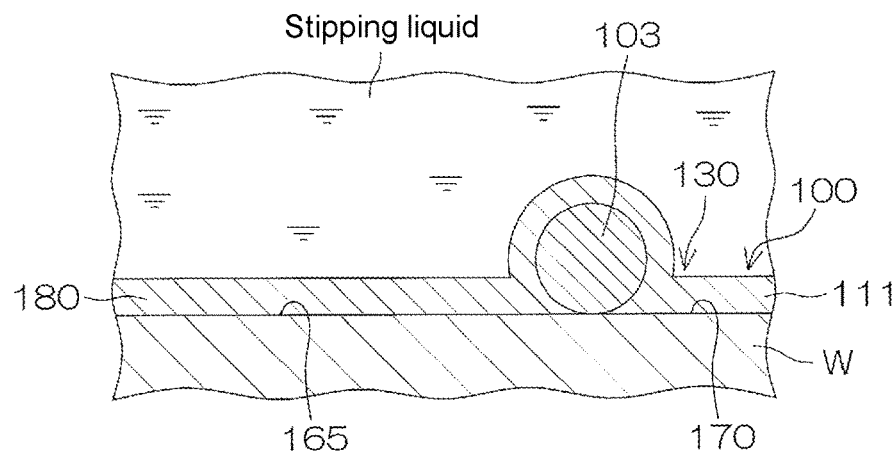
Figure 10C:
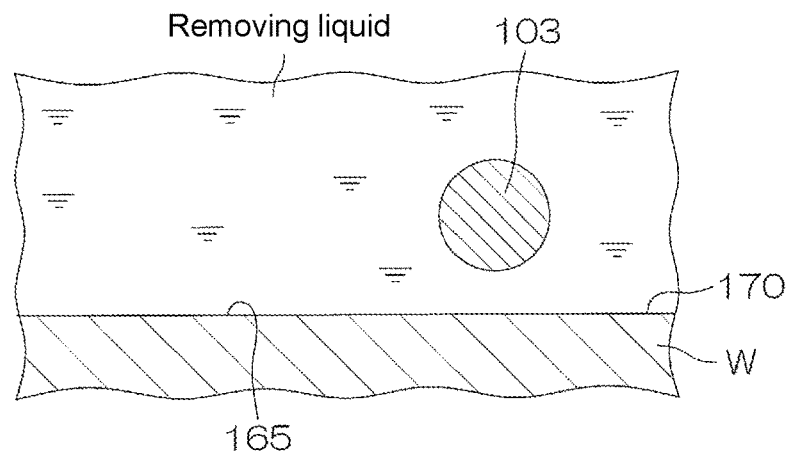

Next, a status in which the exposed region covering portion 130 which covers the exposed region 170 is removed will be described in detail with reference to FIGS. 10A to 10C. FIGS. 10A to 10C are schematic views for explaining a status in which the exposed region covering portion 130 is removed from the upper surface of the substrate W.

As described above, most of the removal target 103 is removed from the exposed region 170 by the preprocessing film separating step (Step S4), but the removal target 103 may be slightly present in the exposed region 170 even when the processing film 100 is formed.

The exposed region covering portion 130 has the high-solubility solid 110 (the first high-solubility component in the solid state) and the low-solubility solid 111 (the first low-solubility component in the solid state). The high-solubility solid 110 and the low-solubility solid 111 are formed by evaporating at least some of the solvent contained in the processing liquid.

The exposed region covering portion 130 includes a low-solubility layer 180 formed of the low-solubility solid 111 disposed at a position in contact with the metal film 163, and a high-solubility layer 181 disposed on the opposite side of the low-solubility layer 180 with respect to the metal film 163 and formed of the high-solubility solid 110. That is, the low-solubility layer 180 is located between the metal film 163 and the high-solubility layer 181.

The high-solubility solid 110 is dissolved in the stripping liquid, but the low-solubility solid 111 is hardly dissolved in the stripping liquid. Therefore, when the stripping liquid is supplied to the upper surface of the substrate W in the processing film separating step (Step S9), the high-solubility layer 181 is dissolved by the stripping liquid as shown in FIG. 10B. On the other hand, although a surface of the low-solubility layer 180 is slightly dissolved, the low-solubility layer 180 is maintained without exposing the metal film 163 in a state in which the low-solubility layer 180 covers the exposed region 170. Therefore, it is difficult for the stripping liquid to enter a space between the low-solubility layer 180 and the upper surface of the substrate W. Therefore, the low-solubility layer 180 of the protective film 100B remains on the exposed region 170 without being separated by the stripping liquid. Therefore, the processing film 100 has lower separability than the preprocessing film 200 in the exposed region 170.

The removal target 103 adhering to the exposed region 170 is detached from the exposed region 170 when the processing film 100 is formed. In the processing film residue removing step (Step S8), the exposed region covering portion 130 is dissolved in the removing liquid. When the exposed region covering portion 130 is dissolved by the removing liquid, as shown in FIG. 10C, the removal target 103 floats in the removing liquid in a state in which it is detached from the exposed region 170. Therefore, the removal target 103 floating in the removing liquid is removed from the upper surface of the substrate W together with the removing liquid by continuing the supply of the removing liquid.

According to the first embodiment, the removal target 103 is removed from the upper surface of the substrate W by the separating of the preprocessing film 200 having a high removal capacity for removing the removal target 103 present in the exposed region 170 (the first region). After that, the removal target 103 is removed from the upper surface of the substrate W by the separating of the processing film 100 having a high removal capacity for removing the removal target 103 present in the non-exposed region 171 (the second region). Both the separating of the prepro-cessing film 200 having a relatively high removal capacity for removing the removal target 103 present in the exposed region 170, and the separating of the processing film 100 having a relatively high removal capacity for removing the removal target 103 present in the non-exposed region 171 are performed. More simply, the removal of the removal target 103 is performed in two stages using the preprocessing film 200 and the processing film 100 in which the regions having the high removal capacity for removing the removal target 103 are different from each other.

Therefore, the removal target 103 can be efficiently removed from the substrate W having a surface on which the exposed region 170 in which the metal film 163 is exposed and the other non-exposed region 171 are present.

Further, according to the first embodiment, after the processing film separating step (Step S9), the processing film residue removing step (Step S11) in which the removing liquid is supplied to the upper surface of the substrate W to remove the residue of the processing film 100 remaining on the upper surface of the substrate W is performed. Therefore, even when the residue of the processing film 100 adheres to the exposed region 170 and the non-exposed region 171 after the processing film 100 is separated by the stripping liquid, the residue can be removed by the removing liquid.

Further, according to the first embodiment, in the processing film separating step, the exposed region covering portion 130 is not separated, and the non-exposed region covering portion 131 is separated. Then, in the processing film residue removing step, the exposed region covering portion 130 is removed as a residue of the processing film 100.

Therefore, even when the exposed region covering portion 130 remains on the exposed region 170 without being separated by the supply of the stripping liquid to the upper surface of the substrate W, the exposed region covering portion 130 can be dissolved in the removing liquid and removed from the exposed region 170.

When the exposed region covering portion 130 of the processing film 100 is dissolved in the removing liquid, the removal target 103 released from the holding by the exposed region covering portion 130 may adhere again to the exposed region 170. According to the first embodiment, the processing film 100 is formed after the preprocessing film 200 having a relatively high removal capacity for removing the removal target 103 present in the exposed region 170 is removed from the exposed region 170 by the separating. Therefore, most of the removal target 103 is removed from the exposed region 170 before the processing film 100 is formed.

Therefore, even in a configuration in which the exposed region covering portion 130 is dissolved in the removing liquid to remove the exposed region covering portion 130 from the exposed region 170, it is possible to sufficiently curb the remaining of the removal target 103 in the exposed region 170.

Further, according to the first embodiment, in the non-exposed region covering portion 131 of the processing film 100, the high-solubility solid 110 and the low-solubility solid 111 are mixed in a single layer. Additionally, in the processing film separating step (Step S9), the high-solubility solid 110 is selectively dissolved in the stripping liquid.

Due to the high-solubility solid 110 being dissolved in the stripping liquid, the stripping liquid passes through the non-exposed region covering portion 131 of the processing film 100 via the trace (the through hole 102) in which the high-solubility solid 110 was present. Thus, the stripping liquid can quickly reach the vicinity of an interface between the processing film 100 and the non-exposed region 171 on the surface of the substrate W.

On the other hand, the low-solubility solid 111 in the non-exposed region covering portion 131 is maintained in a solid state without being dissolved. Therefore, the stripping liquid can act on a contact interface between the low-solubility solid 111 and the substrate W while the removal target 103 is held by the low-solubility solid 111. As a result, the non-exposed region covering portion 131 can be quickly removed from the upper surface of the substrate W, and the removal target 103 can be efficiently removed from the upper surface of the substrate W together with the non-exposed region covering portion 131 of the processing film 100.

Further, according to the first embodiment, the high-solubility solid 210 and the low-solubility solid 211 are mixed in the preprocessing film 200. The high-solubility solid 210 in the preprocessing film 200 is selectively dissolved in the stripping liquid. Due to the high-solubility solid 210 being dissolved in the stripping liquid, the stripping liquid passes through the preprocessing film 200 via the trace (the through hole 202) in which the high-solubility solid 210 was present. Thus, the stripping liquid can quickly reach the vicinity of an interface between the preprocessing film 200 and the upper surface of the substrate W.

On the other hand, the low-solubility solid 211 in the preprocessing film 200 is maintained in a solid state without being dissolved. Therefore, the stripping liquid can act on a contact interface between the low-solubility solid 211 and the substrate W while the removal target 103 is held by the low-solubility solid 211. As a result, the preprocessing film 200 can be quickly removed from the upper surface of the substrate W, and the removal target 103 can be efficiently removed from the upper surface of the substrate W together with the preprocessing film 200.

"The high-solubility solids 110 and 210 are selectively dissolved" does not mean that only the high-solubility solids 110 and 210 are dissolved. "The high-solubility solids 110 and 210 are selectively dissolved" means that the low-solubility solids 111 and 211 are also slightly dissolved, but most of the high-solubility solids 110 and 210 are dissolved.

Further, the metal film 163 of which a surface is exposed in the exposed region 170 is not limited to the copper film. The metal film 163 may be, for example, an aluminum film, a cobalt film, a ruthenium film, a molybdenum film, a tungsten film, or the like. Further, the film of which a surface is exposed in the exposed region 170 does not have to be the metal film 163, and may be, for example, a nitride film such as a silicon nitride film or a titanium nitride film. Even when the substrate processing according to the above-described embodiment is performed on a substrate in which the specific substance exposed in the exposed region 170 is a metal other than copper or a nitride, the same effects as those of the above-described embodiment are obtained.

Second Embodiment

Figure 11:
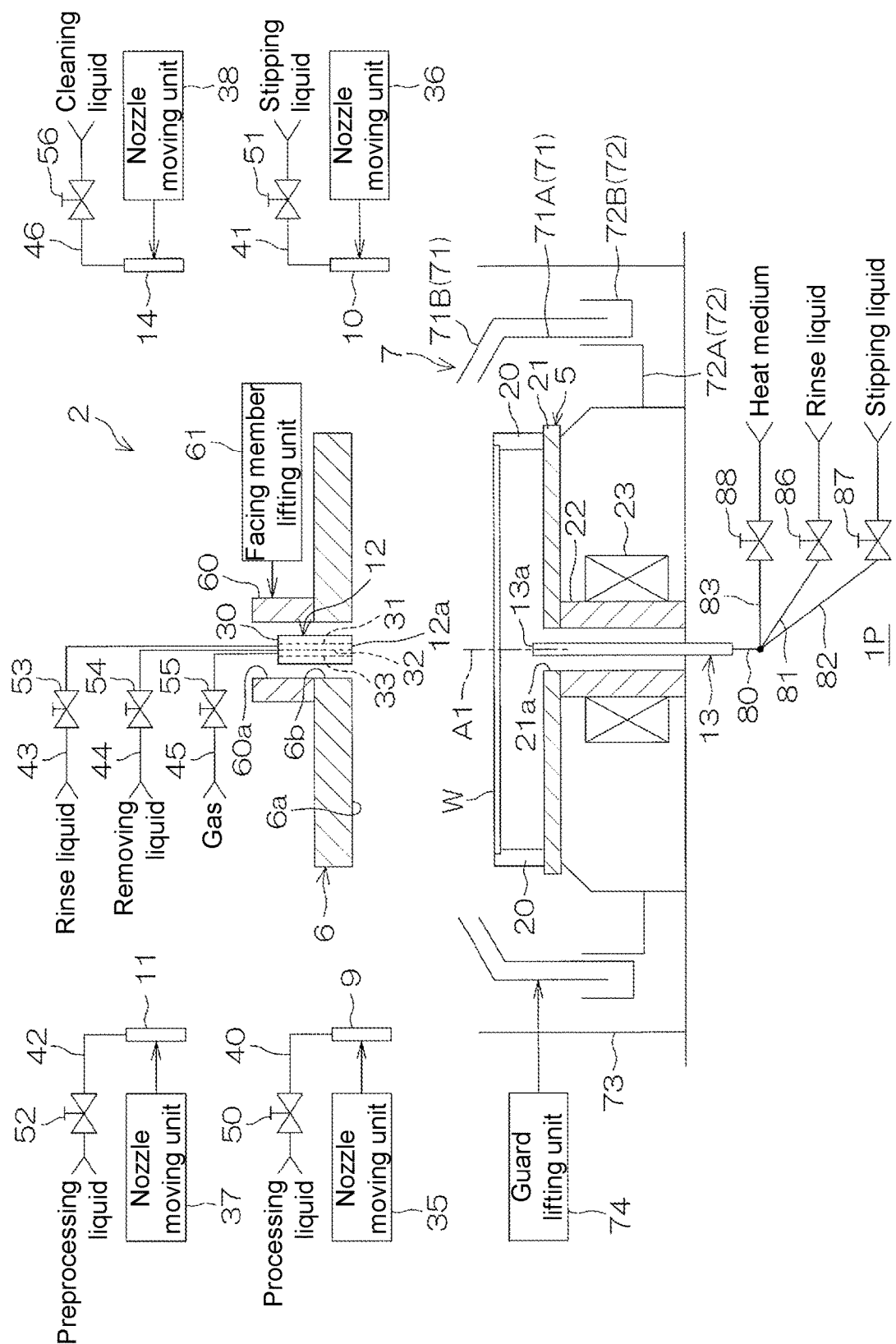
FIG. 11 is a schematic partial cross-sectional view showing a schematic configuration of a processing unit provided in a substrate processing apparatus according to a second embodiment of the disclosure.

FIG. 11 is a schematic partial cross-sectional view showing a schematic configuration of a processing unit 2 provided in a substrate processing apparatus 1P according to a second embodiment. In FIG. 11, constituents equivalent to the constituents shown in FIGS. 1 to 10C described above are designated by the same reference numerals as those in FIG. 1 and the like, and the description thereof will be omitted. Similarly, in FIGS. 12 to 15E which will be described later, the same reference numerals as those in FIG. 1 and the like are provided, and the description thereof will be omitted.

Referring to FIG. 11, a main difference between the substrate processing apparatus 1P according to the second embodiment and the substrate processing apparatus 1 according to the first embodiment (refer to FIG. 3) is that in the substrate processing apparatus 1P according to the second embodiment, the substrate W subjected to a dry etching processing is subjected to the substrate processing.

Figure 12:
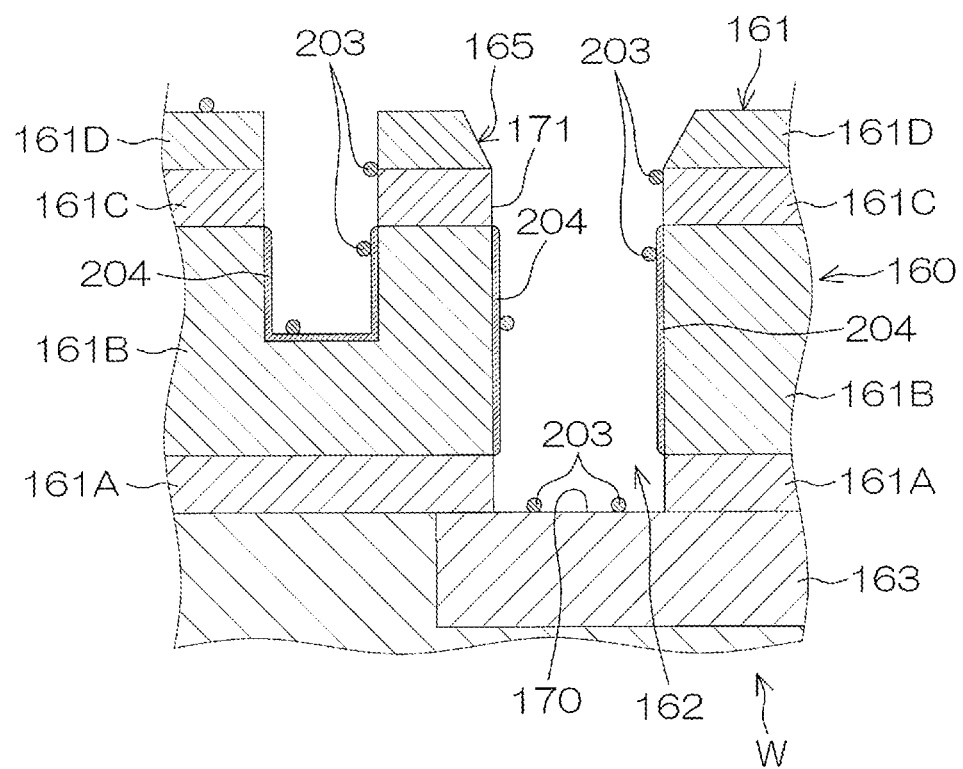
FIG. 12 is an example of a cross-sectional view of a surface layer of a substrate processed by the substrate processing apparatus according to the second embodiment.

FIG. 12 is an example of a cross-sectional view of a surface layer of the substrate W processed by the substrate processing apparatus 1P. A first removal target 203 adheres to both the non-exposed region 171 and the exposed region 170 on the substrate W. The first removal target 203 is a residue generated by the dry etching processing in the previous step. The first removal target 203 is a residue having a granular shape (a granular residue). The first removal target 203 is a reaction product of an etching gas such as $CF_X$ (for example, carbon tetrafluoride ($CF_4$)) used in the dry etching processing and the structure 161.

A second removal target 204 adheres to the non-exposed region 171. The second removal target 204 is also a residue of the dry etching processing. The second removal target 204 is a residue having a film shape (a film-shaped residue) which covers at least a part of the non-exposed region 171. In the example of FIG. 12, the second removal target 204 covers a surface of the low dielectric constant interlayer insulating film 161B. The second removal target 204 is a reaction product of the etching gas and the low dielectric constant interlayer insulating film 161B.

Referring to FIG. 11, the processing unit 2 according to the second embodiment includes a fourth moving nozzle 14. The fourth moving nozzle 14 is an example of a cleaning liquid nozzle (a cleaning liquid supply unit) which supplies (discharges) a cleaning liquid such as SC1 (an ammonia-hydrogen peroxide solution) in a continuous flow toward the upper surface of the substrate W held by the spin chuck 5. The cleaning liquid is a liquid which dissolves the second removal target 204 which cannot be separated from the upper surface of the substrate W with the stripping liquid and removes it from the upper surface of the substrate W.

The fourth moving nozzle 14 is moved in the horizontal direction and the vertical direction by a fourth nozzle moving unit 38. The fourth moving nozzle 14 can move between a center position and a home position (a retracted position) in the horizontal direction.

When the fourth moving nozzle 14 is located at the center position, the fourth moving nozzle 14 faces the rotation center of the upper surface of the substrate W. When the fourth moving nozzle 14 is located at the home position, the fourth moving nozzle 14 does not face the upper surface of the substrate W and is located outside the processing cup 7 in a plan view. The fourth moving nozzle 14 can approach the upper surface of the substrate W or can retract upward from the upper surface of the substrate W by moving in the vertical direction.

The fourth nozzle moving unit 38 has the same configuration as the first nozzle moving unit 35. That is, the fourth nozzle moving unit 38 includes, for example, an arm (not shown) which is coupled to the fourth moving nozzle 14 and extends horizontally, a rotating shaft (not shown) which is coupled to the arm and extends in the vertical direction, and a rotating shaft drive unit (not shown) which moves up and down or rotates the rotating shaft.

The fourth moving nozzle 14 is connected to a cleaning liquid pipe 46 which guides the cleaning liquid to the fourth moving nozzle 14. When a cleaning liquid valve 56 interposed in the cleaning liquid pipe 46 is opened, the cleaning liquid is discharged downward from a discharge port of the fourth moving nozzle 14 in a continuous flow.

The cleaning liquid discharged from the fourth moving nozzle 14 is preferably a liquid having a higher oxidizing force than the stripping liquid. The cleaning liquid discharged from the fourth moving nozzle 14 is not limited to SC1 and may be a hydrofluoric acid or diluted ammonia water (dNH$_4$OH).

Figure 13:
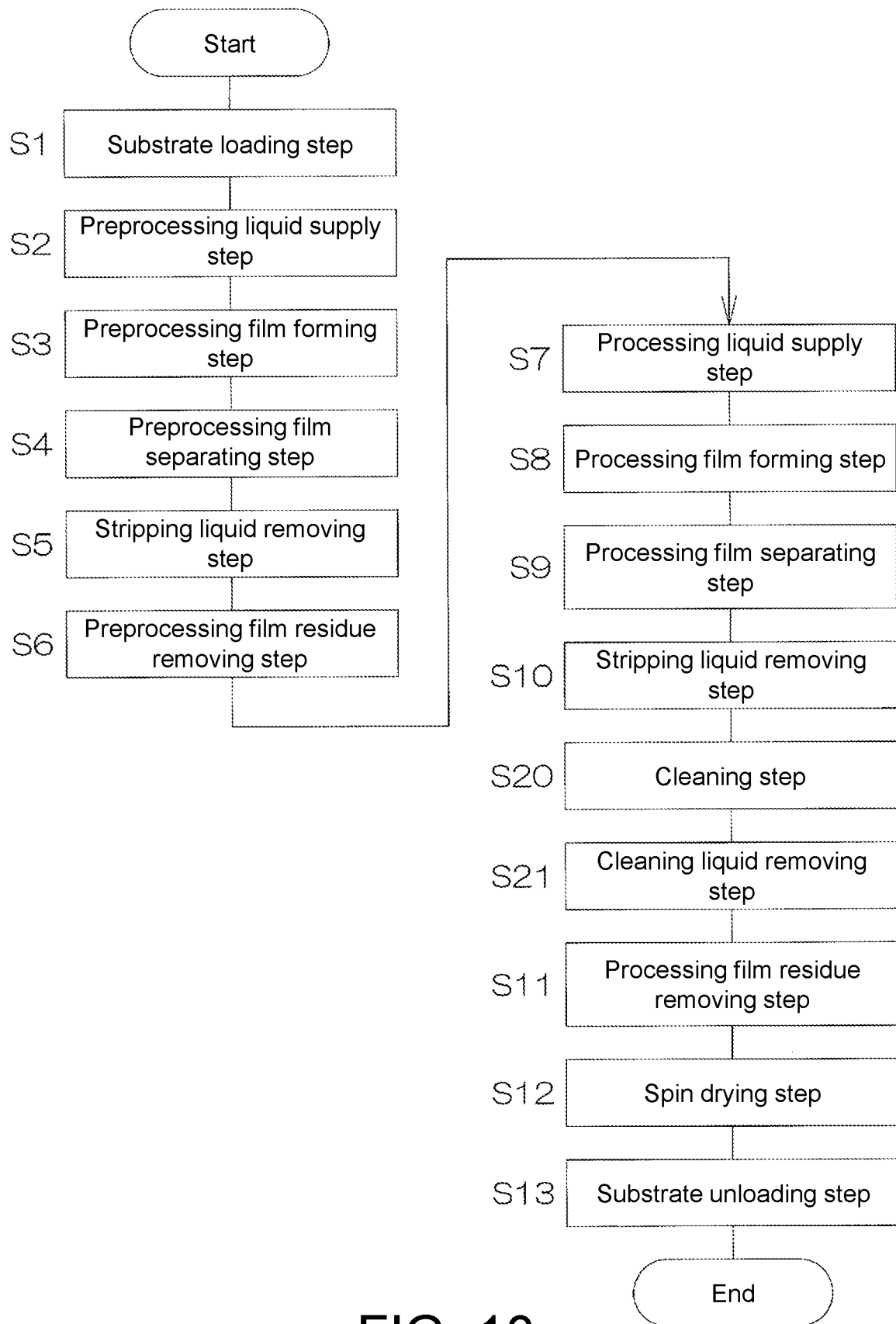
FIG. 13 is a flowchart for explaining an example of substrate processing by the substrate processing apparatus according to the second embodiment.
Figure 14A:
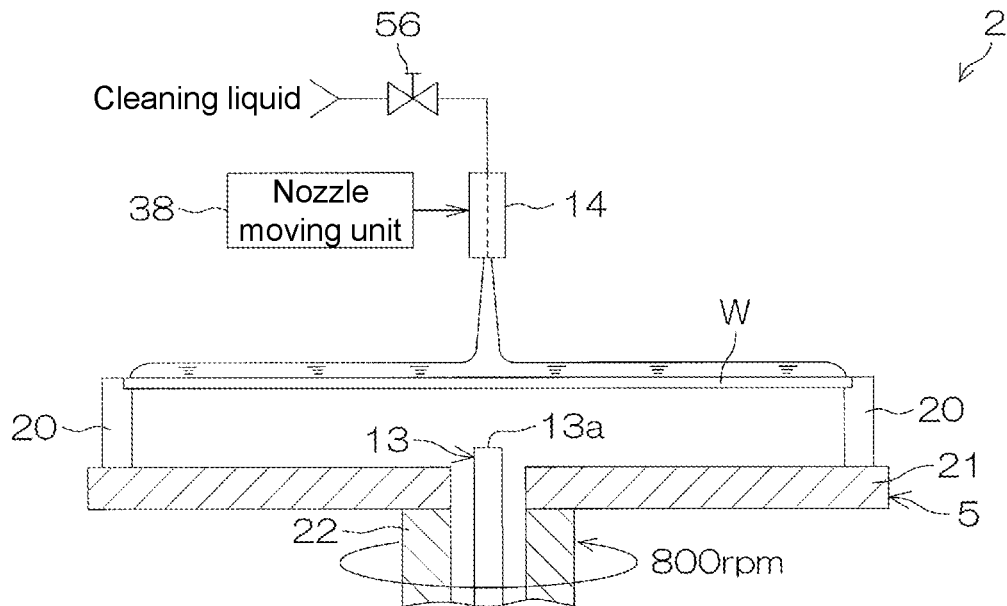
FIG. 14A is a schematic view for explaining a status of a cleaning step (Step S20) in the substrate processing according to the second embodiment.
Figure 14B:
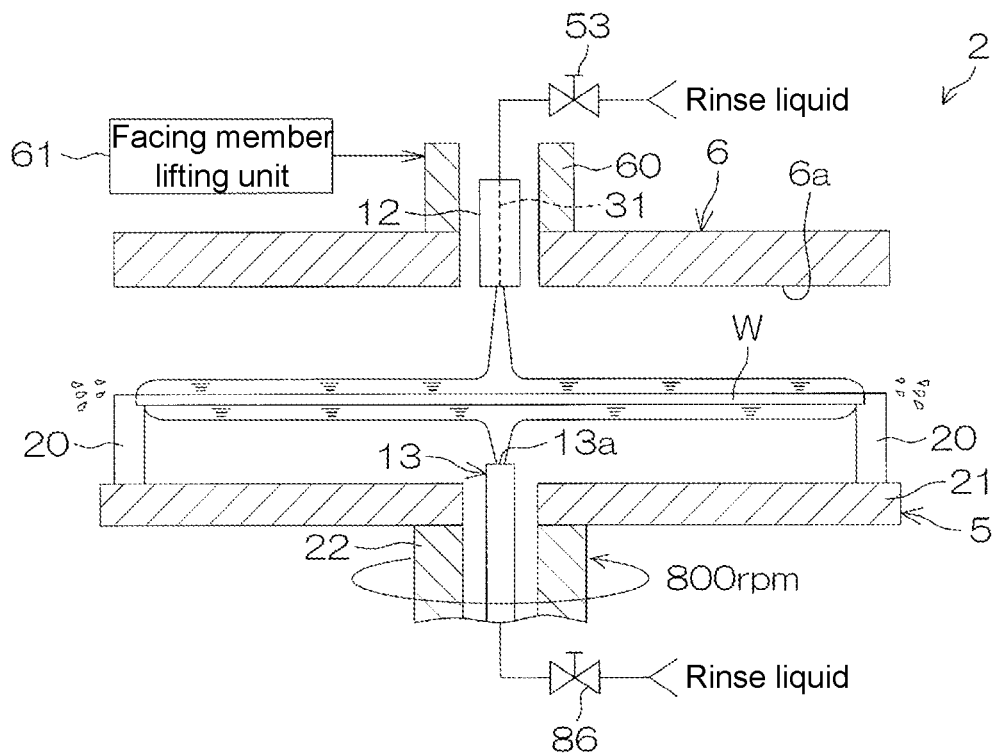
FIG. 14B is a schematic view for explaining a status of a cleaning liquid removing step (Step S21) in the substrate processing according to the second embodiment.

FIG. 13 is a flowchart for explaining an example of substrate processing by the substrate processing apparatus 1P according to the second embodiment. FIGS. 14A and 14B are schematic views for explaining a status of each of steps in the substrate processing by the substrate processing apparatus 1P.

In the substrate processing by the substrate processing apparatus 1P, the substrate W after the dry etching processing is used. As shown in FIG. 13, in the substrate processing by the substrate processing apparatus 1P, unlike the substrate processing by the substrate processing apparatus 1 (refer to FIG. 5), a cleaning step (Step S20) and a cleaning liquid removing step (Step S21) are performed between the stripping liquid removing step (Step S10) and the processing film residue removing step (Step S11).

The cleaning step (Step S20) is a step in which the second removal target 204 adhering to the upper surface of the substrate W is removed and the upper surface of the substrate W is cleaned. The cleaning liquid removing step (Step S21) is a step in which the cleaning liquid is removed (rinsed) from the upper surface of the substrate W by supplying the rinse liquid.

Hereinafter, the cleaning step (Step S20) and the cleaning liquid removing step (Step S21) will be described in detail.

After the upper rinse liquid valve 53 and the lower rinse liquid valve 86 are closed to stop the supply of the rinse liquid in the stripping liquid removing step (Step S10), the facing member lifting unit 61 moves the facing member 6 to the upper position. The fourth nozzle moving unit 38 moves the fourth moving nozzle 14 to a processing position in a state in which the facing member 6 is located at the upper position. The processing position of the fourth moving nozzle 14 is, for example, the center position.

Then, the cleaning liquid valve 56 is opened in a state in which the fourth moving nozzle 14 is located at the processing position. Thus, as shown in FIG. 14A, the cleaning liquid is supplied (discharged) from the fourth moving nozzle 14 toward the central region of the upper surface of the rotating substrate W (a cleaning liquid supply step, a cleaning liquid discharge step). The cleaning liquid supplied to the upper surface of the substrate W spreads over the entire upper surface of the substrate W by a centrifugal force. In the cleaning step, the substrate W is rotated at a predetermined cleaning rotation speed. The cleaning rotation speed is, for example, a speed within a range of 10 rpm to 1000 rpm. The cleaning rotation speed is preferably 800 rpm.

The cleaning liquid supplied to the upper surface of the substrate W receives a centrifugal force, spreads radially, and spreads over the entire upper surface of the substrate W. Thus, the rinse liquid on the upper surface of the substrate W is replaced with the cleaning liquid.

After the cleaning step (Step S20), the cleaning liquid removing step (Step S21) is performed. Specifically, the cleaning liquid valve 56 is closed. Thus, the supply of the cleaning liquid to the upper surface of the substrate W is stopped. Then, the fourth nozzle moving unit 38 moves the fourth moving nozzle 14 to the home position. Then, as shown in FIG. 14B, the facing member lifting unit 61 moves the facing member 6 to the processing position.

Then, the upper rinse liquid valve 53 is opened in a state in which the facing member 6 is located at the processing position. Thus, the rinse liquid is supplied (discharged) from the central nozzle 12 toward the central region on the upper surface of the rotating substrate W (an upper rinse liquid supply step, an upper rinse liquid discharge step). In the cleaning liquid removing step, the substrate W is rotated at a predetermined cleaning liquid removing rotation speed, for example, 800 rpm.

The rinse liquid supplied to the upper surface of the substrate W spreads over the entire upper surface of the substrate W by a centrifugal force. Thus, the cleaning liquid adhering to the upper surface of the substrate W is washed away by the rinse liquid.

Further, at the same time when the upper rinse liquid valve 53 is opened, the lower rinse liquid valve 86 is opened. Therefore, the rinse liquid is supplied (discharged) from the lower surface nozzle 13 toward the central region of the lower surface of the rotating substrate W (a lower rinse liquid supply step, a lower rinse liquid discharge step). Thus, even when the cleaning liquid intrudes from the upper surface of the substrate W to the lower surface of the substrate W and adheres to the lower surface of the substrate W, the cleaning liquid adhering to the lower surface of the substrate W is washed away by the rinse liquid. The supply of the rinse liquid to the upper surface and the lower surface of the substrate W is continued for a predetermined time, for example, 35 seconds.

FIGS. 15A to 15E are schematic views for explaining a status near the upper surface of the substrate W during the substrate processing by the substrate processing apparatus 1P.

Figure 15A:
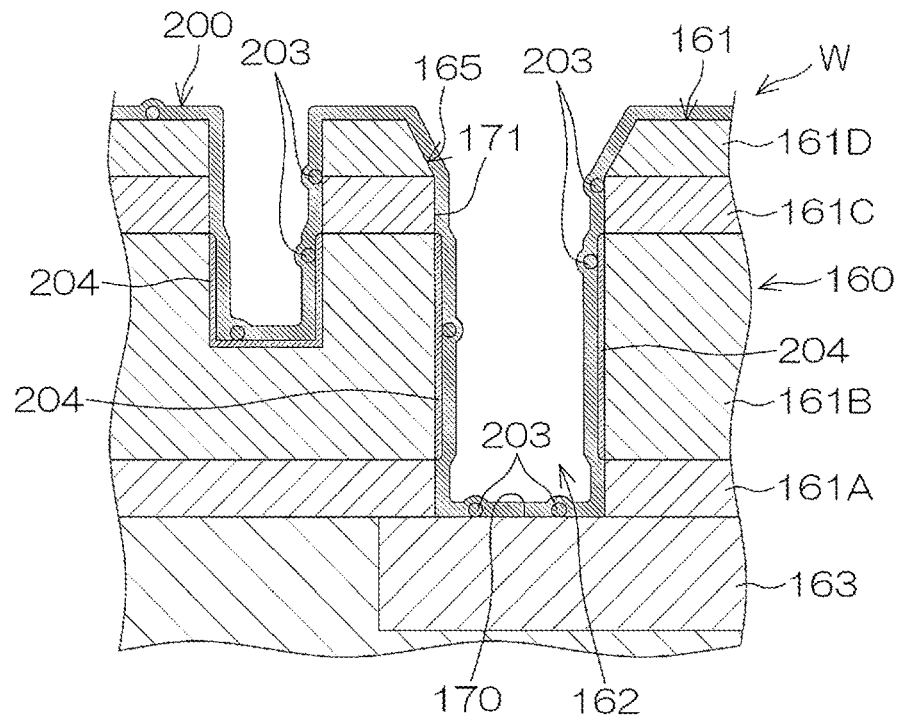
FIG. 15A is a schematic view for explaining a status near the surface of the substrate in a state in which a preprocessing film is formed by performing the preprocessing film forming step (Step S3) in the substrate processing according to the second embodiment.

FIG. 15A is a schematic view for explaining a status near the upper surface of the substrate W in a state in which the preprocessing film 200 is formed by performing the preprocessing film forming step (Step S3). As shown in FIG. 15A, the preprocessing film 200 holds the first removal target 203.

Figure 15B:
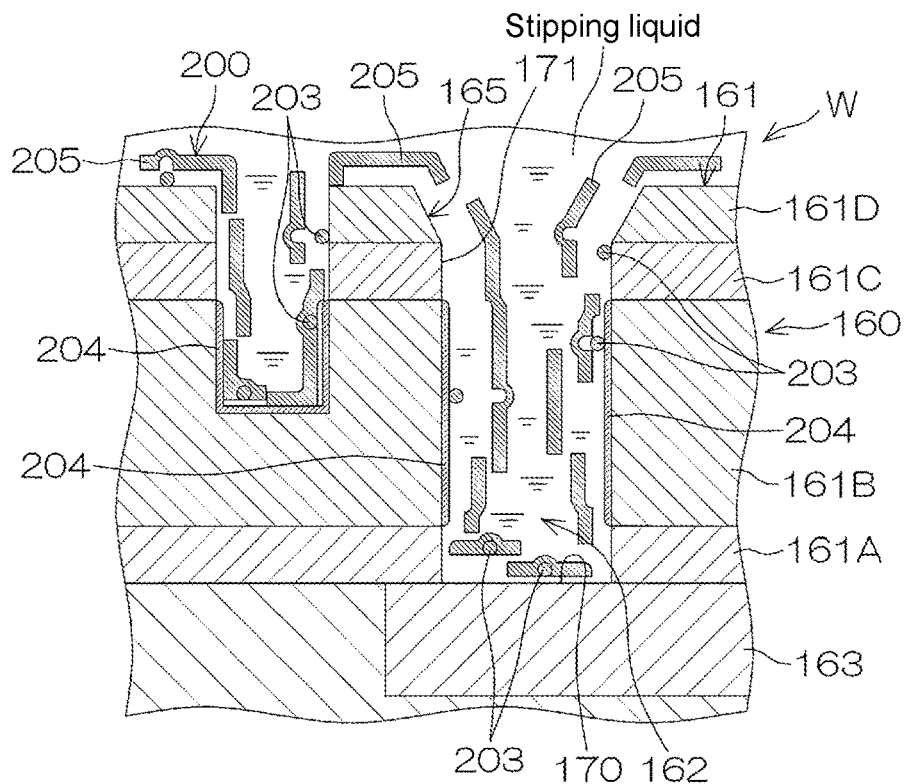
FIG. 15B is a schematic view for explaining a status near the surface of the substrate during the performance of the preprocessing film separating step (Step S4) in the substrate processing according to the second embodiment.

When the stripping liquid is supplied to the upper surface of the substrate W on which the preprocessing film 200 is formed, as shown in FIG. 15B, the preprocessing film 200 is separated from the upper surface of the substrate W together with the first removal target 203 by the separating action of the stripping liquid. When the preprocessing film 200 is separated from the upper surface of the substrate W, the preprocessing film 200 splits into film pieces 205.

Then, after the separating of the preprocessing film 200, the supply of the stripping liquid to the upper surface of the substrate W is continued, and thus the split film pieces 205 of the preprocessing film 200 are excluded to the outside of the substrate W together with the stripping liquid. Thus, the film pieces 205 of the preprocessing film 200 in the state in which they hold the first removal target 203 are removed from the upper surface of the substrate W.

The removal force, the removal target holding capacity, and the separability of the polymer film with respect to the first removal target 203 present in the target region (the exposed region 170 or the non-exposed region 171) are the same as the removal capacity, the removal target holding capacity, and the separability of the polymer film for the removal target 103 described in the first embodiment, respectively.

Therefore, although the preprocessing film 200 exhibits a high removal target holding capacity in both the non-exposed region 171 and the exposed region 170, the processing film 100 exhibits a higher removal target holding capacity than the preprocessing film 200 in both the non-exposed region 171 and the exposed region 170. On the other hand, the preprocessing film 200 has higher separability than the processing film 100 in the exposed region 170.

Therefore, the removal capacity for the processing film 100 to remove the first removal target 203 present in the non-exposed region 171 is higher than the removal capacity for the preprocessing film 200 to remove the first removal target 203 present in the non-exposed region 171. The removal capacity for the preprocessing film 200 to remove the first removal target 203 present in the exposed region 170 is higher than the removal capacity for the processing film 100 to remove the first removal target 203 present in the exposed region 170.

Therefore, as shown in FIG. 15B, most of the first removal target 203 can be removed from the exposed region 170 by the preprocessing film separating step (Step S4). On the other hand, the preprocessing film 200 has a relatively low removal capacity for removing the first removal target 203 present in the non-exposed region 171 (compared to the processing film 100). Therefore, the first removal target 203 which could not be held by the preprocessing film 200 with a sufficient removal target holding capacity may remain in the non-exposed region 171. Since the second removal target 204 is not separated together with the preprocessing film 200 and is not dissolved by the stripping liquid, the second removal target 204 remains in the non-exposed region 171 on the upper surface of the substrate W.

Figure 15C:
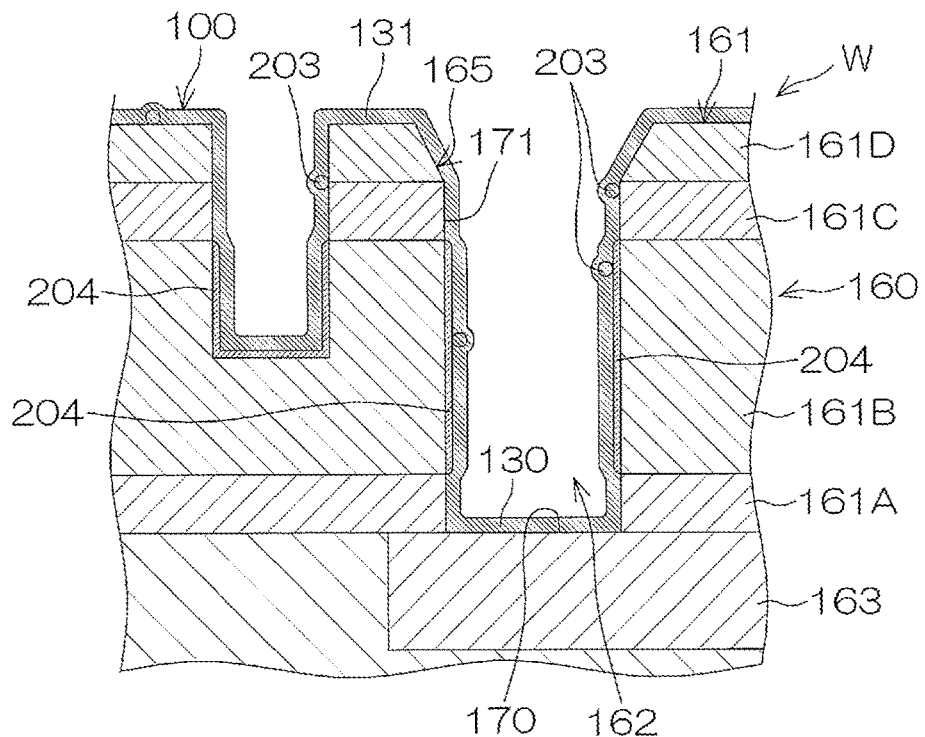
FIG. 15C is a schematic view for explaining a status near the surface of the substrate in a state in which the processing film is formed by performing the processing film forming step (Step S12) in the substrate processing according to the second embodiment.
Figure 15D:
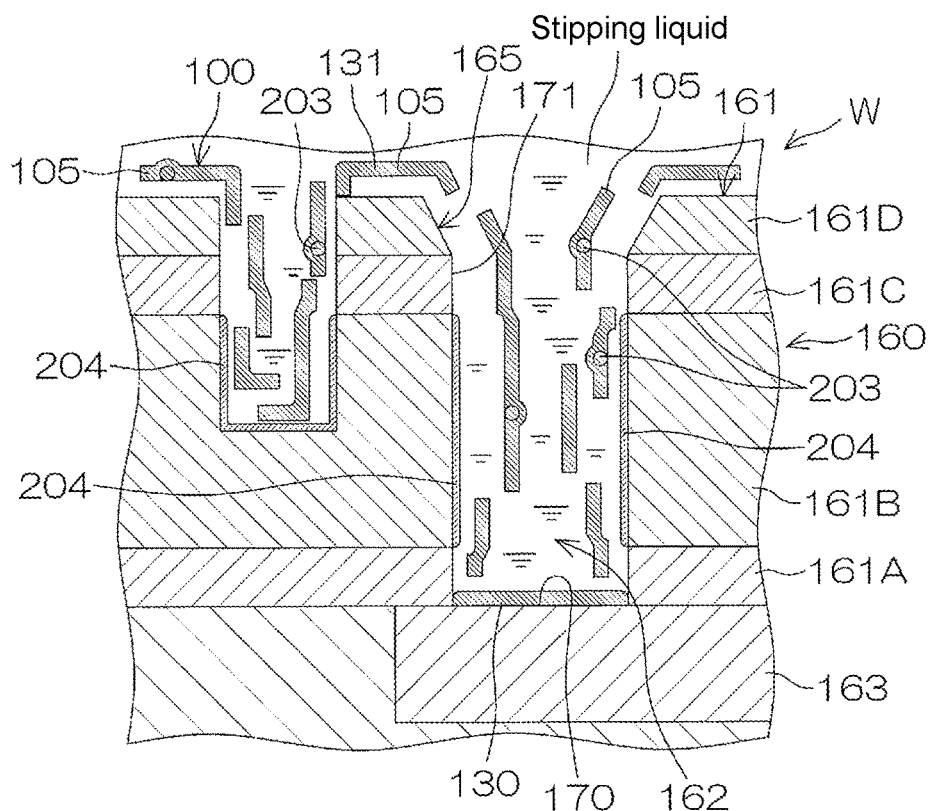
FIG. 15D is a schematic view for explaining a status near the surface of the substrate during the performance of the processing film separating step (Step S13) in the substrate processing according to the second embodiment.

After that, as shown in FIG. 15C, the processing film 100 which holds the first removal target 203 is formed. Since the processing film 100 has a higher removal target holding capacity which holds the first removal target 203 present in the non-exposed region 171 than the preprocessing film 200, the processing film 100 can hold the first removal target 203. When the stripping liquid is supplied to the upper surface of the substrate W on which the processing film 100 is formed, as shown in FIG. 15D, the processing film 100 is separated from the upper surface of the substrate W together with the first removal target 203 by the separating action of the stripping liquid. When the processing film 100 is separated from the upper surface of the substrate W, the processing film 100 splits into film pieces 105.

In the processing film 100, the non-exposed region covering portion 131 which covers the non-exposed region 171 is separated by the stripping liquid. On the other hand, as shown in FIG. 15D, the exposed region covering portion 130 remains on the exposed region 170 as a residue. That is, the non-exposed region covering portion 131 serves as a separation target film to be separated by the stripping liquid.

The processing film 100 has a high removal capacity for removing the first removal target 203 present in the non-exposed region 171. Therefore, in the preprocessing film separating step (Step S4), even when the first removal target 203 which could not be removed by the preprocessing film 200 is present on the non-exposed region 171 (refer to FIG. 15B), the first removal target 203 can be removed from the substrate W by performing the processing film separating step (Step S9). Since the second removal target 204 is not separated together with the preprocessing film 200 and is not dissolved by the stripping liquid, the second removal target 204 remains in the non-exposed region 171 on the upper surface of the substrate W.

Figure 15E:
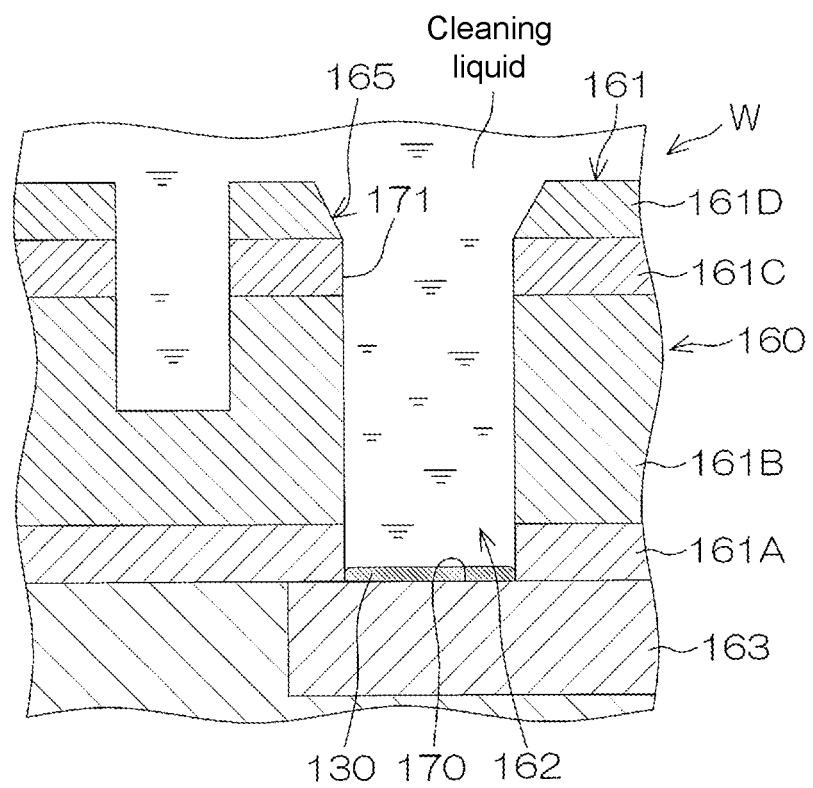
FIG. 15E is a schematic view for explaining a status near the surface of the substrate during the performance of the cleaning step (Step S20) of the substrate processing according to the second embodiment.

The second removal target 204 is dissolved by supplying the cleaning liquid to the upper surface of the substrate W in the subsequent cleaning step (Step S20), as shown in FIG. 15E. Since the metal film 163 is covered by the exposed region covering portion 130, the metal film 163 is protected without being exposed to the cleaning liquid, as shown in FIG. 15E, while the cleaning liquid is supplied to the upper surface of the substrate W. That is, the exposed region covering portion 130 serves as a protective film which protects the metal film 163. In this way, the cleaning liquid can be supplied to the upper surface of the substrate W in a state where the metal film 163 exposed from the upper surface of the substrate W is appropriately protected, and the second removal target 204 can be removed from the substrate W.

In the subsequent processing film residue removing step (Step S11), the exposed region covering portion 130 of the processing film 100 can be dissolved in the removing liquid to smoothly remove the exposed region covering portion 130 from the upper surface of the substrate W.

According to the second embodiment, the same effects as those of the first embodiment are obtained.

Further, according to the second embodiment, the following effects are also obtained.

The non-exposed region covering portion 131 (the separation target film) is separated from the upper surface of the substrate W in a state in which the first removal target 203 is held by supplying the stripping liquid to the upper surface of the substrate W on which the processing film 100 is formed. Therefore, the first removal target 203 is removed from the upper surface of the substrate W. On the other hand, the second removal target 204 remains on the upper surface of the substrate W.

After that, the second removal target 204 is removed from the upper surface of the substrate W by the cleaning liquid, and then the exposed region covering portion 130 (the protective film) is removed from the upper surface of the substrate W by the removing liquid.

When the cleaning liquid is supplied to the upper surface of the substrate W, the exposed region 170 on the upper surface of the substrate W in which the metal film 163 is exposed is covered with the exposed region covering portion 130. Therefore, although the cleaning liquid used for removing the second removal target 204 has a property of oxidizing the metal film 163, the second removal target 204 can be removed without oxidizing the metal film 163.

Therefore, it is possible to efficiently remove a plurality of types of removal targets (the first removal target 203 and the second removal target 204) from the upper surface of the substrate W while oxidation of the metal film 163 is curbed.

When the exposed region covering portion 130 of the processing film 100 is dissolved in the removing liquid, the first removal target 203 released from the holding by the exposed region covering portion 130 may adhere again to the exposed region 170. According to the second embodiment, the processing film 100 is formed after the preprocessing film 200 having a relatively high removal capacity for removing the first removal target 203 present in the exposed region 170 is removed from the exposed region 170 by the separating. Therefore, most of the first removal target 203 is removed from the exposed region 170 before the processing film 100 is formed.

Therefore, also in a configuration in which the exposed region covering portion 130 is dissolved in the removing liquid and removed from the exposed region 170, it is possible to sufficiently suppress the remaining of the first removal target 203 in the exposed region 170.

Similar to the first embodiment, even when the substrate processing according to the second embodiment is performed on a substrate in which the specific substance exposed in the exposed region 170 is a metal other than copper or a nitride, the same effects as those of the second embodiment are obtained.

<Details of Processing Liquid>

Hereinafter, each of components in the processing liquid used in the above-described embodiment will be described.

In the following, the descriptions such as "$C_{x\ to\ y}$," "$C_x$ to $C_y$," and "$C_x$" mean the number of carbons in a molecule or substituent. For example, $C_{1\ to\ 6}$ alkyl means an alkyl chain having 1 to 6 carbons (methyl, ethyl, propyl, butyl, pentyl, hexyl, or the like).

When the polymer has a plurality of types of repeating units, the repeating units will be copolymerized. Unless otherwise specified, the copolymerization may be alternating copolymerization, random copolymerization, block copolymerization, graft copolymerization, or a mixture thereof. When a polymer or resin is represented by a structural formula, n, m, and the like which are also written in parentheses indicate the number of repetitions.

<Low-Solubility Component>

The low-solubility component (A) includes at least one of novolac, polyhydroxystyrene, polystyrene, polyacrylic acid derivatives, polymaleic acid derivatives, polycarbonate, polyvinyl alcohol derivatives, polymethacrylic acid derivatives, and copolymers of combinations thereof. Preferably, the low-solubility component (A) may include at least one of novolac, polyhydroxystyrene, polyacrylic acid derivatives, polycarbonates, polymethacrylic acid derivatives, and copolymers of combinations thereof. More preferably, the low-solubility component (A) may include at least one of novolac, polyhydroxystyrene, polycarbonate, and copolymers of combinations thereof. The novolac may be phenol novolac.

The processing liquid may include one or a combination of two or more of the above-described preferred examples as the low-solubility component (A). For example, the low-solubility component (A) may include both novolac and polyhydroxystyrene.

In a preferable aspect, the low-solubility component (A) is formed into a film by drying, and the film is separated while holding the removal target without being largely dissolved by the stripping liquid. It is permissible that only a small part of the low-solubility component (A) is dissolved by the stripping liquid.

Preferably, the low-solubility component (A) does not include fluorine and/or silicon, more preferably both of them.

The random copolymerization and the block copolymerization are preferable as the copolymerization.

Although there is no intention of limiting the scope of rights, specific examples of the low-solubility component (A) include compounds represented by the following Chemical Formulas 1 to 7.

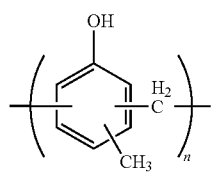

[Chemical Formula 1]

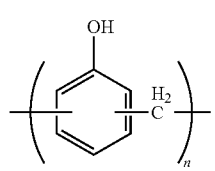

[Chemical Formula 2]

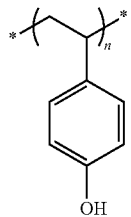

[Chemical Formula 3]

(An asterisk * indicates binding to an adjacent constituent unit.)

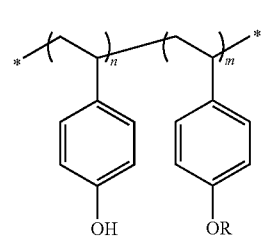

[Chemical Formula 4]

(R means a substituent such as $C_{1\ to\ 4}$ alkyl. An asterisk * indicates binding to an adjacent constituent unit.)

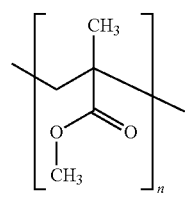

[Chemical Formula 5]

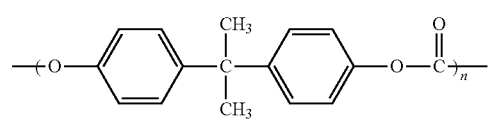

[Chemical Formula 6]

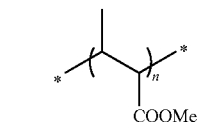

[Chemical Formula 7]

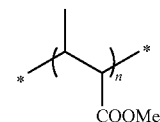

(Me means a methyl group. An asterisk * indicates binding to an adjacent constituent unit.)

A weight average molecular weight (Mw) of the low-solubility component (A) is preferably 150 to 500,000, more preferably 300 to 300,000, still more preferably 500 to 100,000, and even more preferably 1,000 to 50,000.

The low-solubility component (A) can be obtained by synthesizing. It can also be purchased. When the low-solubility component (A) is purchased, the following are examples of suppliers. It is also possible for the supplier to synthesize the polymer (A).

Novolac: Showa Kasei Co., Ltd., Asahi Organic Materials Co., Ltd., Gun Ei Chemical Industry Co., Ltd., Sumitomo Bakelite Co., Ltd.

Polyhydroxystyrene: Nippon Soda Co., Ltd., Maruzen Petrochemical Co., Ltd., Toho Chemical Industry Co., Ltd.

Polyacrylic acid derivative: Nippon Shokubai Co., Ltd.
Polycarbonate: Sigma-Aldrich Co. LLC
Polymethacrylic acid derivative: Sigma-Aldrich Co. LLC As compared with a total mass of the processing liquid, the low-solubility component (A) is 0.1 to 50 mass %, preferably 0.5 to 30 mass %, and more preferably 1 to 20 mass %, and still more preferably 1 to 10 mass %. That is, the total mass of the processing liquid is 100 mass %, and the low-solubility component (A) is 0.1 to 50 mass % based thereon. That is, "compared with" can be rephrased as "based on". Unless otherwise specified, the same applies to the following.

Solubility can be evaluated by a known method. For example, under conditions of 20° C. to 35° C. (more preferably 25±2° C.), whether or not (A) or (B) has been dissolved can be determined by adding 100 ppm of the above (A) or a (B) which will be described later to ammonia water of 5.0 mass % in a flask, covering the flask with a lid, and then shaking the flask with a shaker for 3 hours. The shaking may be stirring. Dissolution can also be visually determined. When it is not dissolved, the solubility is less than 100 ppm, and when it is dissolved, the solubility is 100 ppm or more. When the solubility is less than 100 ppm, it is insoluble or hardly soluble, and when the solubility is 100 ppm or more, it is soluble. In a broad sense, a soluble state includes a slightly soluble state. Among an insoluble state, a hardly soluble state, and a soluble state, insoluble state means that solubility lowest, hardly soluble state means that low solubility next. In a narrow sense, the slightly soluble state has lower solubility than the soluble state and has higher solubility than the hardly soluble state.

<High-Solubility Component>

A high-solubility component (B) is a crack-promoting component (B'). The crack-promoting component (B') includes a hydrocarbon and further includes a hydroxy group (—OH) and/or a carbonyl group (—C(=O)—). When the crack-promoting component (B') is a polymer, one of constituent units includes hydrocarbon for each unit and further has a hydroxy group and/or a carbonyl group. Examples of the carbonyl group include a carboxylic acid (—COOH), aldehyde, ketone, ester, amide, and ketene, and the carboxylic acid is preferable.

Although there is no intention to limit the scope of rights and it is not bound to a theory, when the processing liquid is dried to form the processing film on the substrate and the stripping liquid separates the processing film, it is considered that the high-solubility component (B) serves as a trigger which causes the processing film to be separated. Thus, preferably, the high-solubility component (B) has a higher solubility in the stripping liquid than the low-solubility component (A). An aspect in which the crack-promoting component (B') includes a ketone as a carbonyl group includes a ring-shaped hydrocarbon. Specific examples thereof include 1,2-cyclohexanedione and 1,3-cyclohexanedione.

As a more specific aspect, the high-solubility component (B) is a compound including 1 to 6 (preferably 1 to 4) following Chemical Formulas 8 as a constituent unit, and each of the constituent units is bonded with a linking group (a linker) $L_1$. Here, the linker $L_1$ may be a single bond or $C_{1\ to\ 6}$ alkylene. The $C_{1\ to\ 6}$ alkylene connects the constituent units as the linker and is not limited to divalent groups. It is preferably 2 to 4-valent. The $C_{1\ to\ 6}$ alkylene may be either linear or branched.

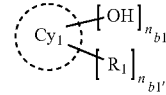

[Chemical Formula 8]

$Cy_1$ is a $C_{5\ to\ 30}$ hydrocarbon ring, preferably phenyl, cyclohexane or naphthyl, more preferably phenyl. In a preferred aspect, the linker $L_1$ connects a plurality of $Cy_1$s.

$R_1$ is independently $C_{1\ to\ 5}$ alkyl, preferably methyl, ethyl, propyl, or butyl. The $C_{1-5}$ alkyl may be linear or branched.

$n_{b1}$ is 1, 2 or 3, preferably 1 or 2, and more preferably 1.
$n_{b1'}$ is 0, 1, 2, 3 or 4, preferably 0, 1 or 2.

The following Chemical Formula 9 is a chemical formula in which the constituent unit described in Chemical Formula 8 is represented using a linker $L_9$. The linker $L_9$ is preferably a single bond, methylene, ethylene, or propylene.

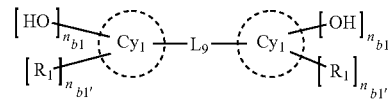

[Chemical Formula 9]

Although there is no intention to limit the scope of rights, preferred examples of the high-solubility component (B) include 2,2-bis(4-hydroxyphenyl)propane, 2,2'-methylenebis(4-methylphenol), 2,6-bis[(2-hydroxy-5-methylphenyl)methyl]-4-methylphenol, 1,3-cyclohexanediol, 4,4'-dihydroxybiphenyl, 2,6-naphthalenediol, 2,5-di-tert-butylhydroquinone, and 1,1,2,2-tetrakis(4-hydroxyphenyl)ethane. These may be obtained by polymerization or condensation.

2,6-bis[(2-hydroxy-5-methylphenyl)methyl]-4-methylphenol represented by the following Chemical Formula 10 will be taken up and described as an example. In the (B), the compound has three constituent units of Chemical Formula 8, the constituent units are linked with a linker $L_1$ (methylene). $n_{b1}=n_{b1'}=1$, and $R_1$ is methyl.

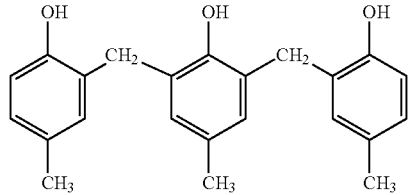

[Chemical Formula 10]

The high-solubility component (B) may have a molecular weight of 80 to 10,000. The high-solubility component preferably has a molecular weight of 90 to 5000, more preferably 100 to 3000. When the high-solubility component (B) is a resin, multimer or polymer, the molecular weight is represented by a weight average molecular weight (Mw).

The high-solubility component (B) is available both synthetically and purchased. Examples of suppliers thereof include Sigma-Aldrich Co. LLC, Tokyo Chemical Industry Co. Ltd., and Nippon Shokubai Co., Ltd.

In the processing liquid, the high-solubility component (B) is preferably 1 to 100 mass %, more preferably 1 to 50 mass % as compared with the mass of the low-solubility component (A). In the processing liquid, the high-solubility component (B) is still more preferably 1 to 30 mass % as compared with the mass of the low-solubility component (A).

<Solvent>

The solvent (C) preferably includes an organic solvent. The solvent (C) may be volatile. To have volatility means that it is more volatile than water. For example, a boiling point of the solvent (C) at 1 atm is preferably 50 to 250° C. The boiling point of the solvent at 1 atm is more preferably 50 to 200° C., more preferably 60 to 170° C. The boiling point of the solvent at 1 atm is even more preferably 70 to 150° C. It is also permissible for the solvent (C) to contain a small amount of pure water. The amount of pure water contained in the solvent (C) is preferably 30 mass % or less as compared with the whole solvent (C). The pure water contained in the solvent is more preferably 20 mass % or less, still more preferably 10 mass % or less. The pure water contained in the solvent is even more preferably 5 mass % or less. Also, in a preferable form, the solvent does not contain the pure water (0 mass %). The pure water is preferably DIW.

Examples of the organic solvent include alcohols such as isopropanol (IPA), ethylene glycol monoalkyl ethers such as ethylene glycol monomethyl ether and ethylene glycol monoethyl ether, ethylene glycol monoalkyl ether acetates such as ethylene glycol monomethyl ether acetate and ethylene glycol monoethyl ether acetate, propylene glycol monoalkyl ethers such as propylene glycol monomethyl ether (PGME) and propylene glycol monoethyl ether (PGEE), propylene glycol monoalkyl ether acetates such as propylene glycol monomethyl ether acetate (PGMEA) and propylene glycol monoethyl ether acetate, lactate esters such as methyl lactate and ethyl lactate (EL), aromatic hydrocarbons such as toluene and xylene, ketones such as methyl ethyl ketone, 2-heptanone and cyclohexanone, amides such as N,N-dimethylacetamide and N-methylpyrrolidone, lactones such as γ-butyrolactone, and the like. These organic solvents can be used alone or in admixture of two or more.

In a preferred aspect, the organic solvent contained in the solvent (C) is selected from IPA, PGME, PGEE, EL, PGMEA, or any combination thereof. When the organic solvent is a combination of two kinds, a volume ratio thereof is preferably 20:80 to 80:20, and more preferably 30:70 to 70:30.

The solvent (C) is 0.1 to 99.9 mass % as compared with a total mass of the processing liquid. The solvent (C) is preferably 50 to 99.9 mass %, more preferably 75 to 99.5 mass %, as compared with the total mass of the processing liquid. The solvent (C) is further preferably 80 to 99 mass %, and even more preferably 85 to 99 mass %, as compared with the total mass of the processing liquid.

<Other Additives>

The processing liquid of the disclosure may further contain other additives (D). As one aspect of the disclosure, the other additives (D) may include surfactants, acids, bases, antibacterial agents, fungicides, preservatives, or antifungal agents (preferably surfactants) and may include any combination thereof.

In a preferred aspect, the other additives (D) (in the case of a plurality, a sum thereof) are 0 to 100 mass % (preferably 0 to 10 mass %, more preferably 0 to 5 mass %, still more preferably 0 to 3 mass %, still more preferably 0 to 1 mass %) as compared with the mass of the low-solubility component (A) in the processing liquid. It is also one of the aspects of the disclosure that the processing liquid does not contain other additives (D) (0 mass %).

<Corrosion Prevention Component>

Examples of the corrosion prevention component (E) include a uric acid, caffeine, pterin, adenine, a glyoxylic acid, glucose, fructose, mannose and the like, in addition to BTA.

<Details of Preprocessing Liquid>

Hereinafter, each of the components in the preprocessing liquid used in the above-described embodiment will be described. The low-solubility component (A), the solvent (C), the other additives (D), and the corrosion prevention component (E) contained in the preprocessing liquid can be selected from those which can be used for the processing film.

The high-solubility component (B) contained in the preprocessing liquid is different from that contained in the processing liquid. The high-solubility component (B) contained in the preprocessing liquid is configured of a first component selected from those exemplified as the high-solubility component contained in the processing liquid, and a second component selected from the following (B-1) and (B-2). As a supplement, the above-described processing liquid contains only the first component as the high-solubility component (B).

(B-1) is represented by the following Chemical Formula 11.

[Chemical Formula 11]

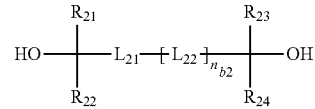

Each of $R_{21}$, $R_{22}$, $R_{23}$, and $R_{24}$ is independently hydrogen or $C_{1\ to\ 5}$ alkyl, preferably hydrogen, methyl, ethyl, t-butyl, or isopropyl, more preferably hydrogen, methyl, or ethyl, and still more preferably methyl, or ethyl.

A linker $L_{21}$ and a linker $L_{22}$ are independently $C_{1\ to\ 20}$ alkylene, $C_{1\ to\ 20}$ cycloalkylene, $C_{2\ to\ 4}$ alkenylene, $C_{2\ to\ 4}$ alkinylene, or $C_{6\ to\ 20}$ arylene. Groups thereof may be substituted with $C_{1\ to\ 5}$ alkyl or hydroxy. Here, alkenylene means a divalent hydrocarbon group having one or more double bonds, and alkynylene means a divalent hydrocarbon group having one or more triple bonds. The linker $L_{21}$ and the linker $L_{22}$ are preferably $C_{2\ to\ 4}$ alkylene, acetylene ($C_2$ alkynylene) or phenylene, more preferably $C_{2\ to\ 4}$ alkylene or acetylene, and still more preferably acetylene.

$n_{b2}$ is 0, 1 or 2, preferably 0 or 1, and more preferably 0.

Although there is no intention of limiting the scope of rights, preferred examples of (B-1) include 3,6-dimethyl-4-octyne-3,6-diol, and 2,5-dimethyl-3-hexyne-2,5-diol. Preferred examples of (B-1) of another type include 3-hexyne-2,5-diol, 1,4-butynediol, 2,4-hexadiin-1,6-diol, 1,4-butanediol, cis-1,4-dihydroxy-2-butene, and 1,4-benzenedimethanol.

(B-2) is a polymer including a constituent unit represented by the following Chemical Formula 12 and having a weight average molecular weight (Mw) of 500 to 10,000. Mw is preferably 600 to 5,000, and more preferably 700 to 3,000.

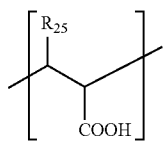

[Chemical Formula 12]

Here, $R_{25}$ is —H, —$CH_3$, or —COOH, preferably —H, or —COOH. It is also permissible for one (B-2) polymer to include two or more constituent units each of which is represented by Chemical Formula 12.

Although there is no intention of limiting the scope of rights, preferred examples of the polymer (B-2) include an acrylic acid, a maleic acid, or a polymer of a combination thereof. A polyacrylic acid and an acrylic acid maleic acid copolymer are more suitable examples.

In the case of copolymerization, it is preferably random copolymerization or block copolymerization, and more preferably random copolymerization.

As an example, the acrylic acid maleic acid copolymer represented by the following Chemical Formula 13 will be described. The copolymer is included in (B-2) and has two constituent units represented by Chemical Formula 12, and in one constituent unit, $R_{25}$ is —H, and in another constituent unit, $R_{25}$ is —COOH.

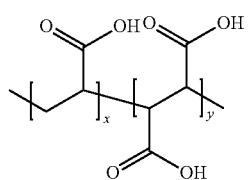

[Chemical Formula 13]

<Separating Experiment>

A separating experiment was conducted to peel the polymer film from the copper film to verify a separating state of a polymer film from a copper film and a change in a removal capacity to remove particles by changing a ratio of the first component to the second component of the high-solubility component in a polymer-containing liquid used as the processing liquid and the preprocessing liquid. The polymer film is a solid film formed by evaporating at least some of the solvent in the polymer-containing liquid.

First, a small piece-shaped substrate (a small piece substrate) having particles such as $SiO_2$ adhering to a surface thereof is prepared. The small piece substrate used was a quadrangular substrate having a side of 3 cm when viewed from the normal direction of the main surface and having a copper film formed on the entire surface.

The small piece substrate was placed on a rotatable mounting table, and the polymer-containing liquid was supplied to the surface of the small piece substrate to form a polymer film. Then, while the mounting table is rotated, diluted ammonia water ($dNH_4OH$ 1:68) was supplied to the surface (a main surface) of the small piece substrate to separate the polymer film. Then, the surface of the small piece substrate was rinsed with carbonated water, and then IPA was supplied to the surface of the small piece substrate to remove the residue of the polymer film. After the residue of the polymer film is removed, spin drying was performed by rotating the small piece substrate at a high speed. Then, a degree of particle removal (a removal capacity) was confirmed using a scanning electron microscope (SEM).

FIG. 16 is a table for explaining results of the separating experiment. In FIG. 16, a ratio between the first component and the second component of the high-solubility component in the polymer-containing liquid is shown as an addition amount. FIG. 16 shows the degree of particle removal when the ratio of the first component to the second component and the addition amount are changed.

"D" is given as an evaluation of the removal capacity to a combination of the addition amount of the first component and the addition amount of the second component in which the particles cannot be removed. Further, in FIG. 16, there was no combination in which the evaluation of the removal capacity was "D". Similarly, "C" is given as an evaluation of the removal capacity to a combination of the addition amount of the first component and the addition amount of the second component in which the particles are partially removed. "B" is given as an evaluation of the removal capacity to a combination of the addition amount of the first component and the addition amount of the second component in which the particles can be largely removed. When the particles can be removed, "A" is given as an evaluation of the removal capacity. Additionally, when the particles can be sufficiently removed, "AA" is given as an evaluation of the removal capacity.

For example, when the addition amount of the first component is 0.1 and the addition amount of the second component is 0.5, the ratio of the second component to the first component in the polymer-containing liquid is 5:1. Further, when the addition amounts of the first component and the second component are both 0.5, the ratio of the second component to the first component in the polymer-containing liquid is 1:1. When the addition amounts of the first component and the second component are both 3.0, the ratio of the second component to the first component in the polymer-containing liquid is also 1:1. The ratio of the high-solubility component (a total amount of the first component and the second component) in the polymer-containing liquid when the addition amounts of the first component and the second component are both 3.0 is 6 times the ratio of the high-solubility component (the total amount of the first component and the second component) in the polymer-containing liquid when the addition amounts of the first component and the second component are both 0.5.

As shown in FIG. 16, when the addition amount of the second component is 0, the evaluation of the removal capacity was "C", and when the addition amount of the first component is 0, the evaluation of the removal capacity was "B".

When the addition amount of the second component is smaller than the addition amount of the first component or when the addition amount of the second component is the same as the addition amount of the first component, the evaluation of the removal capacity was often "B".

For example, when the addition amount of the second component was 0.5 and the addition amount of the first component was 1.0, the evaluation of the removal capacity was "B". Even when the addition amounts of the second component and the first component were both 0.5, the evaluation of the removal capacity was "B". Even when the addition amounts of the second component and the first component were both 1.0, the evaluation of the removal capacity was "B". Further, when both the addition amount of the first component and the addition amount of the second component were 3.0, the evaluation of the removal capacity was "A".

When the addition amount of the second component was larger than the addition amount of the first component, the evaluation of the removal capacity was "A" or "AA" in all the experimental results.

From the above results, it is presumed that a polymer film including the first component and the second component as the high-solubility component has a higher removal capacity for removing particles from a copper film (a metal film) than a polymer film including only the first component as the high-solubility component. When the polymer film is used to remove particles from the copper film, it is suggested that it is preferable to prepare the polymer-containing liquid so that a content of the second component is higher than that of the first component.

Third Embodiment

Figure 17:
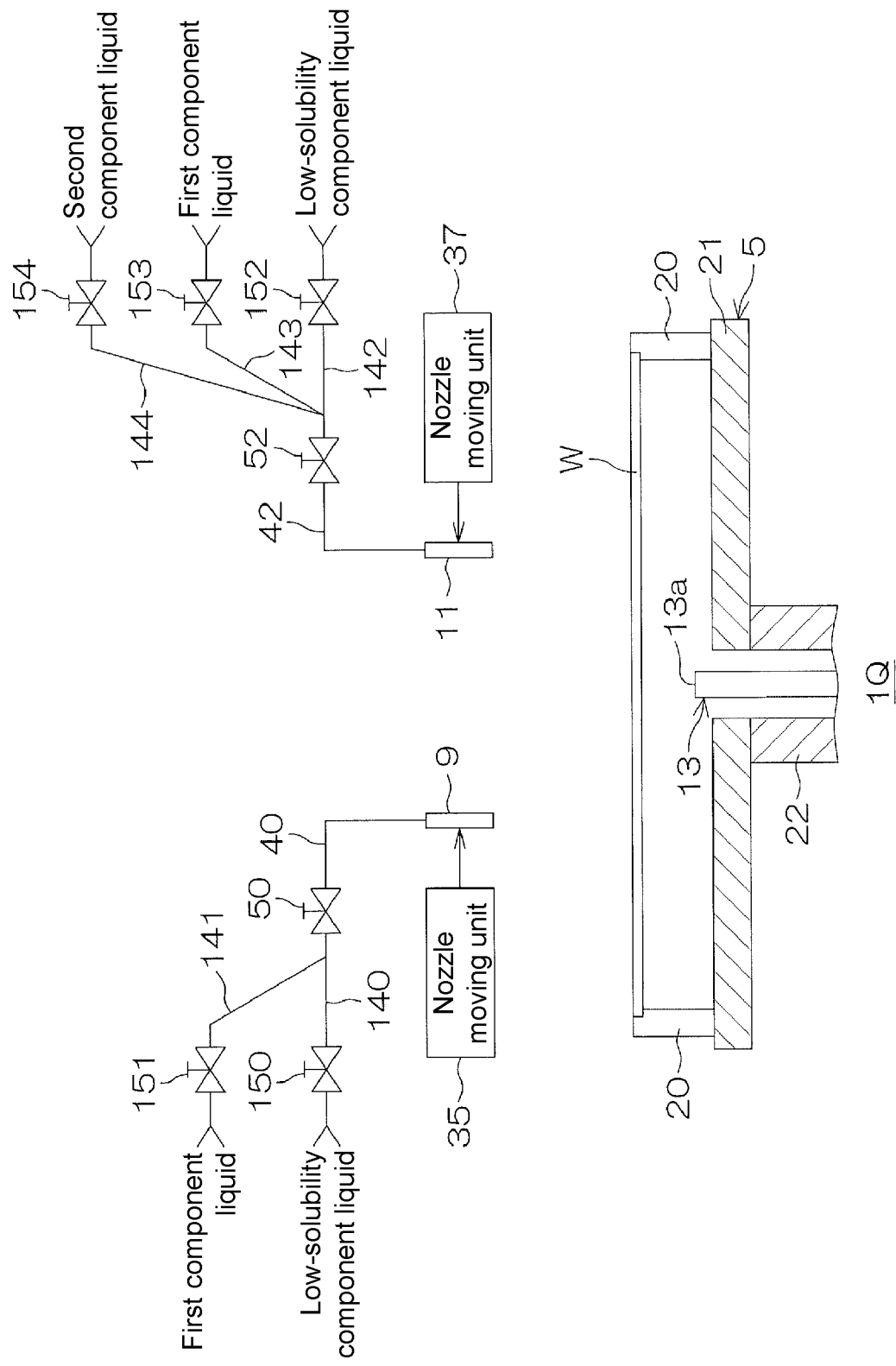
FIG. 17 is a schematic view of a first moving nozzle and a third moving nozzle of a processing unit provided in a substrate processing apparatus according to a third embodiment of the disclosure, and members therearound.

FIG. 17 is a schematic view of a first moving nozzle 9 and a third moving nozzle 11 of a processing unit 2 provided in a substrate processing apparatus 1Q according to a third embodiment of the disclosure, and members therearound. In FIG. 17, constituents equivalent to the constituents shown in FIGS. 1 to 16 described above are designated by the same reference numerals as those in FIG. 1 and the like, and the description thereof will be omitted. Similarly, in FIG. 18 which will be described later, the same reference numerals as those in FIG. 1 and the like are given, and the description thereof will be omitted.

Referring to FIG. 17, a main difference between the substrate processing apparatus 1Q according to the third embodiment and the substrate processing apparatus 1 according to the first embodiment (refer to FIG. 3) and the substrate processing apparatus 1P according to the second embodiment (refer to FIG. 11) is that in the substrate processing apparatus 1Q according to the third embodiment, a concentration of the high-solubility component contained in the processing liquid or the preprocessing liquid can be adjusted.

A processing liquid prepared by mixing a first component liquid which is a mixture of the first component of the high-solubility component and the solvent, and a low-solubility component liquid which is a mixture of the low-solubility component and the solvent is supplied to the first moving nozzle 9.

Specifically, a low-solubility component liquid pipe 140 and a first component liquid pipe 141 are commonly connected to the other end of the processing liquid pipe 40 of which one end is connected to the first moving nozzle 9. The low-solubility component liquid pipe 140 is connected to a low-solubility component liquid supply source, and the first component liquid pipe 141 is connected to a first component liquid supply source.

A low-solubility component liquid valve 150 which adjusts a flow rate of the low-solubility component liquid supplied from the low-solubility component liquid pipe 140 to the processing liquid pipe 40 is interposed in the low-solubility component liquid pipe 140. A first component liquid valve 151 which adjusts a flow rate of the first component liquid supplied from the first component liquid pipe 141 to the processing liquid pipe 40 is interposed in the first component liquid pipe 141.

A concentration of the first component in the processing liquid flowing through the processing liquid pipe 40 can be changed by changing an opening degree of the low-solubility component liquid valve 150 and the first component liquid valve 151.

A processing liquid prepared by mixing the first component liquid which is a mixture of the first component of the high-solubility component and the solvent, a second component liquid which is a mixture of the second component of the high-solubility component and the solvent, and the low-solubility component liquid which is a mixture of the low-solubility component and the solvent is supplied to the third moving nozzle 11.

Specifically, a low-solubility component liquid pipe 142, a first component liquid pipe 143, and a second component liquid pipe 144 are commonly connected to the other end of the preprocessing liquid pipe 42 of which one end is connected to the third moving nozzle 11. The low-solubility component liquid pipe 142 is connected to a low-solubility component liquid supply source. The first component liquid pipe 143 is connected to a first component liquid supply source. The second component liquid pipe 144 is connected to a second component liquid supply source.

A low-solubility component liquid valve 152 which adjusts a flow rate of the low-solubility component liquid supplied from the low-solubility component liquid pipe 142 to the preprocessing liquid pipe 42 is interposed in the low-solubility component liquid pipe 142. A first component liquid valve 153 which adjusts a flow rate of the first component liquid supplied from the first component liquid pipe 143 to the preprocessing liquid pipe 42 is interposed in the first component liquid pipe 143. A second component liquid valve 154 which adjusts a flow rate of the second component liquid supplied from the second component liquid pipe 144 to the preprocessing liquid pipe 42 is interposed in the second component liquid pipe 144.

The concentration of the first component and the concentration of the second component in the preprocessing liquid flowing through the preprocessing liquid pipe 42 can be changed by changing an opening degree of the low-solubility component liquid valve 152, the first component liquid valve 153, and the second component liquid valve 154.

In the substrate processing apparatus 1Q, a recipe selection processing for selecting a recipe R on the basis of information about the upper surface of the substrate W is performed before the substrate processing is performed on the substrate W.

The plurality of recipes R stored in the auxiliary storage device 3e shown in FIG. 4 include a first recipe R1 and a second recipe R2 having different processing contents.

The first recipe R1 is a recipe R for performing a first substrate processing method which removes the removal target from the substrate W using the processing liquid. The first substrate processing method is a substrate processing method (for example, a substrate processing method according to a fourth embodiment which will be described later) in which the preprocessing liquid supply step (Step S2) to the preprocessing film residue removing step (Step S6) are omitted in the substrate processing according to the first embodiment or the second embodiment. That is, in the first substrate processing method, an operation in which the removal target 103 (the first removal target 203) is removed using the preprocessing liquid is not performed, but only an operation in which the removal target 103 (the first removal target 203) is removed using the processing liquid is performed.

The second recipe R2 is a recipe for performing a second substrate processing method which removes the removal target 103 (the first removal target 203) from the substrate W using the processing liquid after the removal target 103 (the first removal target 203) is removed from the substrate W using the preprocessing liquid. The second substrate processing method is the substrate processing according to the first embodiment or the substrate processing according to the second embodiment.

The second recipe R2 is prepared for each type of specific substance exposed from the substrate W. The concentration of the second component contained in the preprocessing liquid is changed according to the type of the specific substance. That is, the concentration of the second component in the preprocessing liquid used in the second substrate processing method is set according to the type of the specific substance. Specifically, in each of the second recipes R2, the opening degrees of the low-solubility component liquid valve 152, the first component liquid valve 153, and the second component liquid valve 154 when the preprocessing liquid is supplied to the upper surface of the substrate W are set according to the type of the specific substance.

Figure 18:
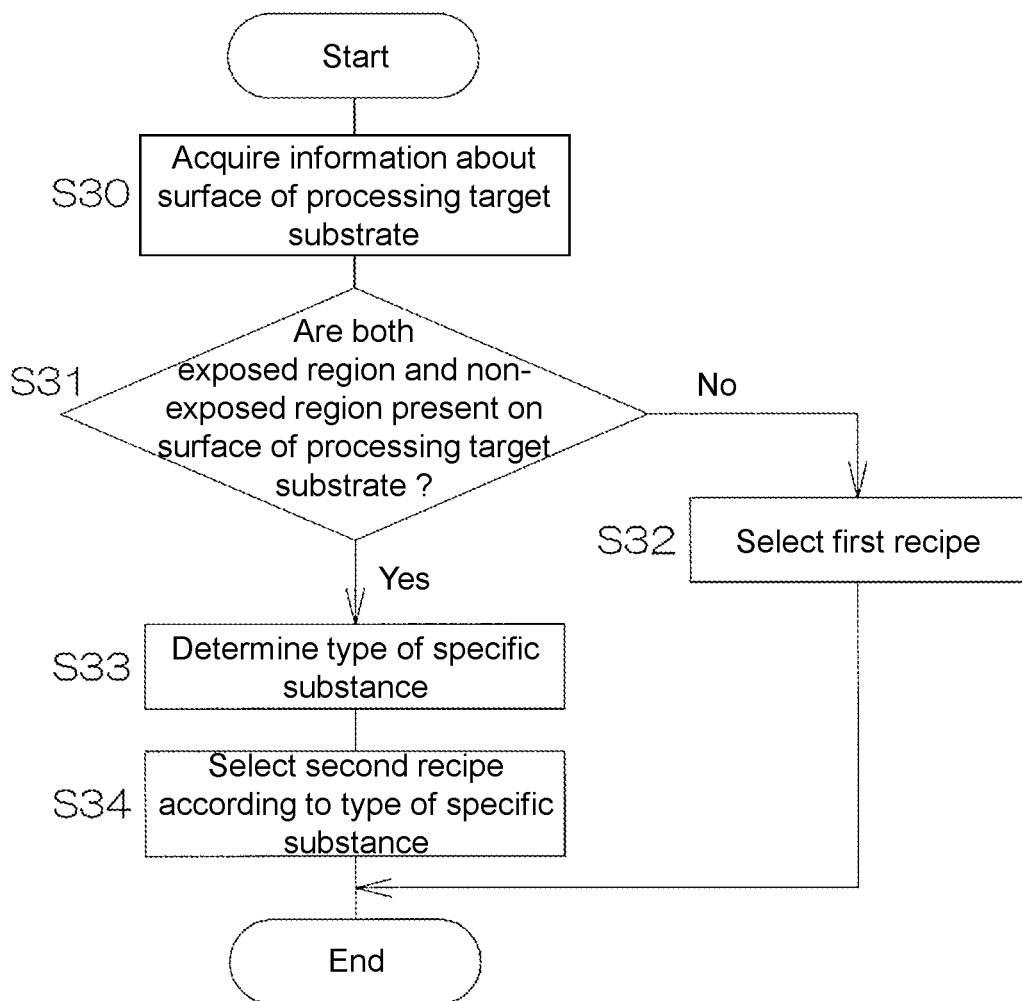
FIG. 18 is a flowchart for explaining an example of recipe selection processing performed for selecting a recipe in the substrate processing apparatus according to the third embodiment.

FIG. 18 is a flowchart for explaining an example of the recipe selection processing. First, the controller 3 acquires information about the surface of the substrate W to be processed (a processing target substrate) (an information acquisition step: Step S30). The information about the surface of the substrate W may be acquired on the basis of information input by a user using the input device 3A, or may be configured to read the information from a sign such as a bar code set on the substrate W.

After Step S30, the controller 3 determines whether the substrate W is a substrate having both the exposed region 170 and the non-exposed region 171 or a substrate having a surface in which only the non-exposed region 171 is present on the basis of the information about the surface of the substrate W acquired in the information acquisition step (a surface determination step: Step S31).

In Step S31, when it is determined that the substrate W is the substrate having the surface in which only the non-exposed region 171 is present (Step S31: NO), the controller 3 selects the first recipe R1 (a recipe selection step: Step S32). The controller 3 sets the selected first recipe R1 in the main storage device 3c and then performs the first substrate processing method.

On the other hand, in Step S31, when it is determined that the substrate W is the substrate having the surface in which both the exposed region 170 and the non-exposed region 171 are present (Step S31: YES), the controller 3 determines the type of the specific substance exposed from the surface of the substrate W on the basis of the information about the surface of the substrate W acquired in the information acquisition step (a type determination step: Step S33). After Step S33, the controller 3 selects the second recipe R2 on the basis of the type of specific substance exposed from the surface of the substrate W (a recipe selection step: Step S34). The controller 3 sets the selected second recipe R2 in the main storage device 3c and then performs the second substrate processing method.

According to the third embodiment, when only the non-exposed region 171 is present on the upper surface of the substrate W, the first recipe R1 which performs the first substrate processing method is selected, and when both the exposed region 170 and the non-exposed region 171 are present on the upper surface of the substrate W, the second recipe R2 which performs the second substrate processing method is selected. Therefore, an appropriate substrate processing method can be performed according to a state of the upper surface of the substrate W.

When both the exposed region 170 and the non-exposed region 171 are present on the upper surface of the substrate W, the second recipe R2 suitable for removing the removal target 103 (the first removal target 203) from the exposed region 170 can be selected according to the type of the specific substance.

Figure 19:
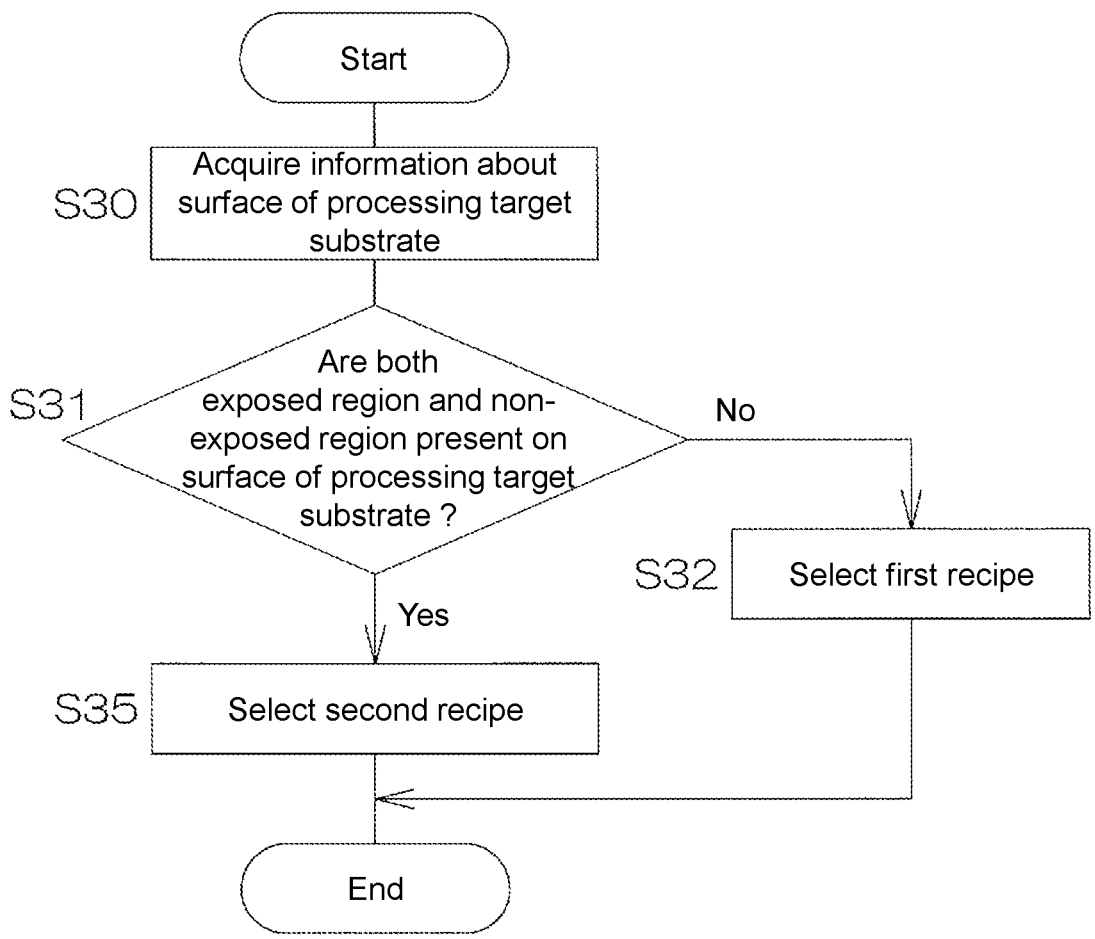
FIG. 19 is a flowchart for explaining another example of the recipe selection processing in the substrate processing apparatus according to the third embodiment.

In the third embodiment, the second recipe R2 is prepared for each type of the specific substance exposed from the substrate W. However, the second recipe R2 may not be provided for each type of the specific substance, and a common second recipe R2 may be used regardless of the specific substance. In this case, as shown in FIG. 19, in the recipe selection processing, when it is determined that the substrate W is the substrate having the surface in which both the exposed region 170 and the non-exposed region 171 are present (Step S31: YES), the second recipe R2 is selected without determining the type of the specific substance (a recipe selection step: Step S35).

Fourth Embodiment

Figure 20:
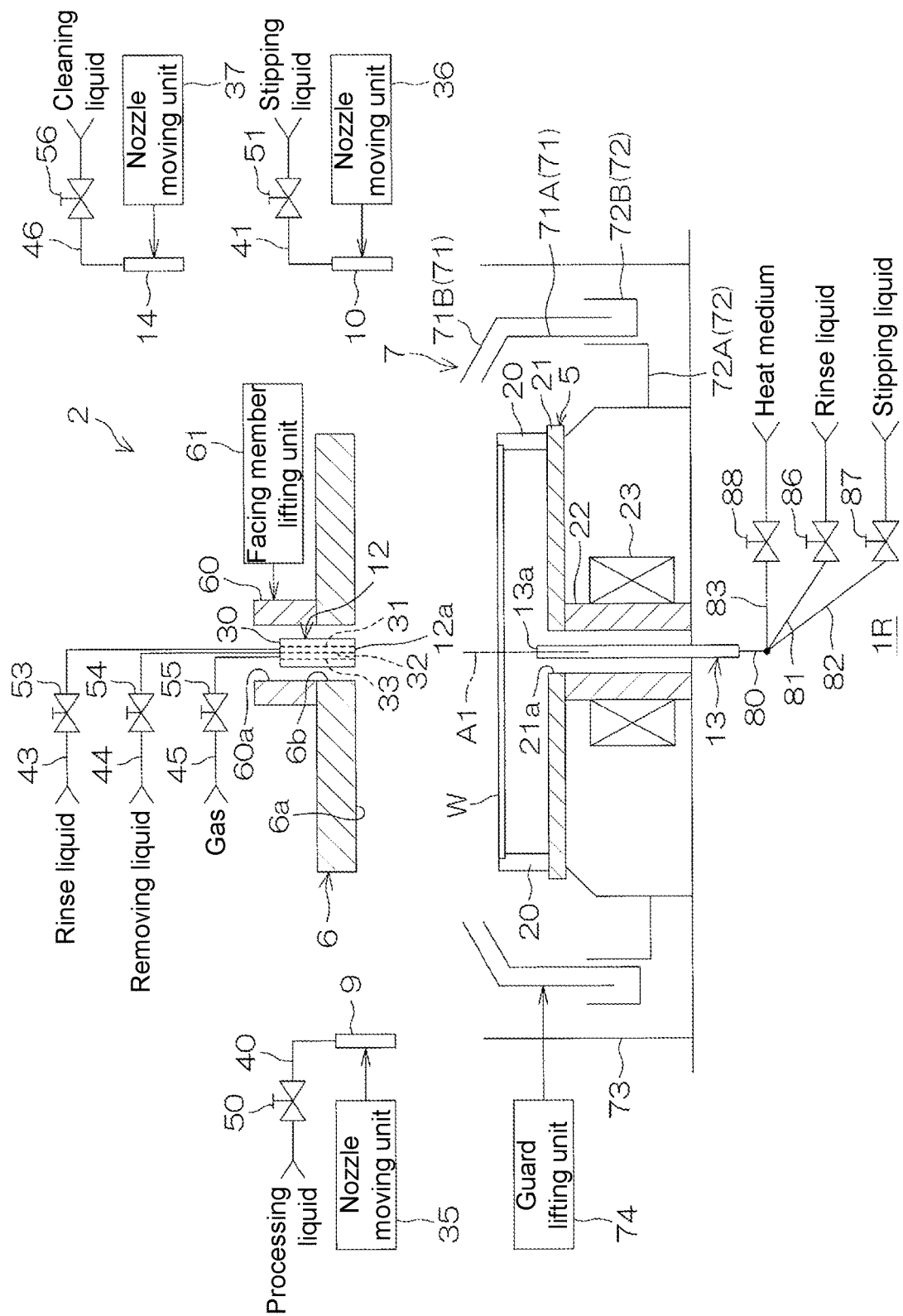
FIG. 20 is a schematic partial cross-sectional view showing a schematic configuration of a processing unit provided in a substrate processing apparatus according to a fourth embodiment.

FIG. 20 is a schematic partial cross-sectional view showing a schematic configuration of a processing unit 2 provided in a substrate processing apparatus 1R according to a fourth embodiment. In FIG. 20, constituents equivalent to the constituents shown in FIGS. 1 to 19 described above are designated by the same reference numerals as those in FIG. 1 and the like, and the description thereof will be omitted. Similarly, in FIGS. 21 to 24D which will be described later, the same reference numerals as those in FIG. 1 and the like are given, and the description thereof will be omitted.

In the fourth embodiment, the non-exposed region covering portion 131 of the processing film 100 may be referred to as a separation target film 100A, and the exposed region covering portion 130 of the processing film 100 may be referred to as a protective film 100B. The substrate W processed by the substrate processing apparatus 1R according to the fourth embodiment is the substrate W shown in FIG. 12.

Therefore, although detailed description will be omitted, the first removal target 203 adheres to both the non-exposed region 171 and the exposed region 170, and the second removal target 204 adheres to the non-exposed region 171.

Referring to FIG. 20, a main difference between the substrate processing apparatus 1R according to the fourth embodiment and the substrate processing apparatus 1 according to the first embodiment (refer to FIG. 3) is that a nozzle for discharging the preprocessing liquid (the third moving nozzle 11) is not provided and a nozzle for discharging the cleaning liquid (the fourth moving nozzle 14) is provided at the substrate processing apparatus 1Q according to the fourth embodiment.

Figure 21:
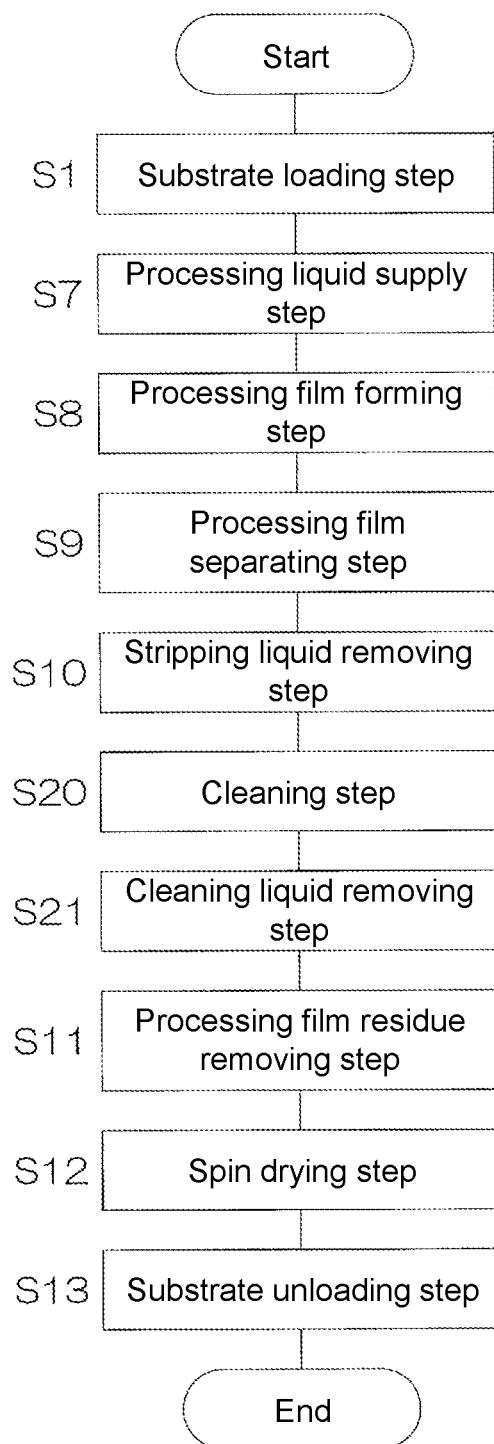
FIG. 21 is a flowchart for explaining an example of substrate processing by the substrate processing apparatus according to the fourth embodiment.

FIG. 21 is a flowchart for explaining an example of substrate processing by the substrate processing apparatus 1R according to the fourth embodiment. FIGS. 22A to 22D are schematic views for explaining a status near the surface of the substrate W during the substrate processing by the substrate processing apparatus 1R.

As shown in FIG. 20, the substrate processing apparatus 1R performs the substrate processing in which the preprocessing liquid supply step (Step S2) to the preprocessing film residue removing step (Step S6) are omitted from the substrate processing (refer to FIG. 13) by the substrate processing apparatus 1P according to the second embodiment.

Hereinafter, the substrate processing according to the fourth embodiment will be described in detail with reference to FIGS. 6G to 6M, FIGS. 14A, 14B, and FIGS. 22A to 22D.

First, the substrate W after the dry etching processing is loaded from the carrier C into the processing unit 2 by the transfer robots IR and CR (refer to FIG. 1) and is sent to the spin chuck 5 (Step S1). Thus, the substrate W is held horizontally by the spin chuck 5 (a substrate holding step). The substrate W is held so that the pattern surface 165 is the upper surface. When the substrate W is loaded, the facing member 6 is retracted to the upper position.

The holding of the substrate W due to the spin chuck 5 is continued until the spin drying step (Step S12) is completed. The guard lifting unit 74 adjusts the height positions of the first guard 71A and the second guard 71B so that at least one guard 71 is located at the upper position from the start of the substrate holding step to the end of the spin drying step (Step S12).

Next, after the transfer robot CR is retracted to the outside of the processing unit 2, the processing liquid supply step (Step S2) starts. In the processing liquid supply step, first, the spin motor 23 rotates the spin base 21. Thus, the horizontally held substrate W is rotated (a substrate rotating step).

The first nozzle moving unit 35 moves the first moving nozzle 9 to the processing position in a state in which the facing member 6 is located at the upper position. The processing position of the first moving nozzle 9 is, for example, the central position. Then, the processing liquid valve 50 is opened. Thus, the processing liquid is supplied (discharged) from the first moving nozzle 9 toward the central region of the upper surface of the rotating substrate W (a processing liquid supply step, a processing liquid discharge step) (refer to FIG. 6G). Thus, a liquid film 101 (a processing liquid film) of the processing liquid is formed on the substrate W (a processing liquid film forming step).

The supply of the processing liquid from the first moving nozzle 9 is continued for a predetermined time, for example, 2 to 4 seconds. In the processing liquid supply step, the substrate W is rotated at a predetermined processing liquid rotation speed, for example, 10 rpm to 1500 rpm.

Next, the processing film forming step (Step S8) is performed. In the processing film forming step, the processing liquid on the substrate W is solidified or cured, and the processing film 100 (refer to FIG. 22A) which holds the first removal target 203 present on the substrate W is formed on the upper surface of the substrate W.

In the processing film forming step, first, a processing liquid thinning step (a processing liquid spin-off step) in which a thickness of the liquid film 101 of the processing liquid is thinned on the substrate W is performed. Specifically, the processing liquid valve 50 is closed. Thus, the supply of the processing liquid to the substrate W is stopped. Then, the first moving nozzle 9 is moved to the home position by the first nozzle moving unit 35.

In the processing liquid thinning step, some of the processing liquid is excluded from the upper surface of the substrate W by a centrifugal force in a state in which the supply of the processing liquid to the upper surface of the substrate W is stopped so that the thickness of the liquid film 101 on the substrate W becomes an appropriate thickness (refer to FIG. 6H).

Even after the first moving nozzle 9 moves to the home position, the facing member 6 is maintained in the upper position.

In the processing liquid thinning step, the spin motor 23 changes the rotation speed of the substrate W to a predetermined processing liquid thinning speed. The processing liquid thinning speed is, for example, 300 rpm to 1500 rpm. The rotation speed of the substrate W may be kept constant within a range of 300 rpm to 1500 rpm, or may be appropriately changed within the range of 300 rpm to 1500 rpm during the processing liquid thinning step. The processing liquid thinning step is performed for a predetermined time, for example, 30 seconds.

In the processing film forming step, after the processing liquid thinning step, a processing liquid solvent evaporating step in which some of the solvent is evaporated (volatilized) from the liquid film 101 of the processing liquid is performed. In the processing liquid solvent evaporating step, the liquid film 101 on the substrate W is heated to evaporate some of the solvent of the processing liquid on the substrate W.

Specifically, the facing member lifting unit 61 moves the facing member 6 to the proximity position between the upper position and the lower position (refer to FIG. 6I).

Then, the gas valve 55 is opened. Thus, a gas is supplied to the space between the upper surface of the substrate W (the upper surface of the liquid film 101) and the facing surface 6a of the facing member 6 (a gas supply step).

The evaporation (volatilization) of the solvent in the liquid film 101 is promoted by spraying the gas onto the liquid film 101 on the substrate W (a processing liquid solvent evaporating step, a processing liquid solvent evaporation promoting step). Therefore, a time required for forming the processing film 100 (refer to FIG. 22A) can be shortened. The central nozzle 12 serves as an evaporation unit (an evaporation promoting unit) which evaporates the solvent in the processing liquid.

Also, the heat medium valve 88 is opened. Thus, the heat medium is supplied (discharged) from the lower surface nozzle 13 toward the central region of the lower surface of the rotating substrate W (a heat medium supply step, a heat medium discharge step). The heat medium supplied from the lower surface nozzle 13 to the lower surface of the substrate W receives a centrifugal force, spreads radially, and spreads over the entire lower surface of the substrate W. The supply of the heat medium to the substrate W is continued for a predetermined time, for example, 60 seconds. In the processing liquid solvent evaporating step, the substrate W is rotated at a predetermined evaporation rotation speed, for example, 1000 rpm.

The liquid film 101 on the substrate W is heated via the substrate W by supplying the heat medium to the lower surface of the substrate W. Therefore, the evaporation (volatilization) of the solvent in the liquid film 101 is promoted (a processing liquid solvent evaporating step, a processing liquid solvent evaporation promoting step). Thus, the time required for forming the processing film 100 (refer to FIG. 22A) can be shortened. The lower surface nozzle 13 serves as the evaporation unit (the evaporation promoting unit) which evaporates (volatilizes) the solvent in the processing liquid.

Figure 22A:
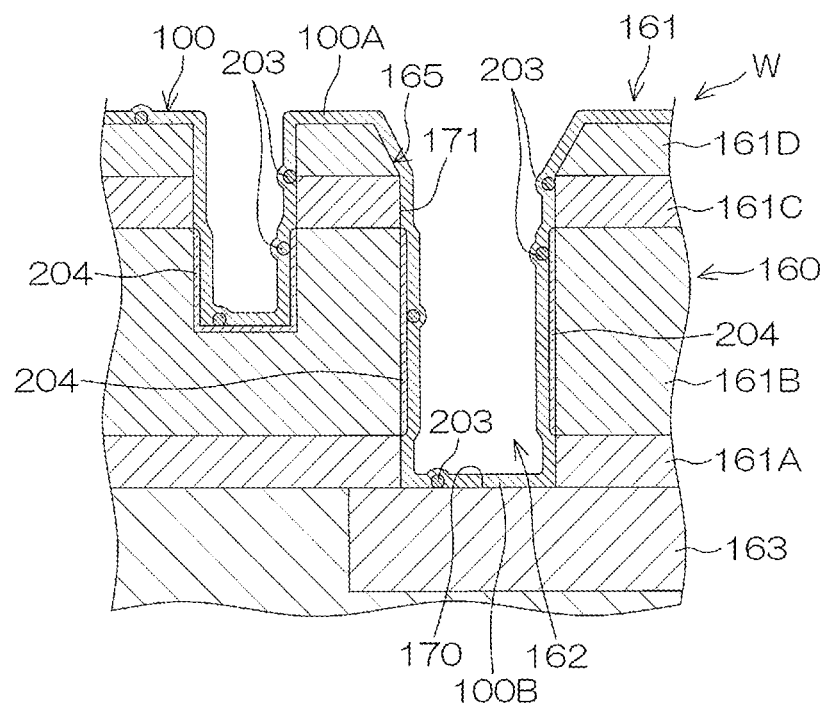
FIG. 22A is a schematic view for explaining a status near a surface of a substrate in a state in which the processing film is formed by performing the processing film forming step (Step S8) in substrate processing according to the fourth embodiment.

The processing liquid is solidified or cured by performing the processing liquid thinning step and the processing liquid solvent evaporating step. Thus, as shown in FIG. 22A, the processing film 100 which holds the first removal target 203 is formed on the entire upper surface of the substrate W. In this way, the substrate rotating unit (the spin motor 23), the central nozzle 12, and the lower surface nozzle 13 constitute a processing film forming unit (a film forming unit) which solidifies or cures the processing liquid to form a solid film (the processing film 100).

In the processing liquid solvent evaporating step, preferably, the substrate W is heated so that a temperature of the processing liquid on the substrate W is lower than the boiling point of the solvent. The solvent can appropriately remain in the processing film 100 by heating the processing liquid to a temperature lower than the boiling point of the solvent. Thus, in the subsequent processing film separating step (Step S9), the stripping liquid can be easily compatible with the processing film 100 as compared with the case in which the solvent does not remain in the processing film 100.

Next, the processing film separating step (Step S9) is performed. The processing film separating step is a separation target film separating step in which the separation target film 100A (the non-exposed region covering portion 131) is separated without separating the protective film 100B (the exposed region covering portion 130). Specifically, the heat medium valve 88 is closed. Thus, the supply of the heat medium to the lower surface of the substrate W is stopped. Also, the gas valve 55 is closed. Thus, the supply of the gas to the space between the facing surface 6a of the facing member 6 and the upper surface of the substrate W is stopped.

Then, the facing member lifting unit 61 moves the facing member 6 to the upper position. The second nozzle moving unit 36 moves the second moving nozzle 10 to the processing position in a state in which the facing member 6 is located at the upper position.

Then, the upper stripping liquid valve 51 is opened in a state in which the second moving nozzle 10 is located at the processing position. Therefore, the stripping liquid is supplied (discharged) from the second moving nozzle 10 toward the central region of the upper surface of the rotating substrate W (an upper stripping liquid supply step, an upper stripping liquid discharge step) (refer to FIG. 6J). The stripping liquid supplied to the upper surface of the substrate W spreads over the entire upper surface of the substrate W by a centrifugal force. In the separation target film separating step, the substrate W is rotated at a predetermined separation target film separating rotation speed, for example, 800 rpm.

At the same time when the upper stripping liquid valve 51 is opened, the lower stripping liquid valve 87 is opened. Thus, the stripping liquid is supplied (discharged) from the lower surface nozzle 13 toward the central region of the lower surface of the rotating substrate W (a lower stripping liquid supply step, a lower stripping liquid discharge step). The stripping liquid supplied to the lower surface of the substrate W spreads over the entire lower surface of the substrate W due to a centrifugal force.

Figure 22B:
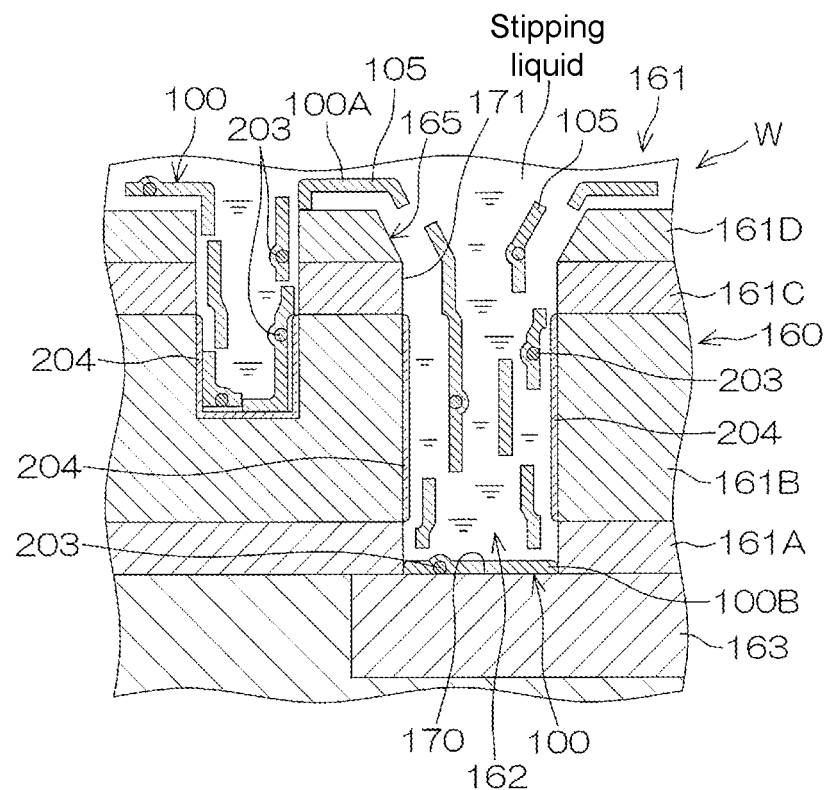
FIG. 22B is a schematic view for explaining a status near the surface of the substrate during the performance of the processing film separating step (Step S9) in the substrate processing according to the fourth embodiment.

As shown in FIG. 22B, the separation target film 100A and the first removal target 203 are separated from the non-exposed region 171 on the upper surface of the substrate W due to a separating action of the stripping liquid by supplying the stripping liquid to the upper surface of the substrate W. The separation target film 100A splits into film pieces 105 when it is separated from the upper surface of the substrate W.

After the separation target film 100A is separated, the film pieces 105 of the separation target film 100A are excluded to the outside of the substrate W together with the stripping liquid by continuing to supply the stripping liquid to the upper surface of the substrate W. Thus, the film pieces 105 of the separation target film 100A in a state in which they hold the first removal target 203 are removed from the upper surface of the substrate W.

While the separation target film 100A is separated from the non-exposed region 171, the protective film 100B which covers (protects) the exposed region 170 in the processing film 100 is maintained in a state in which it covers the exposed region 170 without being separated.

Then, after the processing film separating step (Step S9), the stripping liquid removing step (step S10) in which the stripping liquid is removed from the substrate W is performed by supplying the rinse liquid. Specifically, the upper stripping liquid valve 51 and the lower stripping liquid valve 87 are closed. Thus, the supply of the stripping liquid to the upper surface and the lower surface of the substrate W is stopped. Then, the second nozzle moving unit 36 moves the second moving nozzle 10 to the home position. Then, the facing member lifting unit 61 moves the facing member 6 to the processing position (refer to FIG. 6K).

Then, the upper rinse liquid valve 53 is opened in a state in which the facing member 6 is located at the processing position. Thus, the rinse liquid is supplied (discharged) from the central nozzle 12 toward the central region of the upper surface of the rotating substrate W (an upper rinse liquid supply step, an upper rinse liquid discharge step).

In the stripping liquid removing step, the substrate W is rotated at a predetermined stripping liquid removing rotation speed, for example, 800 rpm.

The rinse liquid supplied to the upper surface of the substrate W spreads over the entire upper surface of the substrate W by a centrifugal force. Thus, the stripping liquid adhering to the upper surface of the substrate W is washed away with the rinse liquid (a rinsing step).

Further, at the same time when the upper rinse liquid valve 53 is opened, the lower rinse liquid valve 86 is opened. Thus, the rinse liquid is supplied (discharged) from the lower surface nozzle 13 toward the central region of the lower surface of the rotating substrate W (a lower rinse liquid supply step, a lower rinse liquid discharge step). Thus, the stripping liquid adhering to the lower surface of the substrate W is washed away with the rinse liquid. The supply of the rinse liquid to the upper surface and the lower surface of the substrate W is continued for a predetermined time, for example, 35 seconds.

Next, a cleaning step (Step S20) in which the second removal target 204 adhering to the upper surface of the substrate W is removed and the upper surface of the substrate W is cleaned is performed. Specifically, the upper rinse liquid valve 53 and the lower rinse liquid valve 86 are closed. Thus, the supply of the rinse liquid to the upper surface and the lower surface of the substrate W is stopped.

Then, the facing member lifting unit 61 moves the facing member 6 to the upper position. The fourth nozzle moving unit 38 moves the fourth moving nozzle 14 to the processing position (for example, the central position) in a state in which the facing member 6 is located at the upper position.

Then, the cleaning liquid valve 56 is opened in a state in which the fourth moving nozzle 14 is located at the processing position. Thus, the cleaning liquid is supplied (discharged) from the fourth moving nozzle 14 toward the central region of the upper surface of the rotating substrate W (a cleaning liquid supply step, a cleaning liquid discharge step) (refer to FIG. 14A). The cleaning liquid supplied to the upper surface of the substrate W spreads over the entire upper surface of the substrate W by a centrifugal force. In the cleaning step, the substrate W is rotated at a predetermined cleaning rotation speed. The cleaning rotation speed is, for example, a speed in a range of 10 rpm to 1000 rpm. The cleaning rotation speed is preferably 800 rpm.

Figure 22C:
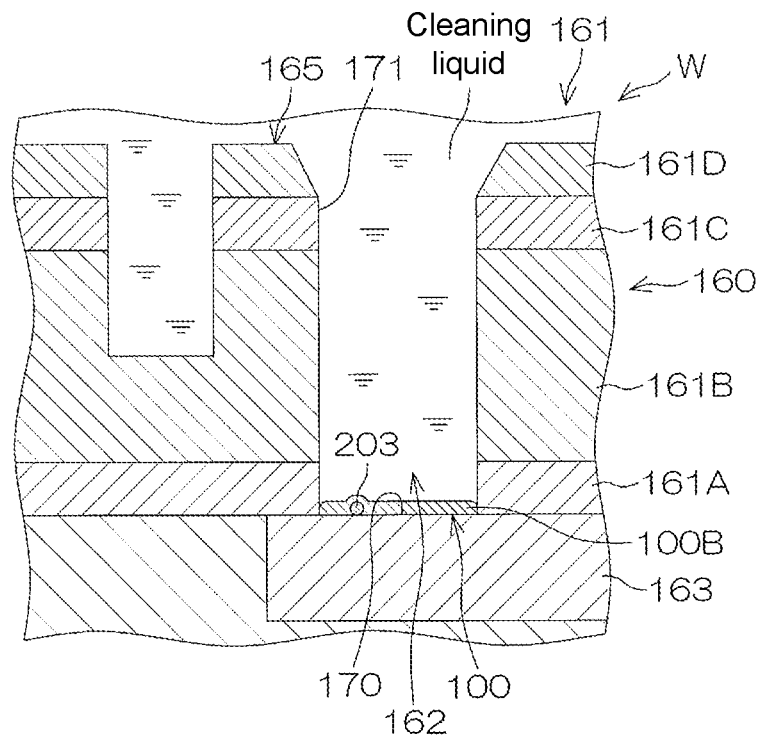
FIG. 22C is a schematic view for explaining a state near the surface of the substrate during the performance of the cleaning step (Step S20) in the substrate processing according to the fourth embodiment.

The cleaning liquid supplied to the upper surface of the substrate W receives a centrifugal force, spreads radially, and spreads over the entire upper surface of the substrate W. Thus, the rinse liquid on the upper surface of the substrate W is replaced with the cleaning liquid. As shown in FIG. 22C, the cleaning liquid supplied to the upper surface of the substrate W dissolves the second removal target 204 (refer to FIG. 22B) present on the upper surface of the substrate W.

The cleaning liquid in which the second removal target 204 is dissolved is discharged from the peripheral edge of the upper surface of the substrate W.

After the cleaning step (step S20), a cleaning liquid removing step (Step S21) in which the cleaning liquid is removed from the substrate W is performed by supplying the rinse liquid. Specifically, the cleaning liquid valve 56 is closed. Thus, the supply of the cleaning liquid to the upper surface of the substrate W is stopped. Then, the fourth nozzle moving unit 38 moves the fourth moving nozzle 14 to the home position. Then, the facing member lifting unit 61 moves the facing member 6 to the processing position (refer to FIG. 14B).

Then, the upper rinse liquid valve 53 is opened in a state in which the facing member 6 is located at the processing position. Thus, the rinse liquid is supplied (discharged) from the central nozzle 12 toward the central region of the upper surface of the rotating substrate W (an upper rinse liquid supply step, an upper rinse liquid discharge step). In the cleaning liquid removing step, the substrate W is rotated at a predetermined cleaning liquid removing rotation speed, for example, 800 rpm.

The rinse liquid supplied to the upper surface of the substrate W spreads over the entire upper surface of the substrate W by a centrifugal force. Thus, the cleaning liquid adhering to the upper surface of the substrate W is washed away with the rinse liquid.

Further, at the same time when the upper rinse liquid valve 53 is opened, the lower rinse liquid valve 86 is opened. Therefore, the rinse liquid is supplied (discharged) from the lower surface nozzle 13 toward the central region of the lower surface of the rotating substrate W (a lower rinse liquid supply step, a lower rinse liquid discharge step). Thus, even when the cleaning liquid intrudes from the upper surface of the substrate W to the lower surface of the substrate W and the cleaning liquid adheres to the lower surface of the substrate W, the cleaning liquid adhering to the lower surface of the substrate W is washed away with the rinse liquid. The supply of the rinse liquid to the upper surface and the lower surface of the substrate W is continued for a predetermined time, for example, 35 seconds.

Next, the processing film residue removing step (Step S11) is performed. The processing film residue removing step is also a protective film removing step in which the protective film 100B is removed. Specifically, the upper rinse liquid valve 53 and the lower rinse liquid valve 86 are closed. Thus, the supply of the rinse liquid to the upper surface and the lower surface of the substrate W is stopped.

Then, the removing liquid valve 54 is opened in a state in which the facing member 6 is located at the processing position. Thus, the removing liquid is supplied (discharged) from the central nozzle 12 toward the central region on the upper surface of the rotating substrate W (a removing liquid supply step, a removing liquid discharge step) (refer to FIG. 6L). The supply of the removing liquid to the upper surface of the substrate W is continued for a predetermined time, for example, 30 seconds. In the protective film removing step, the substrate W is rotated at a predetermined removing rotation speed, for example, 300 rpm.

Figure 22D:
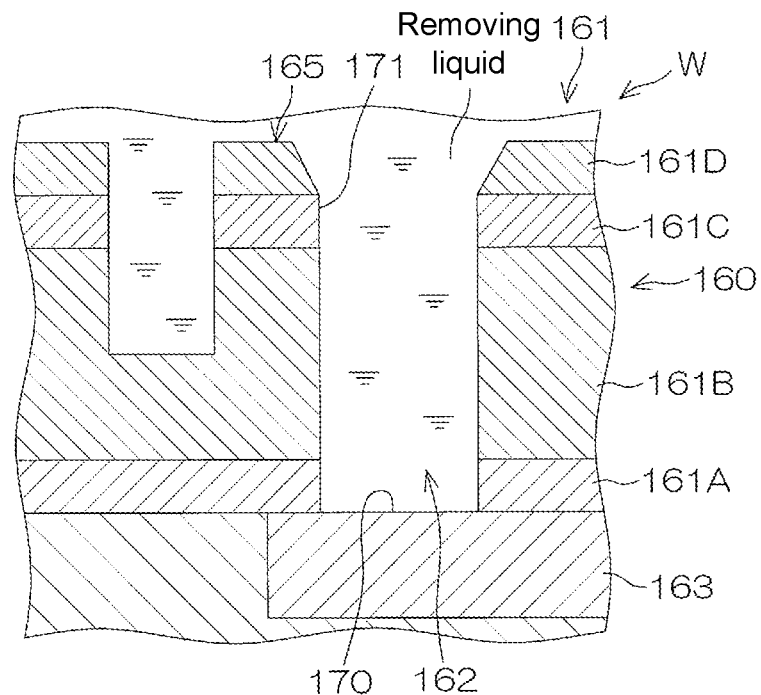
FIG. 22D is a schematic view for explaining a status near the surface of the substrate during the performance of the processing film residue removing step (Step S11) in the substrate processing according to the fourth embodiment.

The removing liquid supplied to the upper surface of the substrate W receives a centrifugal force, spreads radially, and spreads over the entire upper surface of the substrate W. As a result, the rinse liquid on the upper surface of the substrate W is replaced with the removing liquid. As shown in FIG. 22D, the removing liquid supplied to the upper surface of the substrate W dissolves the protective film 100B (refer to FIG. 22C) remaining on the upper surface of the substrate W and then is discharged from the peripheral edge of the upper surface of the substrate W.

Next, the spin drying step (Step S12) in which the substrate W is rotated at a high speed to dry the upper surface of the substrate W is performed. Specifically, the removing liquid valve 54 is closed. Thus, the supply of the removing liquid to the upper surface of the substrate W is stopped. Then, the facing member lifting unit 61 moves the facing member 6 to a drying position below the processing position (refer to FIG. 6M). Then, the gas valve 55 is opened. Thus, the gas is supplied to the space between the upper surface of the substrate W and the facing surface 6a of the facing member 6.

Then, the spin motor 23 accelerates the rotation of the substrate W to rotate the substrate W at a high speed. The substrate W in the spin drying step is rotated at a drying speed, for example, 1500 rpm. The spin drying step is performed for a predetermined time, for example 30 seconds. Thus, a large centrifugal force acts on the removing liquid on the substrate W, and the removing liquid on the substrate W is shaken off around the substrate W. In the spin drying step, the evaporation of the removing liquid is promoted by supplying the gas to the space between the upper surface of the substrate W and the facing surface 6a of the facing member 6.

Then, the spin motor 23 stops the rotation of the substrate W. The guard lifting unit 74 moves the first guard 71A and the second guard 71B to the lower position. The gas valve 55 is closed. Then, the facing member lifting unit 61 moves the facing member 6 to the upper position.

The transfer robot CR enters the processing unit 2, scoops the processed substrate W from the chuck pin 20 of the spin chuck 5, and unloads it out of the processing unit 2 (Step S10). The substrate W is passed from the transfer robot CR to the transfer robot IR and is accommodated in the carrier C by the transfer robot IR.

Also in the spin drying step of the substrate processing according to the fourth embodiment, the upper surface of the substrate W is dried by shaking off the removing liquid on the substrate W after the rinse liquid on the substrate W is replaced by the removing liquid such as IPA. That is, since the spin drying step is performed after the rinse liquid is replaced by IPA having a lower surface tension than DIW, when the upper surface of the substrate W is dried, the surface tension acting on the uneven pattern 160 (refer to FIG. 12) on the upper surface of the substrate W can be reduced.

A status in which the separation target film 100A is separated will be described in detail with reference to FIGS. 23A to 23C.

Figure 23A:
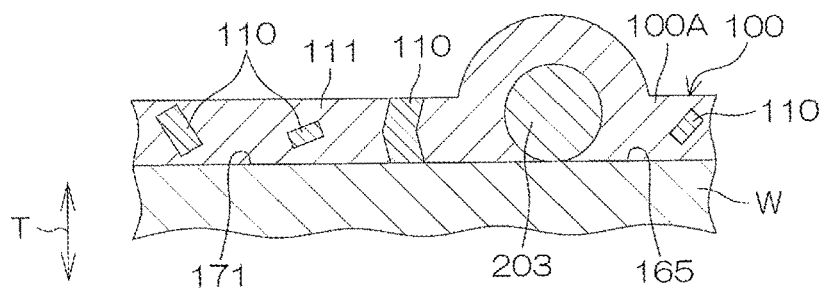
FIGS. 23A to 23C are schematic views for explaining a status in which a film to be separated is separated from the substrate in the substrate processing according to the fourth embodiment.
Figure 23B:
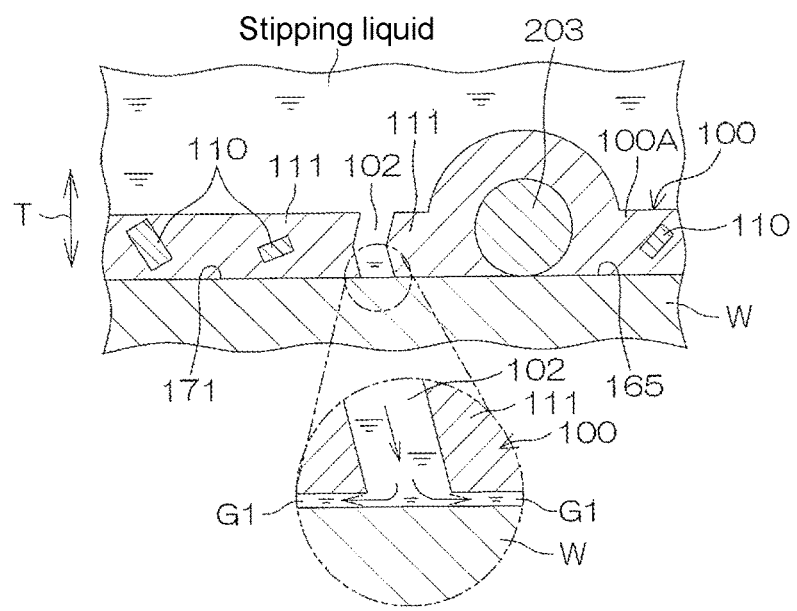
Figure 23C:
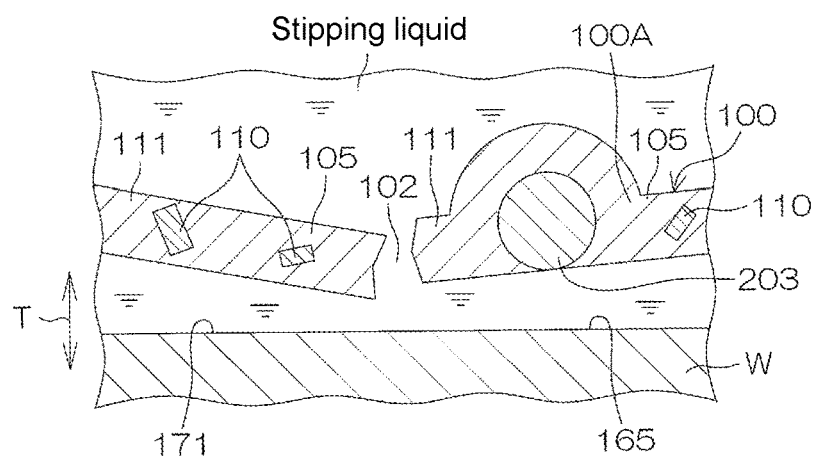

FIGS. 23A to 23C are schematic views for explaining a status in which the separation target film 100A covering the non-exposed region 171 is separated from the upper surface of the substrate W.

As shown in FIG. 23A, the separation target film 100A holds the first removal target 203. Specifically, the separation target film 100A has the high-solubility solid 110 (the high-solubility component in a solid state) and the low-solubility solid 111 (the low-solubility component in a solid state). The high-solubility solid 110 and the low-solubility solid 111 are formed by evaporating at least some of the solvent contained in the processing liquid.

The high-solubility solid 110 and the low-solubility solid 111 are mixed in the separation target film 100A. Strictly speaking, in the separation target film 100A, the high-solubility solid 110 and the low-solubility solid 111 are not uniformly distributed throughout the processing film 100, and there are a portion in which the high-solubility solid 110 is unevenly distributed and a portion in which the low-solubility solid 111 is unevenly distributed.

Referring to FIG. 23B, the high-solubility solid 110 is dissolved due to the supply of stripping liquid. That is, the separation target film 100A is partially dissolved. The through hole 102 (a first through hole) is formed in a portion of the separation target film 100A, in which the high-solubility solid 110 is unevenly distributed, by dissolving the high-solubility solid 110 (a first through hole forming step).

The through hole 102 is particularly likely to be formed in a portion of the pattern surface 165 in which the high-solubility solid 110 extends in the normal direction T (which is also the thickness direction of the processing film 100). The through hole 102 has a size of, for example, several nm in diameter in a plan view.

The solubility of the low-solubility component in the stripping liquid is low, and the low-solubility solid 111 is hardly dissolved by the stripping liquid. Therefore, only a vicinity of a surface of the low-solubility solid 111 is slightly dissolved by the stripping liquid. Therefore, the stripping liquid which reaches the vicinity of the upper surface of the substrate W through the through hole 102 slightly dissolves a portion of the low-solubility solid 111 near the upper surface of the substrate W. Thus, as shown in the enlarged view of FIG. 23B, the stripping liquid enters the gap G1 between the separation target film 100A and the upper surface of the substrate W while gradually dissolving the low-solubility solid 111 near the upper surface of the substrate W (a stripping liquid entering step).

Then, for example, as shown in FIG. 23C, the separation target film 100A splits into film pieces 105 starting from the peripheral edge of the through hole 102 and is separated from the substrate W in a state in which the film pieces 105 of the separation target film 100A hold the first removal target 203 (a separation target film splitting step, a separation target film separating step). Then, the separation target film 100A which has become the film pieces 105 is washed away (pushed out of the substrate W) in a state in which the first removal target 203 is held, and is removed from the upper surface of the substrate W by continuing to supply the stripping liquid (a first removal target removing step).

Next, a status in which the protective film 100B is removed will be described in detail with reference to FIGS. 24A to 24D.

FIGS. 24A to 24D are schematic views for explaining a status in which the protective film 100B covering the exposed region 170 is removed from the upper surface of the substrate W.

Figure 24A:
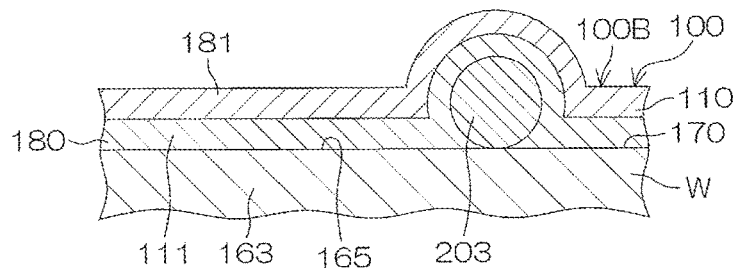
FIGS. 24A to 24D are schematic views for explaining a status in which a protective film is removed from the substrate in the substrate processing according to the fourth embodiment.

As shown in FIG. 24A, the protective film 100B holds the first removal target 203. Specifically, the protective film 100B has the high-solubility solid 110 (the high-solubility component in a solid state) and the low-solubility solid 111 (the low-solubility component in a solid state). The high-solubility solid 110 and the low-solubility solid 111 are formed by evaporating at least some of the solvent contained in the processing liquid.

The protective film 100B includes the low-solubility layer 180 formed of the low-solubility solid 111 disposed at a position in contact with the metal film 163, and the high-solubility layer 181 disposed on the opposite side of the metal film 163 with respect to the low-solubility layer 180 and formed of the high-solubility solid 110. That is, the low-solubility layer 180 is located between the metal film 163 and the high-solubility layer 181.

Figure 24B:
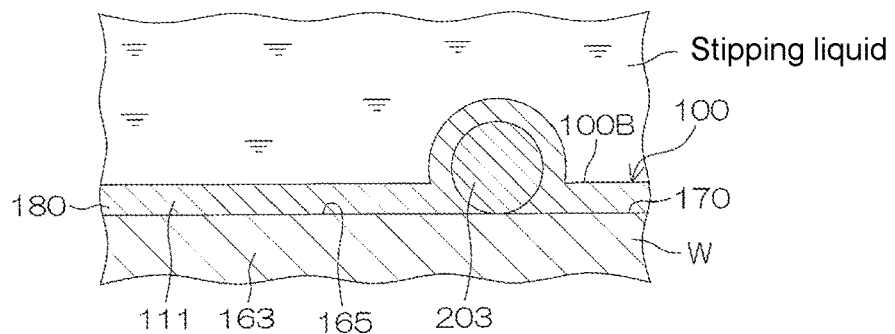

The high-solubility solid 110 is dissolved in the stripping liquid, but the low-solubility solid 111 is hardly dissolved in the stripping liquid. Therefore, when the stripping liquid is supplied to the upper surface of the substrate W in the separation target film separating step (Step S4), the high-solubility layer 181 is dissolved by the stripping liquid as shown in FIG. 24B. On the other hand, although the surface of the low-solubility layer 180 is slightly dissolved, the low-solubility layer 180 is maintained without exposing the metal film 163 in a state in which the low-solubility layer 180 covers the exposed region 170. Therefore, it is difficult for the stripping liquid to enter the space between the low-solubility layer 180 and the upper surface of the substrate W. Therefore, the low-solubility layer 180 of the protective film 100B remains on the exposed region 170 without being separated by the stripping liquid.

Figure 24C:
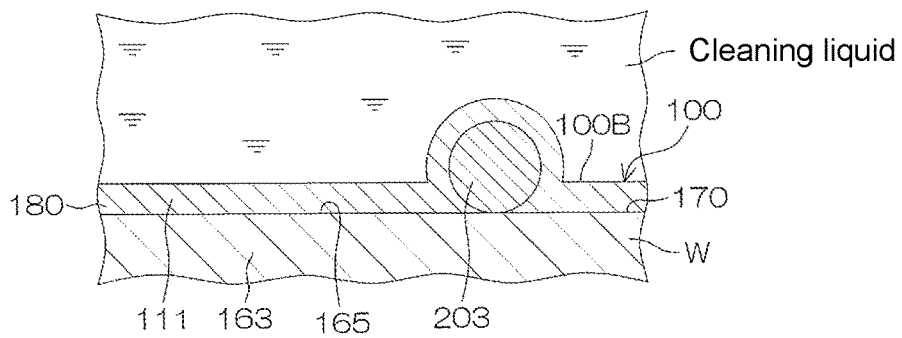

Since the metal film 163 is covered with the protective film 100B, the metal film 163 is protected without being exposed to the cleaning liquid while the cleaning liquid is supplied to the upper surface of the substrate W in the subsequent cleaning step (Step S6), as shown in FIG. 24C.

Figure 24D:
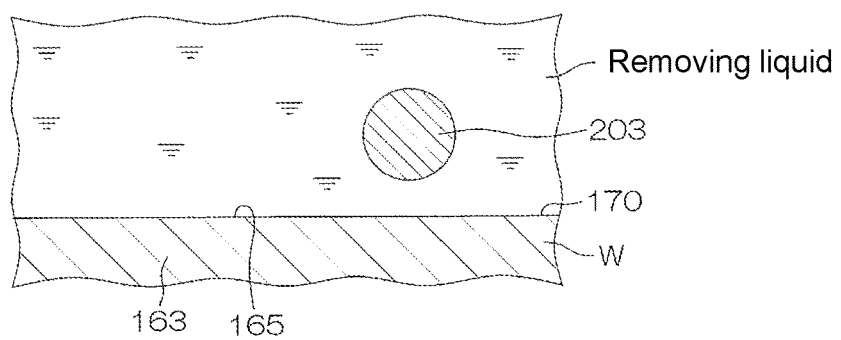

Therefore, as shown in FIG. 22C, the cleaning liquid can be supplied to the surface of the substrate W in a state in which the metal film 163 exposed from the upper surface of the substrate W is appropriately protected, and the second removal target 204 can be removed from the substrate W. As shown in FIG. 24D, the protective film 100B can be dissolved in the removing liquid to smoothly remove the protective film 100B from the upper surface of the substrate W by the subsequent protective film removing step (Step S8).

The first removal target 203 adhering to the exposed region 170 is detached from the exposed region 170 when the protective film 100B is formed. In the protective film removing step (the processing film residue removing step: Step S11) after the cleaning step (Step S20), the protective film 100B is dissolved in the removing liquid. When the protective film 100B is dissolved by the removing liquid, the first removal target 203 floats in the removing liquid in a state in which it is detached from the exposed region 170. Therefore, the first removal target 203 floating in the removing liquid is removed from the upper surface of the substrate W together with the removing liquid by continuing the supply of the removing liquid.

Further, the removing liquid can also dissolve the separation target film 100A. Therefore, even when the residue of the separation target film 100A adheres to the upper surface of the substrate W after it is separated by the stripping liquid, the residue can be removed by the removing liquid.

A type of the removal target which adheres to the upper surface of the substrate W differs according to the content of the previous step. According to the content of the previous step, a plurality of types of removal targets may adhere to the upper surface of the substrate W. For example, after the dry etching processing, the first removal target 203 which is a granular residue and the second removal target 204 which is a film-shaped residue may adhere to the upper surface of the substrate W. There are some removal targets which cannot be removed without using a liquid having a strong removal capacity enough to deteriorate a metal (a specific substance) exposed from the surface of the substrate.

According to the fourth embodiment, the separation target film 100A which covers the non-exposed region 171 on the upper surface of the substrate W and the protective film 100B which covers the exposed region 170 on the upper surface of the substrate W are formed by the processing liquid supplied to the upper surface of the substrate W being solidified or cured.

The separation target film 100A is separated from the upper surface of the substrate W in a state in which it holds the first removal target 203 by supplying the stripping liquid to the upper surface of the substrate W in which the separation target film 100A and the protective film 100B are formed. Therefore, the first removal target 203 is removed from the upper surface of the substrate W. On the other hand, the second removal target 204 remains on the upper surface of the substrate W. Then, the second removal target 204 is removed from the upper surface of the substrate W by the cleaning liquid, and then the protective film 100B is removed from the upper surface of the substrate W by the removing liquid.

When the cleaning liquid is supplied to the upper surface of the substrate W, the exposed region 170 on the upper surface of the substrate W is covered with the protective film 100B. Thus, although the cleaning liquid used for removing the second removal target 204 has an oxidizing power to oxidize the metal film 163, the second removal target 204 can be removed without oxidizing the metal film 163.

Therefore, it is possible to efficiently remove the plurality of types of removal targets (the first removal target 203 and the second removal target 204) from the upper surface of the substrate W while oxidation of the metal film 163 is curbed.

Further, according to the first embodiment, the high-solubility solid 110 and the low-solubility solid 111 are mixed in the separation target film 100A. Additionally, in the separation target film separating step (the processing film separating step: Step S9), the high-solubility solid 110 is selectively dissolved in the stripping liquid.

Due to the high-solubility solid 110 being dissolved in the stripping liquid, the stripping liquid passes through the separation target film 100A via the trace (the through hole 102), in which the high-solubility solid 110 was present. Thus, the stripping liquid can quickly reach the vicinity of the interface between the separation target film 100A and the non-exposed region 171 on the surface of the substrate W.

On the other hand, the low-solubility solid 111 in the separation target film 100A is maintained in a solid state without being dissolved. Therefore, the stripping liquid can act on the contact interface between the low-solubility solid 111 and the substrate W while the first removal target 203 is held in the low-solubility solid 111. As a result, the separation target film 100A can be quickly removed from the upper surface of the substrate W, and the first removal target 203 together with the separation target film 100A can be efficiently removed from the upper surface of the substrate W.

Similar to the first embodiment, even when the substrate processing according to the fourth embodiment is performed on a substrate in which the specific substance exposed in the exposed region 170 is a metal other than copper or a nitride, the same effects as in the first embodiment is obtained.

Other Embodiments

The disclosure is not limited to the above-described embodiments and can be implemented in other embodiments.

For example, in the processing film forming step (Step S8), the liquid film 101 may be solidified or cured due to the evaporation of the solvent when the liquid film 101 of the processing liquid is thinned. In such a case, it is not necessary to heat the substrate W or to spray a gas on the upper surface of the substrate W in order to solidify or cure the liquid film 101 of the processing liquid after the liquid film 101 of the processing liquid is thinned.

The same applies to a case in which the preprocessing film 200 is formed by evaporating the solvent when the liquid film 201 of the preprocessing liquid is thinned in the preprocessing film forming step (Step S3). That is, even in such a case, heating of the substrate W and spraying of the gas onto the upper surface of the substrate W can be omitted.

Further, in the substrate processing according to the second embodiment, the cleaning liquid removing step (Step S21) is performed after the cleaning step (Step S20). However, it is also possible to omit the cleaning liquid removing step. Specifically, when the cleaning liquid supplied to the substrate W in the cleaning step and the processing film residue removing liquid supplied to the substrate W in the processing film residue removing step (Step S11) performed after the cleaning liquid removing step have compatibility, there is no need to perform the cleaning liquid removing step.

Further, in the above-described embodiment, in the processing film separating step (Step S9), the exposed region covering portion 130 remains in the exposed region 170 without being separated by the stripping liquid. However, in the processing film separating step, the exposed region covering portion 130 may be separated by the stripping liquid.

In the above-described first to fourth embodiments, the polymer-containing liquid containing only the first component as the high-solubility component was used as the processing liquid, and the polymer-containing liquid containing both the first component and the second component as the high-solubility component was used as the preprocessing liquid. However, the polymer-containing liquid containing both the first component and the second component as the high-solubility component may be used as the processing liquid, and the polymer-containing liquid containing only the first component as the high-solubility component may be used as the preprocessing liquid. In this case, the non-exposed region 171 in which the specific substance such as copper is not exposed corresponds to the first region of the disclosure, and the exposed region 170 in which the specific substance such as copper is exposed corresponds to the second region of the disclosure.

Further, in the first embodiment, the exposed region covering portion 130 is not separated by the stripping liquid but is dissolved by the removing liquid. However, in the first embodiment, the exposed region covering portion 130 may be separated together with the non-exposed region covering portion 131 by the stripping liquid.

The substrate processing according to the second embodiment and the fourth embodiment is not limited to the substrate after the dry etching processing and can be applied to various substrates. In particular, when a plurality of types of removal targets adheres to the substrate and one of the removal targets cannot be removed by the separating of the processing film or the preprocessing film, the substrate processing according to the second embodiment and the fourth embodiment is useful.

In this specification, when a numerical range is indicated by using "to", this includes both endpoints, and the unit is common, unless otherwise specified.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

This application corresponds to Japanese Patent Application No. 2019-217610 filed with the Japan Patent Office on Nov. 29, 2019 and Japanese Patent Application No. 2019-217611 filed with the Japan Patent Office on Nov. 29, 2019, and the full disclosure of this application shall be incorporated herein by reference.

What is claimed is:

1. A substrate processing method for processing a substrate having a surface on which a first region and a second region, in which different substances are exposed, are present, the method comprising:
    a preprocessing liquid supply step of supplying a preprocessing liquid to the surface of the substrate;
    a preprocessing film forming step of solidifying or curing the preprocessing liquid supplied to the surface of the substrate and forming a preprocessing film, which holds a first removal target present on the surface of the substrate, on the surface of the substrate;
    a preprocessing film separating step of supplying a stripping liquid to the surface of the substrate and separating the preprocessing film from the surface of the substrate in a state in which the preprocessing film holds the first removal target;
    a processing liquid supply step of supplying a processing liquid to the surface of the substrate after the preprocessing film separating step;
    a processing film forming step of solidifying or curing the processing liquid supplied to the surface of the substrate and forming a processing film, which holds the first removal target present on the surface of the substrate, on the surface of the substrate; and
    a processing film separating step of supplying the stripping liquid to the surface of the substrate and separating the processing film in a state in which processing film holds the first removal target from the surface of the substrate,
    wherein a removal capacity for the processing film to remove the first removal target present in the second region is higher than a removal capacity for the preprocessing film to remove the first removal target present in the second region, and
    a removal capacity for the preprocessing film to remove the first removal target present in the first region is higher than a removal capacity for the processing film to remove the first removal target present in the first region.

2. The substrate processing method according to claim 1, wherein:
    the removal capacity which removes the first removal target is constituted of a holding capacity which holds the first removal target present in the first region or the second region on the processing film or the preprocessing film, and a separability which indicates a degree of separation of the processing film or the preprocessing film in a state in which the processing film or the preprocessing film holds the first removal target,
    the preprocessing film has a higher separability than the processing film in the first region, and
    the processing film has a higher holding capacity than the preprocessing film in the second region.

3. The substrate processing method according to claim 1, wherein:
    the first region is an exposed region in which a metal is exposed,
    the second region is a non-exposed region other than the exposed region,
    a removal capacity for the processing film to remove the first removal target present in the non-exposed region is higher than a removal capacity for the preprocessing film to remove the first removal target present in the non-exposed region, and
    a removal capacity for the preprocessing film to remove the first removal target present in the exposed region is higher than a removal capacity for the processing film to remove the first removal target present in the exposed region.

4. The substrate processing method according to claim 3, further comprising a processing film residue removing step of supplying a removing liquid to the surface of the substrate and removing a residue of the processing film remaining on the surface of the substrate after the processing film separating step.

5. The substrate processing method according to claim 4, wherein:
    the processing film separating step comprises a step of separating a portion of the processing film which covers the non-exposed region without separating a portion of the processing film which covers the exposed region, and
    the processing film residue removing step comprises a step of dissolving and removing the portion of the processing film which covers the exposed region in the removing liquid.

6. The substrate processing method according to claim 3, wherein:
    the processing film forming step comprises a step of forming the processing film comprising a separation target film which holds the first removal target present in the non-exposed region on the surface of the substrate and covers the non-exposed region and a protective film, which covers and protects the exposed region, on the surface of the substrate, and
    a cleaning step of supplying a cleaning liquid to the surface of the substrate and dissolving and removing a second removal target present on the surface of the substrate by the cleaning liquid after the processing film separating step is further comprised.

7. The substrate processing method according to claim 6, further comprising a processing film residue removing step of supplying a removing liquid to the surface of the substrate and removing a residue of the processing film present on the surface of the substrate after the processing film separating step,
    wherein the processing film residue removing step comprises a step of removing the protective film as the residue.

8. The substrate processing method according to claim 7, wherein the first removal target and the second removal target are residues produced by a dry etching processing.

9. The substrate processing method according to claim 8, wherein:
    the first removal target is a granular residue, and
    the second removal target is a film-shaped residue which covers at least a part of the non-exposed region on the surface of the substrate.

10. The substrate processing method according to claim 1, wherein:
    the processing liquid comprises a first solute and a first solvent which dissolves the first solute,
    the first solute comprises a first high-solubility component and a first low-solubility component which is less soluble in the stripping liquid than the first high-solubility component, and the processing film separating step comprises a step of selectively dissolving the first high-solubility component in a solid state in the stripping liquid.

11. The substrate processing method according to claim 1, wherein the processing film separating step comprises a first through hole forming step of partially dissolving the processing film in the stripping liquid and forming a first through hole in the processing film.

12. The substrate processing method according to claim 1, wherein:
the preprocessing liquid comprises a second solute and a second solvent which dissolves the second solute,
the second solute comprises a second high-solubility component and a second low-solubility component which is less soluble in the stripping liquid than the second high-solubility component, and
the preprocessing film separating step comprises a step of selectively dissolving the second high-solubility component in a solid state in the stripping liquid.

13. The substrate processing method according to claim 1, wherein the preprocessing film separating step comprises a second through hole forming step of partially dissolving the preprocessing film in the stripping liquid and forming a second through hole in the preprocessing film.

14. A substrate processing method for processing a substrate having a surface having an exposed region in which a specific substance is exposed and a non-exposed region other than the exposed region, the method comprising:
a processing liquid supply step of supplying a processing liquid to the surface of the substrate;
a film forming step of solidifying or curing the processing liquid supplied to the surface of the substrate and forming a separation target film which holds a first removal target present in the non-exposed region on the surface of the substrate and covers the non-exposed region and a protective film, which covers and protects the exposed region, on the surface of the substrate;
a separation target film separating step of supplying a stripping liquid to the surface of the substrate and separating the separation target film from the surface of the substrate in a state in which the separation target film holds the first removal target;
a cleaning step of supplying a cleaning liquid to the surface of the substrate and removing a second removal target present on the surface of the substrate by the cleaning liquid after the separation target film separating step; and
a protective film removing step of supplying a removing liquid to the surface of the substrate and removing the protective film from the surface of the substrate after the cleaning step.

15. The substrate processing method according to claim 14, wherein:
the processing liquid has a first solute and a first solvent which dissolves the first solute,
the first solute has a first high-solubility component and a first low-solubility component which is less soluble in the stripping liquid than the first high-solubility component, and
the protective film comprises a low-solubility layer constituted of the first low-solubility component in a solid state disposed at a position in contact with the specific substance, and a high-solubility layer constituted of the first high-solubility component in a solid state disposed on an opposite side of the specific substance with respect to the low-solubility layer.

16. The substrate processing method according to claim 14, wherein:
the processing liquid comprises a first solute and a first solvent which dissolves the first solute,
the first solute comprises a first high-solubility component and a first low-solubility component which is less soluble in the stripping liquid than the first high-solubility component,
the film forming step comprises a step of foiining the separation target film having the first high-solubility component in a solid state and the first low-solubility component in a solid state, and
the separation target film separating step comprises a step of selectively dissolving the first high-solubility component in the solid state in the stripping liquid.

17. The substrate processing method according to claim 14, wherein the separation target film separating step comprises a first through hole forming step of partially dissolving the separation target film in the stripping liquid and forming a through hole in the separation target film.

18. The substrate processing method according to claim 14, further comprising:
a preprocessing liquid supply step of supplying a preprocessing liquid to the surface of the substrate before the processing liquid supply step;
a preprocessing film forming step of solidifying or curing the preprocessing liquid supplied to the surface of the substrate and forming a preprocessing film, which holds the first removal target present in the exposed region on the surface of the substrate, on the surface of the substrate before the processing liquid supply step; and
a preprocessing film separating step of supplying a stripping liquid to the surface of the substrate and separating the preprocessing film together with the first removal target from the exposed region on the surface of the substrate before the processing liquid supply step.

19. The substrate processing method according to claim 18, wherein:
the preprocessing liquid has a second solute and a second solvent which dissolves the second solute,
the second solute has a second high-solubility component and a second low-solubility component which is less soluble in the stripping liquid than the second high-solubility component,
the preprocessing film forming step comprises a step of forming the preprocessing film having the second high-solubility component in a solid state and the second low-solubility component in a solid state, and
the preprocessing film separating step comprises a step of selectively dissolving the second high-solubility component in the solid state in the preprocessing film in the stripping liquid.

20. The substrate processing method according to claim 18, wherein the preprocessing film separating step comprises a second through hole forming step of partially dissolving the preprocessing film in the stripping liquid and forming a second through hole in the preprocessing film.

21. The substrate processing method according to claim 14, wherein:
the specific substance is a metal, and
the cleaning liquid has an oxidizing power which oxidizes the metal exposed on the surface of the substrate.

22. The substrate processing method according to claim 21, wherein the first removal target and the second removal target are residues produced by a dry etching processing.

23. The substrate processing method according to claim 22, wherein:
the first removal target is a granular residue, and
the second removal target is a film-shaped residue which covers at least a part of the non-exposed region on the surface of the substrate.

24. The substrate processing method according to claim 14, wherein the removing liquid has a property of dissolving the protective film and the separation target film.

* * * * *